United States Patent
Stinaff et al.

(10) Patent No.: US 11,335,556 B2
(45) Date of Patent: May 17, 2022

(54) DIRECTED GROWTH OF ELECTRICALLY SELF-CONTACTED MONOLAYER TRANSITION METAL DICHALCOGENIDES WITH LITHOGRAPHICALLY DEFINED METALLIC PATTERNS

(71) Applicant: Ohio University, Athens, OH (US)

(72) Inventors: Eric Stinaff, Athens, OH (US); Martin Kordesch, Athens, OH (US); Sudiksha Khadka, Athens, OH (US)

(73) Assignee: Ohio University, Athens, OH (US)

( * ) Notice: Subject to any disclaimer, the term of this patent is extended or adjusted under 35 U.S.C. 154(b) by 254 days.

(21) Appl. No.: 16/306,774

(22) PCT Filed: May 31, 2017

(86) PCT No.: PCT/US2017/035152
§ 371 (c)(1),
(2) Date: Dec. 3, 2018

(87) PCT Pub. No.: WO2017/210264
PCT Pub. Date: Dec. 7, 2017

(65) Prior Publication Data
US 2019/0131129 A1 May 2, 2019

Related U.S. Application Data

(60) Provisional application No. 62/345,245, filed on Jun. 3, 2016.

(51) Int. Cl.
*H01L 21/02* (2006.01)
*H01L 31/0224* (2006.01)
(Continued)

(52) U.S. Cl.
CPC .... *H01L 21/02645* (2013.01); *H01L 21/0262* (2013.01); *H01L 21/0272* (2013.01);
(Continued)

(58) Field of Classification Search
CPC .......... H01L 31/03925; H01L 31/0296; H01L 31/108; H01L 31/011408; H01L 29/78681;
(Continued)

(56) References Cited

U.S. PATENT DOCUMENTS 7,307,277 B2   12/2007   Frey et al.
7,670,887 B2   3/2010    Bucher et al.
(Continued)

FOREIGN PATENT DOCUMENTS

WO   2015031461 A1   3/2015
WO   2015142358 A1   9/2015

*Primary Examiner* — Alexander O Williams
(74) *Attorney, Agent, or Firm* — MacMillan, Sobanski & Todd, LLC

(57) ABSTRACT

Methods and materials for growing TMD materials on substrates and making semiconductor devices are described. Metal contacts may be created prior to conducting a deposition process such as chemical vapor deposition (CVD) to grow a TMD material, such that the metal contacts serve as the seed/catalyst for TMD material growth. A method of making a semiconductor device may include conducting a lift-off lithography process on a substrate to produce a substrate having metal contacts deposited thereon in lithographically defined areas, and then growing a TMD material on the substrate by a deposition process to make a semiconductor device. Further described are semiconductor devices having a substrate with metal contacts deposited thereon in lithographically defined areas, and a TMD material on the substrate, where the TMD material is a continuous, substantially uniform monolayer film between and on the metal contacts, where the metal contacts are chemically bonded to the TMD material.

21 Claims, 72 Drawing Sheets

(51) Int. Cl.
*H01L 31/0296* (2006.01)
*H01L 31/0392* (2006.01)
*H01L 31/18* (2006.01)
*H01L 31/108* (2006.01)
*H01L 29/786* (2006.01)
*H01L 21/027* (2006.01)
*H01L 21/443* (2006.01)
*H01L 21/4763* (2006.01)
*H01L 29/24* (2006.01)
*H01L 29/66* (2006.01)
*H01L 31/032* (2006.01)

(52) U.S. Cl.
CPC .. *H01L 21/02491* (2013.01); *H01L 21/02568* (2013.01); *H01L 21/443* (2013.01); *H01L 21/47635* (2013.01); *H01L 29/24* (2013.01); *H01L 29/66969* (2013.01); *H01L 29/78681* (2013.01); *H01L 29/78696* (2013.01); *H01L 31/0296* (2013.01); *H01L 31/022408* (2013.01); *H01L 31/032* (2013.01); *H01L 31/03925* (2013.01); *H01L 31/108* (2013.01); *H01L 31/1085* (2013.01); *H01L 31/18* (2013.01); *H01L 31/1836* (2013.01); *Y02E 10/50* (2013.01)

(58) Field of Classification Search
CPC ........... H01L 29/78696; H01L 31/1836; H01L 21/02491; H01L 21/443; H01L 21/02645; H01L 21/47635; H01L 21/0272; H01L 31/1085; H01L 21/0262; H01L 29/66969; H01L 29/24; H01L 31/18; H01L 31/032; H01L 21/02568; H01L 21/02; H01L 21/27; H01L 21/4763; Y02E 10/50
USPC .......................................................... 257/29
See application file for complete search history.

(56) References Cited

U.S. PATENT DOCUMENTS

| | | |
|---|---|---|
| 8,916,914 B2 | 12/2014 | Kim et al. |
| 9,063,063 B2 | 6/2015 | Friedman et al. |
| 9,076,686 B1 | 7/2015 | Karda et al. |
| 9,147,824 B1 | 9/2015 | Cao et al. |
| 9,190,509 B2 | 11/2015 | Nayfeh |
| 2005/0023522 A1 | 2/2005 | Frey et al. |
| 2014/0131698 A1 | 5/2014 | Kim et al. |
| 2014/0183453 A1 | 7/2014 | Kim et al. |
| 2015/0041873 A1 | 2/2015 | Karda et al. |
| 2015/0108431 A1 | 4/2015 | Kim |
| 2015/0116906 A1 | 4/2015 | Thevasahayam |
| 2015/0200202 A1 | 7/2015 | Karda et al. |
| 2015/0294875 A1 | 10/2015 | Khondaker et al. |
| 2016/0013277 A1 | 1/2016 | Ho et al. |
| 2016/0093491 A1* | 3/2016 | Choi ................. H01L 21/02485 438/151 |

* cited by examiner

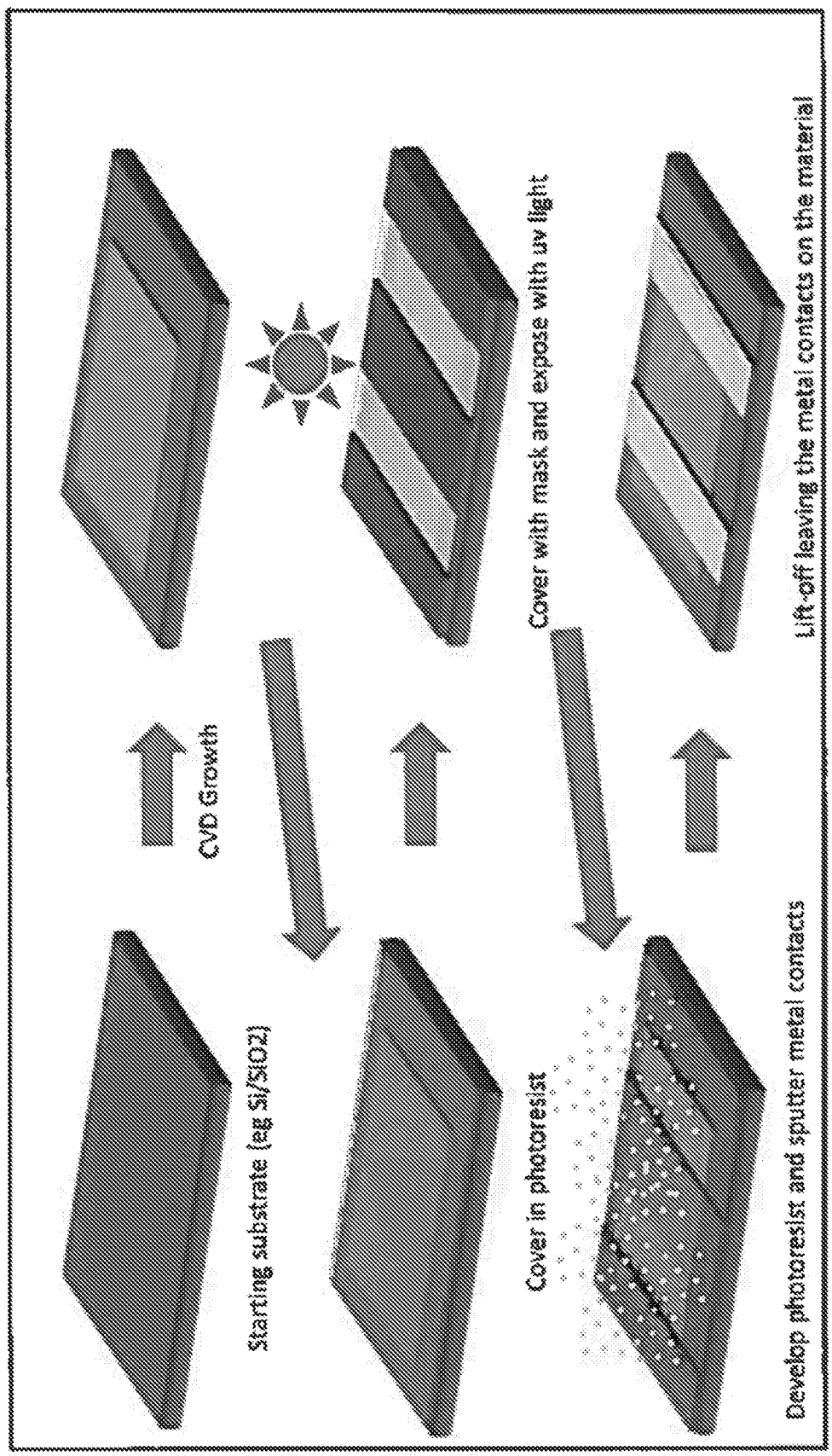
PRIOR ART FIG. 10

DIRECTED GROWTH OF ELECTRICALLY SELF-CONTACTED MONOLAYER TRANSITION METAL DICHALCOGENIDES WITH LITHOGRAPHICALLY DEFINED METALLIC PATTERNS

RELATED APPLICATIONS

This application is a national stage application filed under 35 U.S.C. § 371 of international application PCT/US2017/035152 filed under the authority of the Patent Cooperation Treaty on Maya 31, 2017, which claims priority to U.S. Provisional Application No. 62/345,245, filed under 35 U.S.C. § 111(b) on Jun. 3, 2016, the disclosure of which is incorporated herein by reference in its entirety for all purposes.

STATEMENT REGARDING FEDERALLY SPONSORED RESEARCH

This invention was made with no government support. The government has no rights in this invention.

BACKGROUND OF THE INVENTION

While new species and properties of two-dimensional (2D) materials are being reported with regularity, a significant bottleneck in the field of 2D materials is the ability to controllably produce and process material. Many seminal results have involved working with micron-sized exfoliated 2D crystals, which is a difficult and time-consuming process with no clear route to scalability. Advances have been made using chemical vapor deposition (CVD) techniques to grow large areas of material. However, it remains difficult to produce continuous films of purely monolayer, crystalline material, and fabricating working devices is still a significant challenge. It would be advantageous to discover techniques to selectively grow 2D material in a deterministic manner on well defined, lithographically patterned, metal features.

SUMMARY OF THE INVENTION

Provided is a method of making a semiconductor device, the method comprising conducting a lift-off lithography process to produce a substrate having metal contacts deposited thereon in lithographically defined areas, and growing a transition metal dichalcogenide (TMD) material of formula $MX_2$, wherein M is a transition metal and X is a chalcogen, on the substrate by a deposition process to make a semiconductor device. In certain embodiments, the TMD material is predominantly constrained to the lithographically defined areas. In certain embodiments, the TMD material is localized to the metal contacts. In certain embodiments, the TMD material forms a continuous film between and on the metal contacts. In particular embodiments, the continuous film is a substantially monolayer film.

In certain embodiments, the lift-off lithography process involves depositing photoresist on the substrate, covering the substrate with a photomask, exposing the covered substrate to ultraviolet light, removing the photomask, developing the photoresist, sputtering metal contacts on the substrate, and lifting off the photoresist to leave the metal contacts on the substrate.

In certain embodiments, M is selected from the group consisting of Mo, W, Sc, Ti, V, Cr, Mn, Fe, Co, Ni, Cu, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, and Cn, and X is selected from the group consisting of O, S, Se, Te, and Po. In certain embodiments, M is selected from the group consisting of Mo and W, and X is selected from the group consisting of S, Se, and Te. In certain embodiments, the TMD comprises $MoS_2$. In certain embodiments, the TMD comprises $WS_2$. In certain embodiments, the TMD comprises $MoSe_2$. In certain embodiments, the TMD comprises $WSe_2$. In certain embodiments, the TMD comprises $MoTe_2$. In certain embodiments, the TMD comprises $WTe_2$.

In certain embodiments, the deposition process is conducted with reactants comprising an oxide precursor. In particular embodiments, the oxide precursor comprises an oxide of the transition metal M. In particular embodiments, the oxide precursor comprises $MoO_3$ or $WO_2$. In particular embodiments, the metal contacts and the oxide precursor both comprise the transition metal M. In particular embodiments, the metal contacts comprise a first transition metal, and the oxide precursor comprises an oxide of a second transition metal, the resulting TMD material being a hybrid material. In particular embodiments, the hybrid material comprises $MOS_2/WS_2$. In particular embodiments, the reactants further comprise a chalcogen powder. In particular embodiments, the deposition process is conducted with multiple temperature zones such that the substrate is at a first temperature, the oxide precursor is at a second temperature, and the chalcogen powder is at a third temperature.

In certain embodiments, the metal contacts comprise a transition metal. In certain embodiments, the metal contacts comprise the transitional metal M.

In certain embodiments, the TMD material is polycrystalline with grain sizes on the order of a micron or less.

In certain embodiments, the deposition process is conducted with reactants comprising a chalcogen powder. In particular embodiments, the deposition process is conducted with reactants comprising both a chalcogen powder and an oxide precursor powder. In certain embodiments, the deposition process is conducted at a temperature at or above about 600° C. In certain embodiments, the deposition process is conducted at a temperature below about 780° C. In certain embodiments, the deposition process is conducted with a sulfur powder and the oxide precursor in a powder, and at a temperature of at least about 600° C. In certain embodiments, the deposition process is conducted for a time duration at a peak temperature of at least about 5 minutes.

In certain embodiments, the metal contacts have a thickness ranging from about 1 nm to about 1000 nm.

In certain embodiments, the deposition process is a chemical vapor deposition (CVD) process. In certain embodiments, the deposition process is a physical vapor deposition process. In certain embodiments, the deposition process is a sublimation process.

In certain embodiments, the method further includes fabricating the semiconductor device into a diode, a transistor, a photodector, or a solar cell.

Also provided is a semiconductor device comprising a substrate having metal contacts deposited thereon in lithographically defined areas, and a transition metal dichalcogenide material of formula $MX_2$, where M is a transition metal and X is a chalcogenide, on the substrate, wherein the TMD material is a continuous, substantially uniform monolayer film between and on the metal contacts. In certain embodiments, the semiconductor device is a diode, a transistor, a photodector, or a solar cell.

In certain embodiments, M is selected from the group consisting of Mo, W, Sc, Ti, V, Cr, Mn, Fe, Co, Ni, Cu, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, and Cn, and X is selected from the group consisting of O, S, Se, Te, and Po. In certain embodiments, M is selected from the group consisting of Mo and W, and X is selected from the group consisting of S, Se, and Te. In certain embodiments, the TMD comprises $MoS_2$, $WS_2$, $MoSe_2$, $WSe_2$, $MoTe_2$, or $WTe_2$.

In certain embodiments, the semiconductor device is a metal-semiconductor-metal photodetector. In particular embodiments, the metal-semiconductor-metal photodetector comprises Mo—$MoS_2$—Mo.

In certain embodiments, the metal contacts are chemically bonded to the TMD material.

BRIEF DESCRIPTION OF THE DRAWINGS

The patent or application file contains one or more drawings executed in color and/or one or more photographs. Copies of this patent or patent application publication with color drawing(s) and/or photograph(s) will be provided by the U.S. Patent and Trademark Office upon request and payment of the necessary fees.

FIG. 1A shows a large area optical image of the as-grown device, where the inset shows a continuous uniform film around the edge of the Mo pattern. FIGS. 1B-1E show a higher magnification optical image, AFM scan, photoluminescence (PL) map, and Raman analysis map of the region highlighted by the red square in FIG. 1A, respectively. The brightness of the PL map is proportional to the integrated intensity between 550 to 750 nm, while the color scale on the Raman map indicates the separation between the $E^1_{2g}$ and $A_{1g}$ in wavenumbers. FIG. 1F shows line profiles extracted from the AFM scan in FIG. 1C where Profile 1, in black, shows a uniform film with thickness less than 1 nm. Line Profile 2, in red, shows a two layer region. Line Profile 3, in green, is taken along an edge of the film where a periodic array of islands is observed. The islands are ~150 nm in diameter and ~4 nm in height and occur regularly along the edge with a periodicity of a little less than a micron. FIGS. 1G-1H show photoluminescence and Raman spectra from the circled region in FIG. 1D.

FIGS. 2A-2C show an optical image, photoluminescence map, and Raman analysis map, respectively. Similar to FIG. 1D, the brightness of the PL map is proportional to the integrated intensity between 550 to 750 nm, while the color scale on the Raman map indicates the separation between the $E^1_{2g}$ and $A_{1g}$ in wavenumbers. FIGS. 2D-2E show photoluminescence and Raman spectra from the regions indicated with the black, red, and green targets. From these spectra it can be seen that the $MoS_2$ covers the metallic patterns as well as the region between. There is a continuous monolayer film in the region between the Mo patterns.

FIG. 3A shows $MoS_2$ on Mo. FIG. 3B shows $MoS_2$ on W. FIG. 3C shows $WS_2$ on W. FIG. 3D shows $WS_2$ on Mo.

FIGS. 4A-4B show optical and total PL intensity images. FIG. 4C shows the peak position of a Gaussian fit to the PL emission. A blue shift is observed toward the edges of the material. FIG. 4D shows PL and Raman spectra corresponding to the red and blue targets on FIGS. 4A, 4B, and 4C. FIG. 4E shows integrated Raman intensity of the $EE2gg1$ and $AA1gg$ lines of $MoS_2$ (380 rel. $cm^{-1}$ to 420 rel. $cm^{-1}$). FIG. 4F shows integrated Raman intensity of the $EE2gg1$ and $AA1gg$ lines of $MoS_2$ (380 rel. $cm^{-1}$ to 420 rel. $cm^{-1}$). The observation of the $WS_2$ Raman lines in the middle of the material is consistent with red shifted PL peak in this region.

FIG. 6A shows an optical image of the probe region before growth. FIG. 6B shows an optical image of the probe region of the sample after growth, as presented in FIG. 1A. FIG. 6C shows the same optical image overlaid with a PL scan of the region. The material between the probes shows significantly weaker PL emission, if any, indicating multi-layer material. A Raman scan of the same region confirms the multi-layer nature of the material.

FIG. 8A shows a molybdenum metallic pad subjected to only sulfur vapor at a growth temperature of 575° C. FIG. 8B shows a molybdenum metallic pad subjected to only sulfur vapor at a growth temperature of 600° C. FIG. 8C shows a molybdenum metallic pad subjected to only sulfur vapor at a growth temperature of 780° C.

PRIOR ART FIG. 10: Illustration of a standard process for making a monolayer region of 2D material.

FIG. 12A shows an SEM micrograph of as-grown Mo—$MoS_2$—Mo photodetector, with inset showing a zoomed-in region where changing $MoS_2$ layer thickness is seen as a contrast variation. FIG. 12B shows a high magnification optical image showing color contrast of as-grown material which correlates with the SEM contrast. FIG. 12C shows photoluminescence spectra collected from multilayer and monolayer region represented by red and blue cross, respectively, in the inset diagram of FIG. 12A. FIG. 12D shows a Raman spectrum from the same two points with wavenumber separation of 10 cm$^{-1}$ and 22 cm$^{-1}$, confirming the presence of 1 and 3 layers, respectively, of MoS$_2$. Inset figures in FIGS. 12C, 12D are the PL and Raman imaging of the device showing the uniform growth of MoS$_2$ over a wide area. FIG. 12E is a 3D schematic of the device with a green laser used to probe the device. FIG. 12F is a cross-sectional representation of these as-grown photodiodes with the electrical connections used to measure the photocurrent and photoresponsivity.

FIG. 13A shows photocurrent mapping of the device at $V_{DS}$=2 V ($V_G$=0 V) and laser power of 500 µW focused down using a 100× microscope objective. The largest photocurrent is observed in the region of monolayer MoS$_2$ growth. FIG. 13B shows photocurrent and photoresponsivities measured as a function of incident illumination power with drain-source voltage $V_{DS}$=1.5 V at zero gate voltage. A sublinear dependence of photocurrent with increasing illumination power is observed while the responsivity decreases as the illumination power is increased. It shows a maximum value of 15 A/W with $V_{DS}$=4 V and $V_G$=8 V.

FIG. 16A shows time resolved photoresponse of the device as a function of drain-source voltage using a modulated (1 kHz) 405 nm laser at 100 µW. Temporal resolution of the experimental set up, determined by the rise time and fall time of the laser was measured to be 500 ns and 2 µs, respectively. FIG. 16B shows rise and fall time measured as time taken for the voltage amplitude to rise from 10% to 90% of its maximum value and vice versa was found to be 2 µs and 115 µs, respectively, at $V_{DS}$=8 V.

FIG. 18A shows in equilibrium, without illumination and applied bias, there is no net current. In FIG. 18B, with applied bias and no illumination, tunneling through the SB results in a net, 'dark', current. FIG. 18C shows under illumination with energy greater or equal to the band gap of MoS$_2$ and an applied bias of VDS<0 V, the photoconductive effect results in a net current through the device. FIG. 18D shows the photogating effect, where photoexcitation of trap centers and defects effectively modulates the gate potential, may provide an additional mechanism for photocurrent generation.

where A*$_{2D}$ is the 2D equivalent Richardson Constant, S is the contact area of junction, q is the electron charge, k$_B$ is the Boltzman's constant, Ø$_B$ is the Schottky Barrier Height (SBH), n is the ideality factor, and V$_{DS}$ is the drain-source voltage across the device. FIG. 19C is a plot of these slopes as a function of VDS, from where, SBH, Ø$_B$ was extracted from its y-intercept as $$C_0 = \frac{q\phi_B}{1000\, k_B}.$$

C$_0$ was obtained to be 0.835, which results in the SBH of this device Ø$_B$ being 0.071 eV.

Figure 20A:
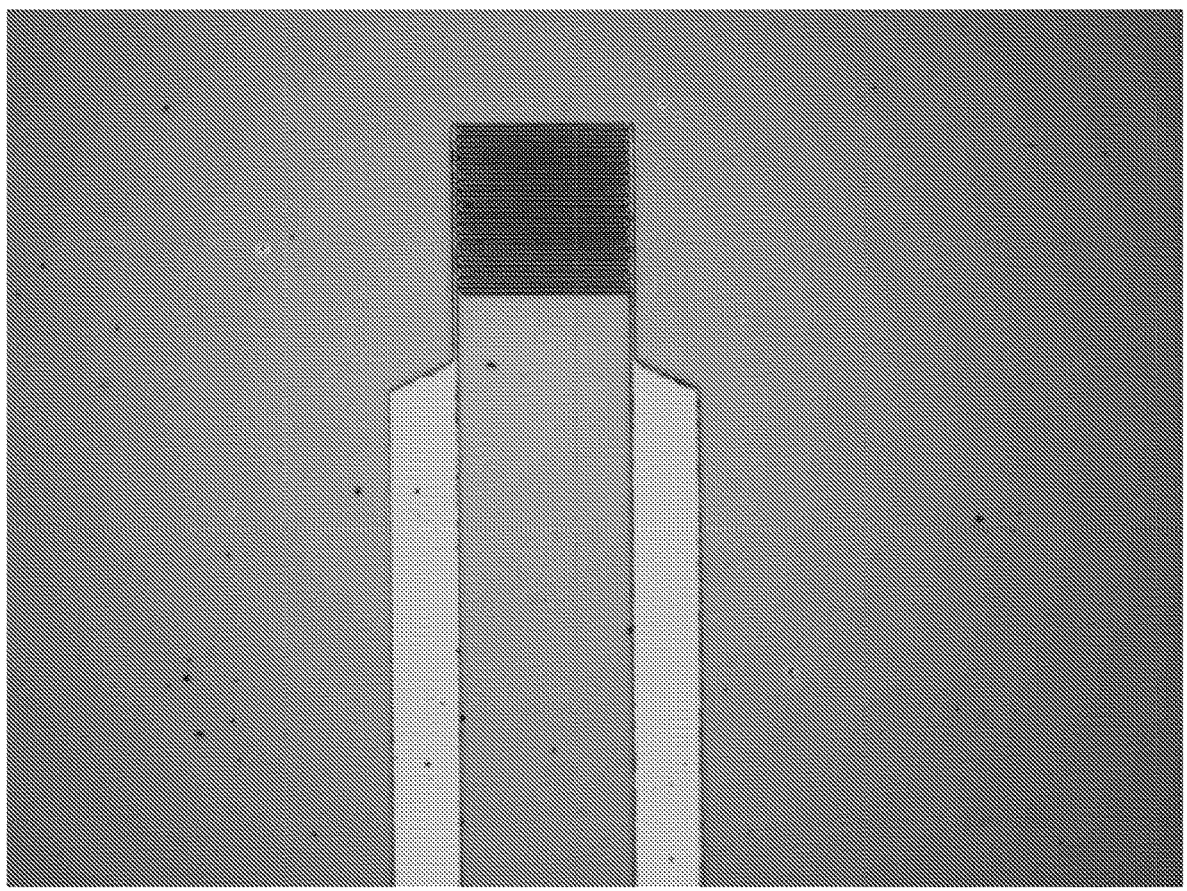
Figure 20B:
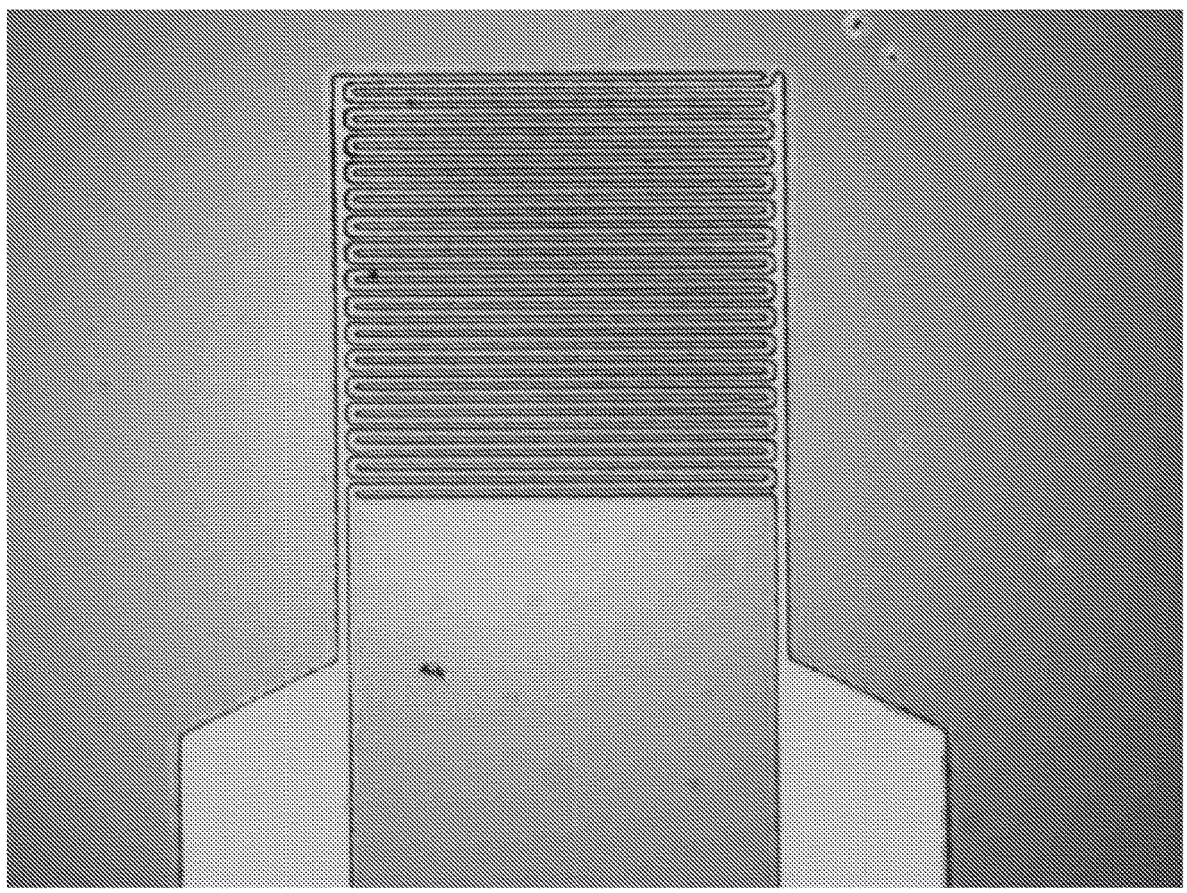
Figure 20C:
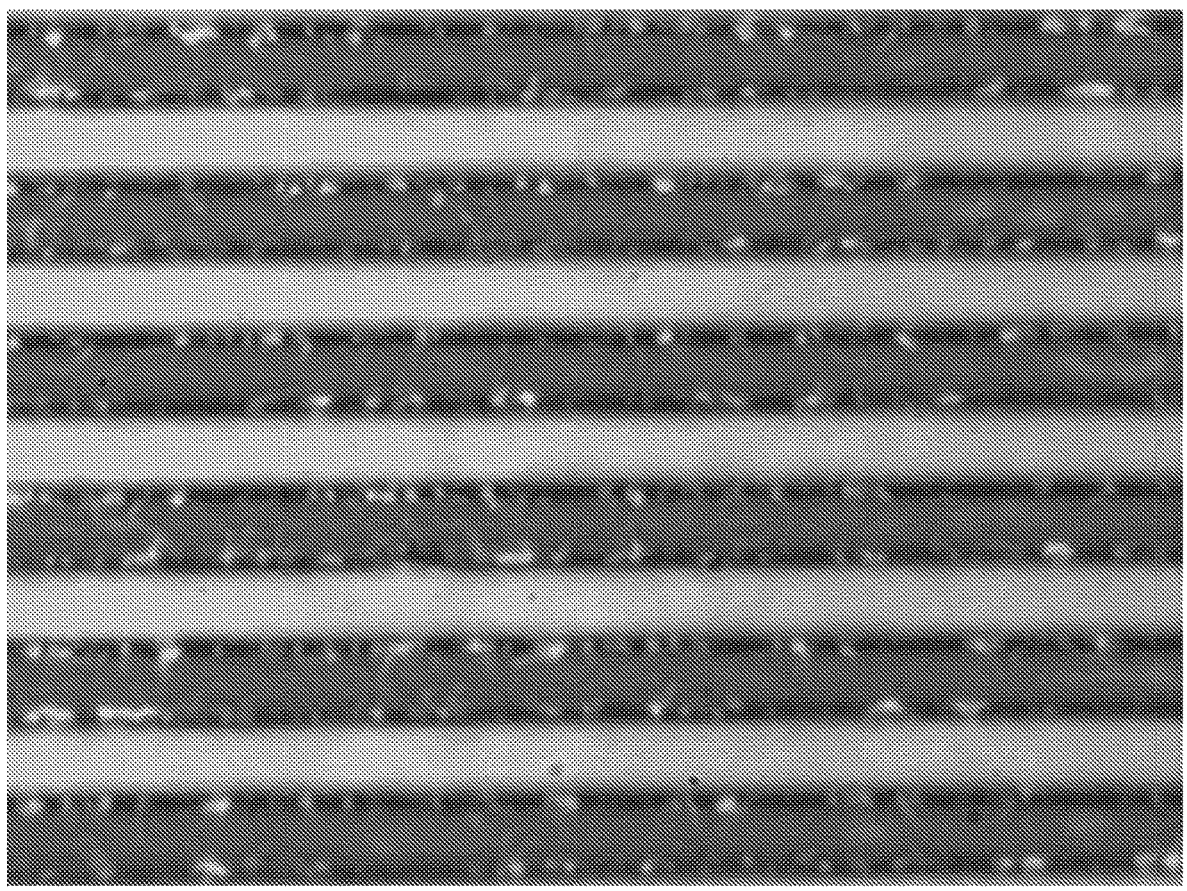

FIGS. 20A-20C: Image of a 4 µm wide channel MoSe$_2$ device.

Figure 21A:
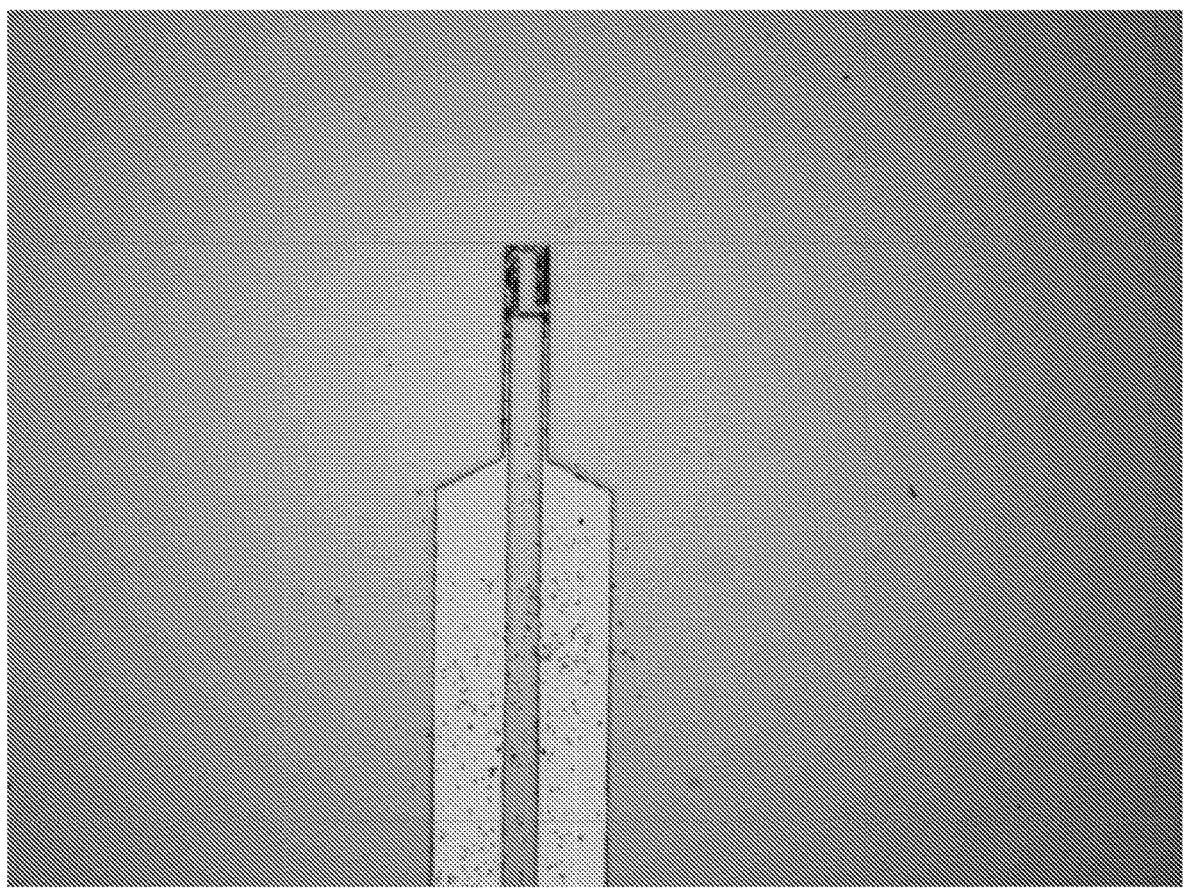
Figure 21B:
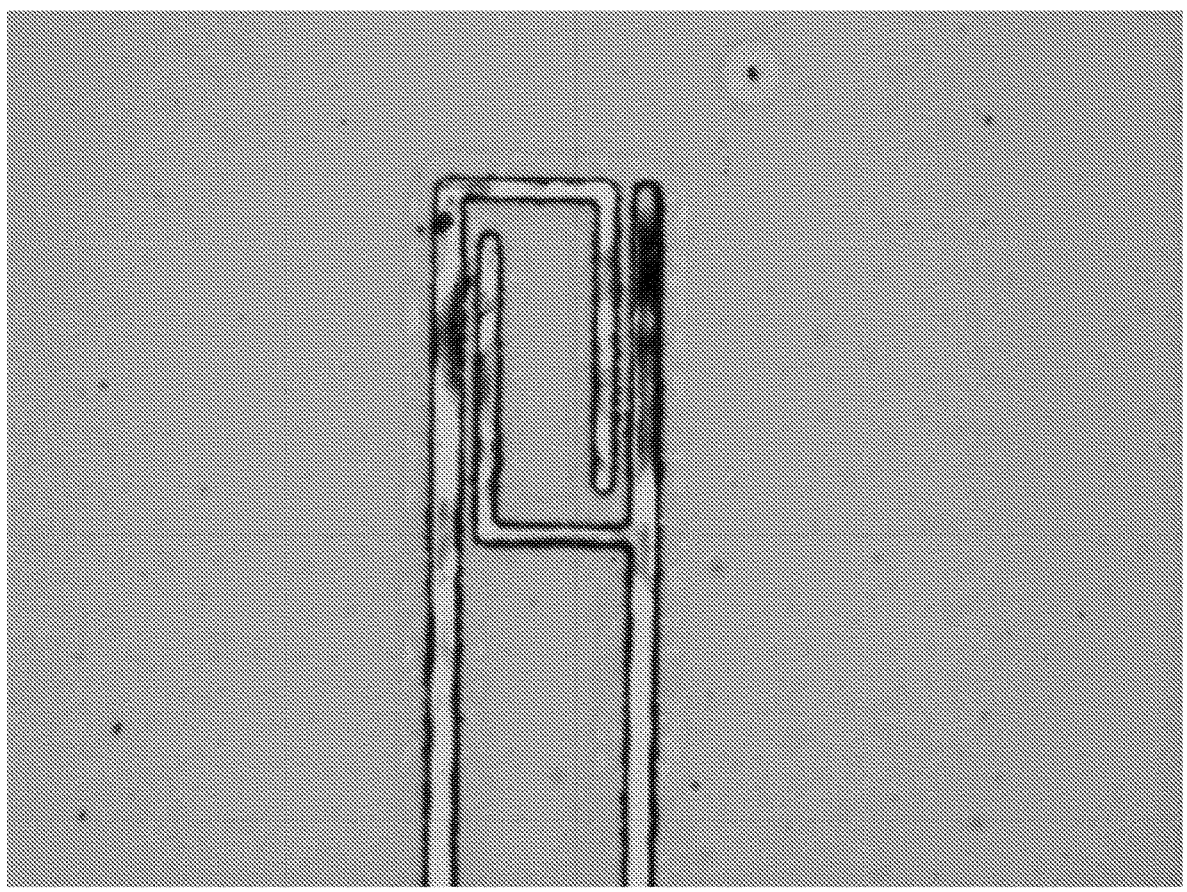
Figure 21C:
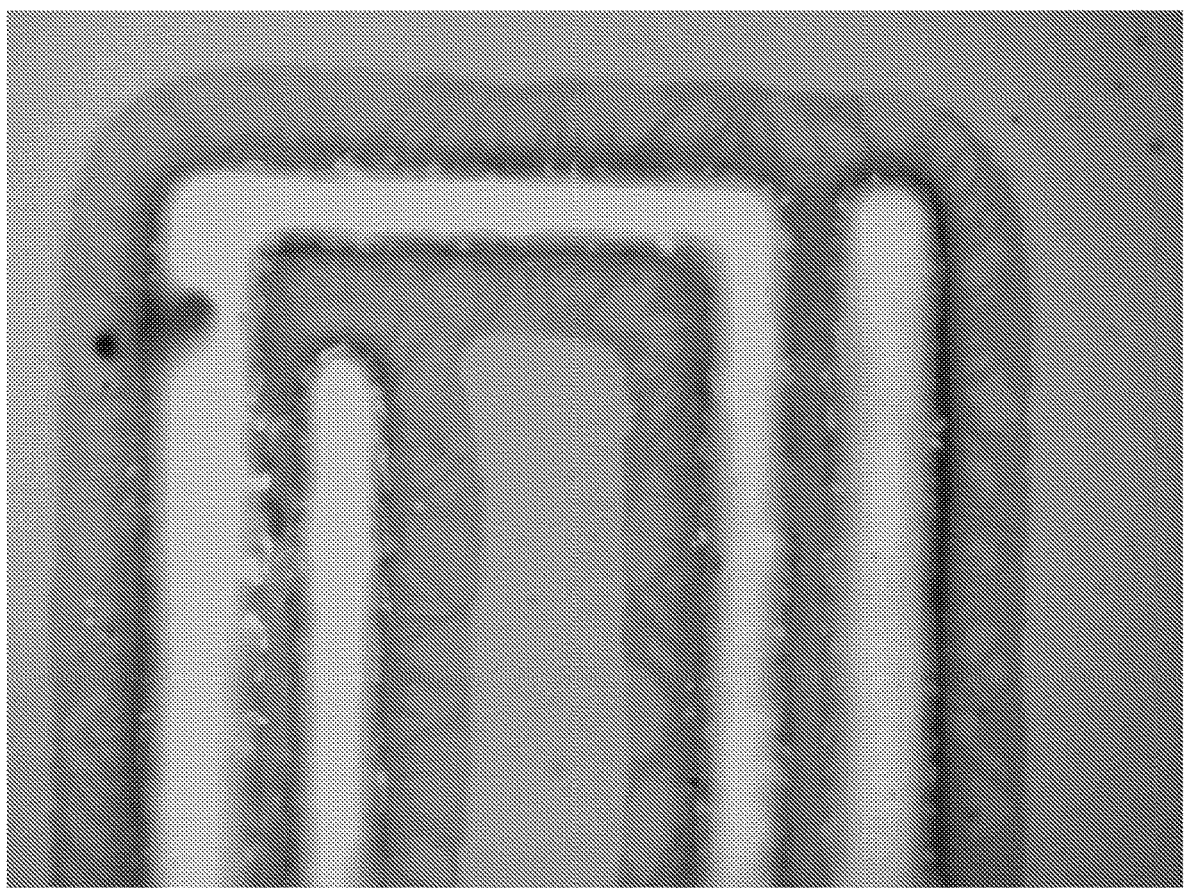

FIGS. 21A-21C: Images of a 1 L MoSe$_2$ device with a 6 µm small channel and a 60 µm big channel.

Figure 22:
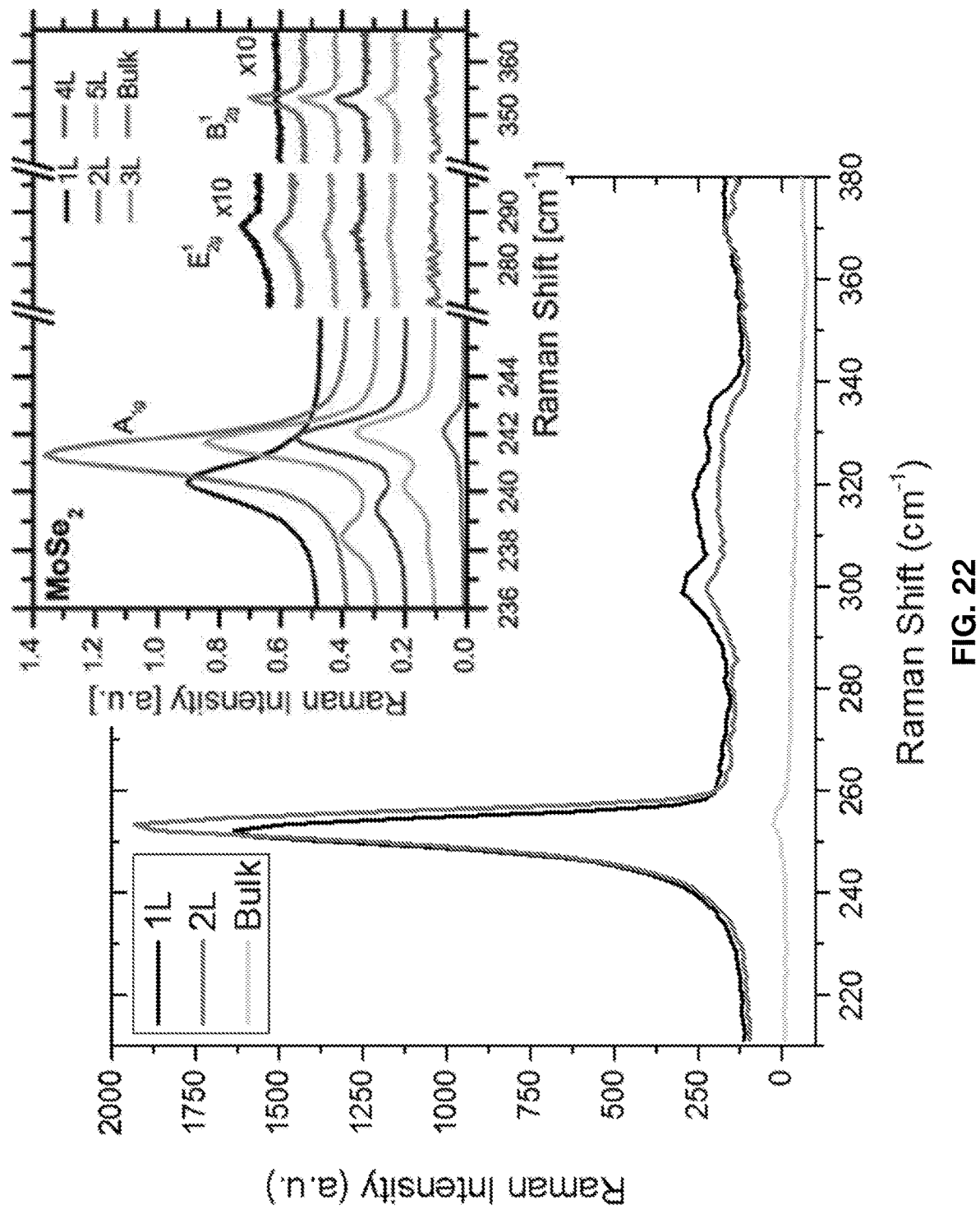

FIG. 22: Raman characterization of as-grown MoSe$_2$, where a known Raman spectra MoSe$_2$ is shown in the inset.

Figure 23:
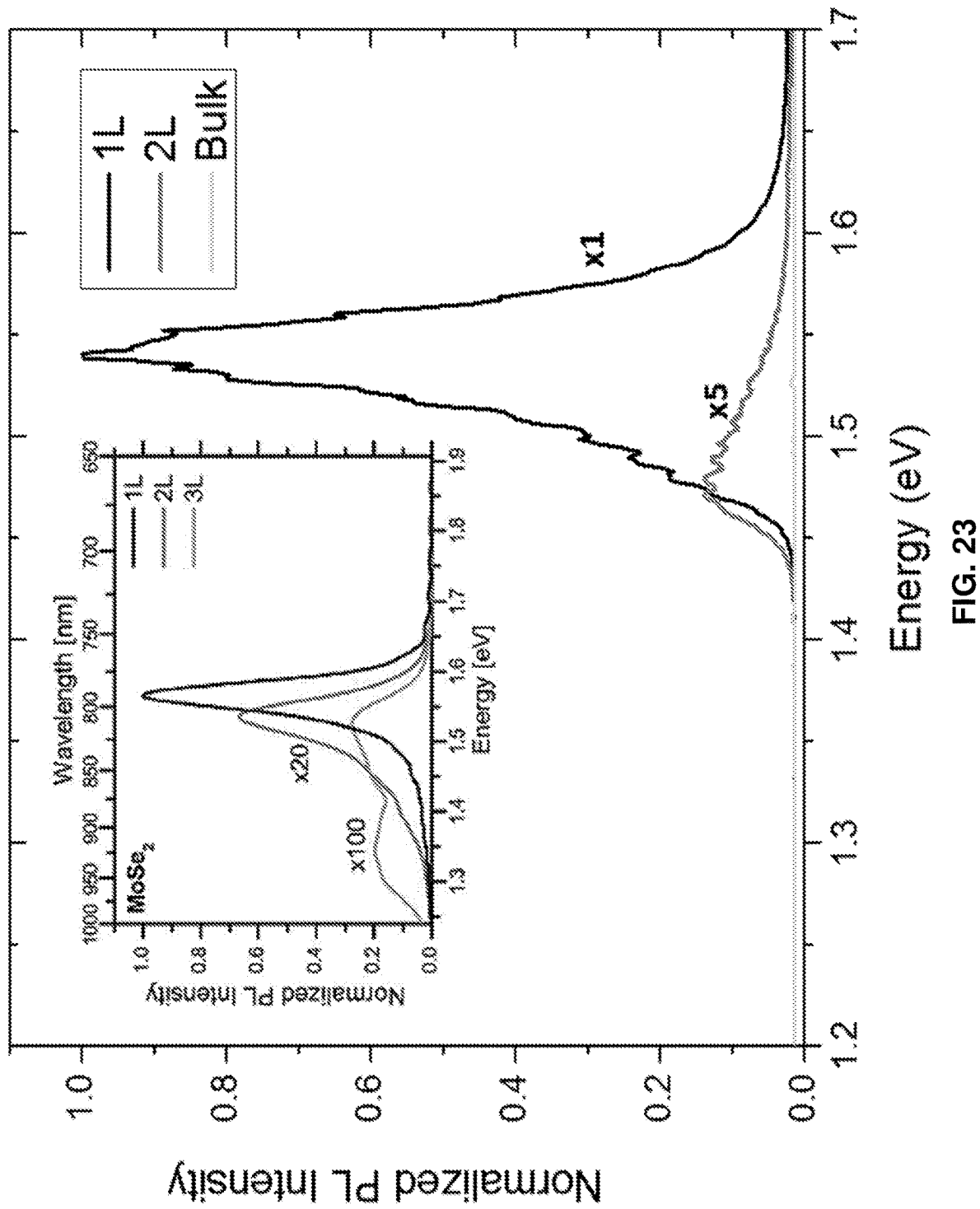

FIG. 23: Photoluminescence characterization of as-grown MoSe$_2$, where a known PL intensity of MoSe$_2$ is shown in the inset.

Figure 24A:
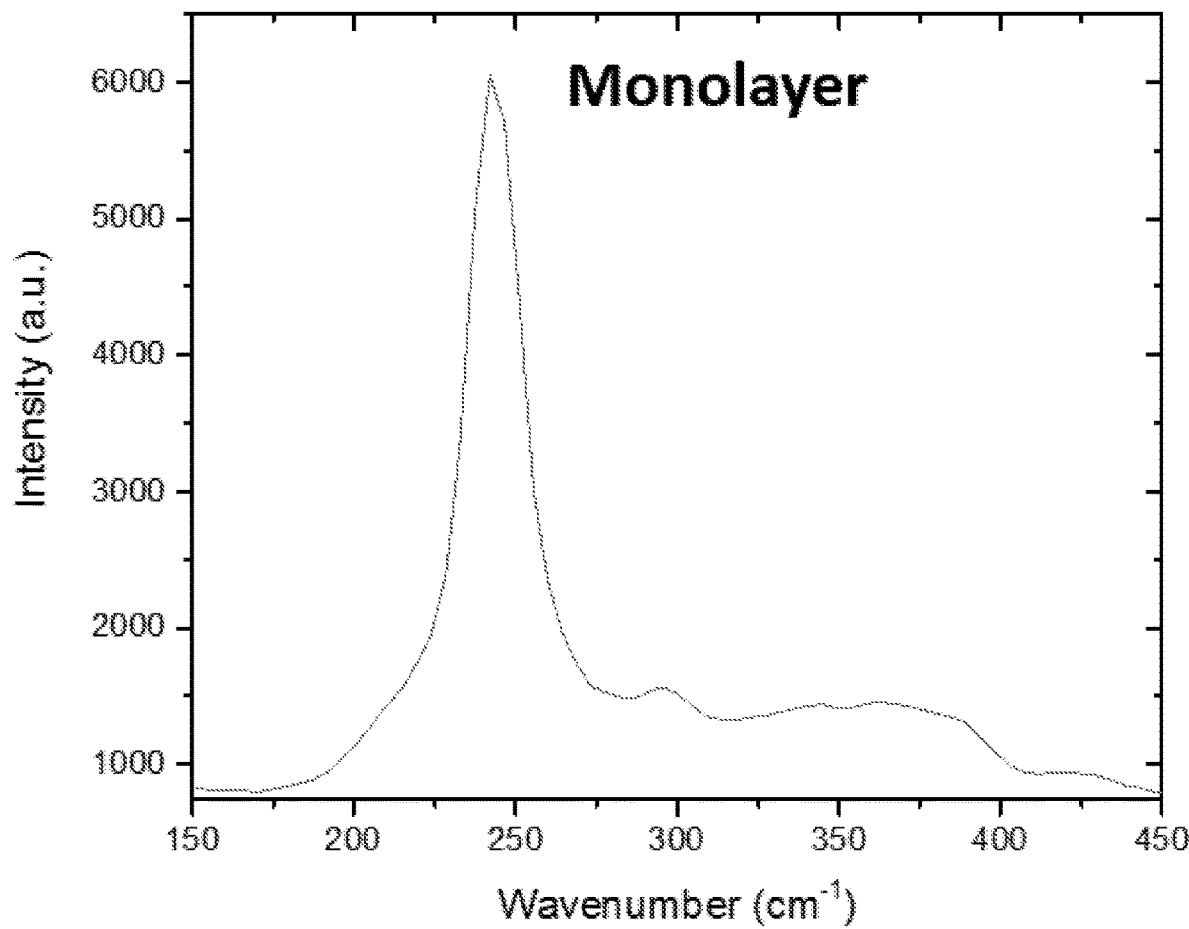
Figure 24B:
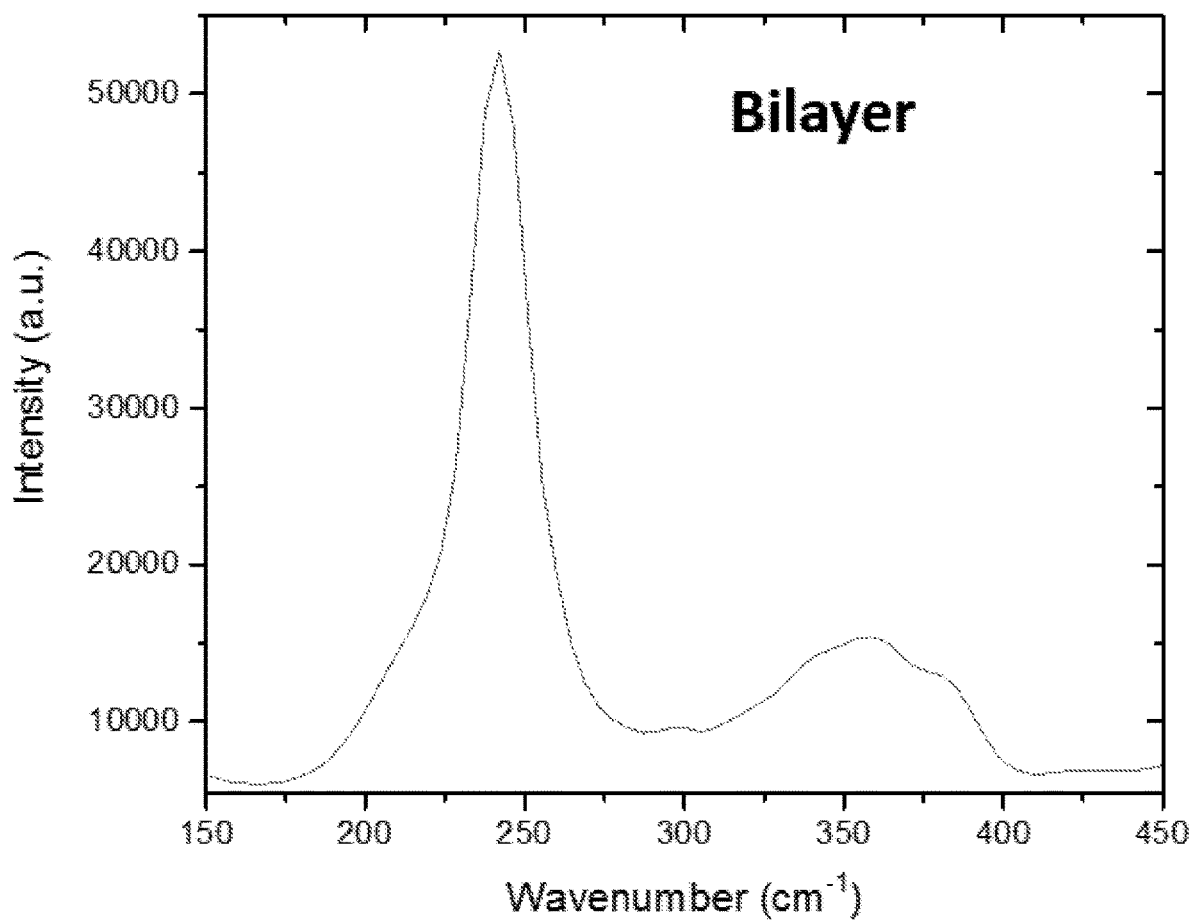
Figure 24C:
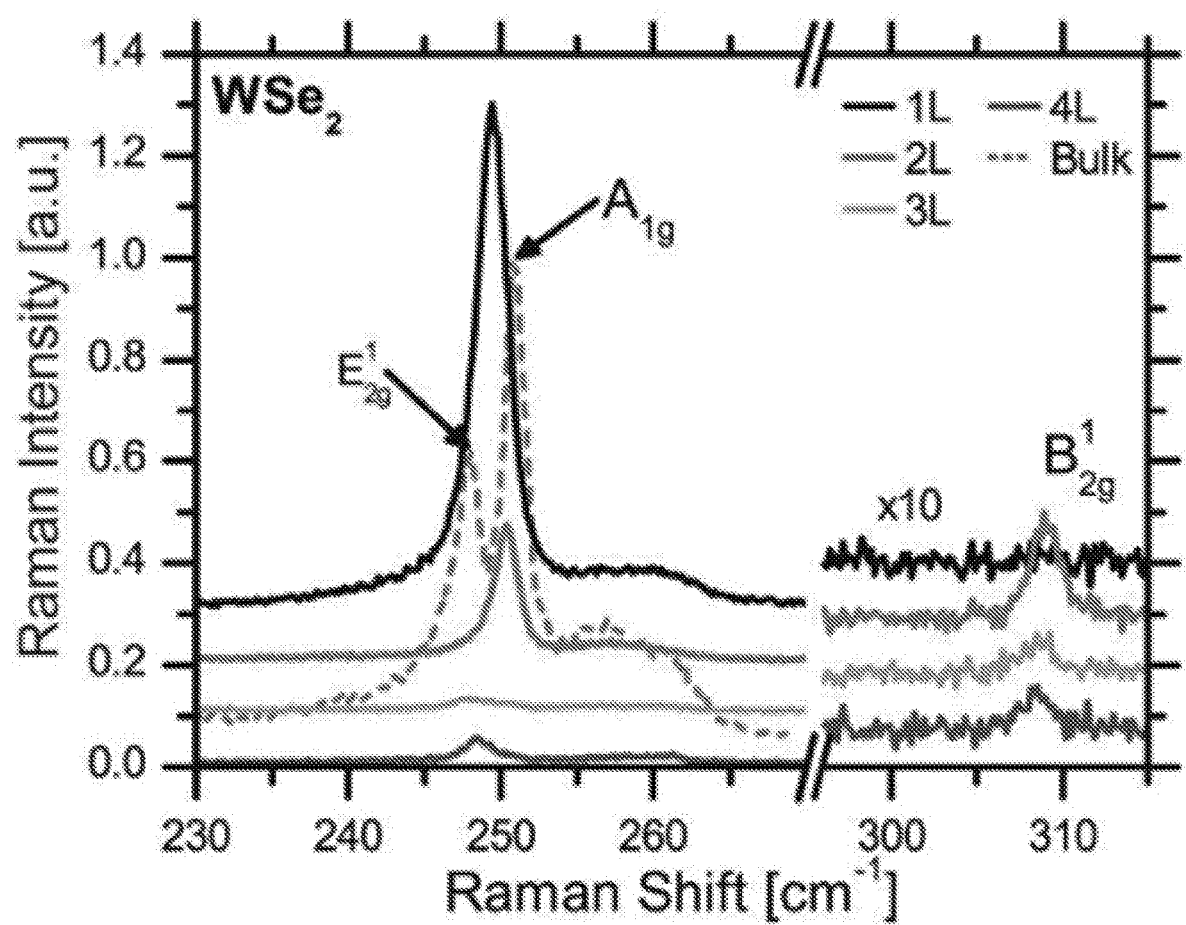
Figure 24D:
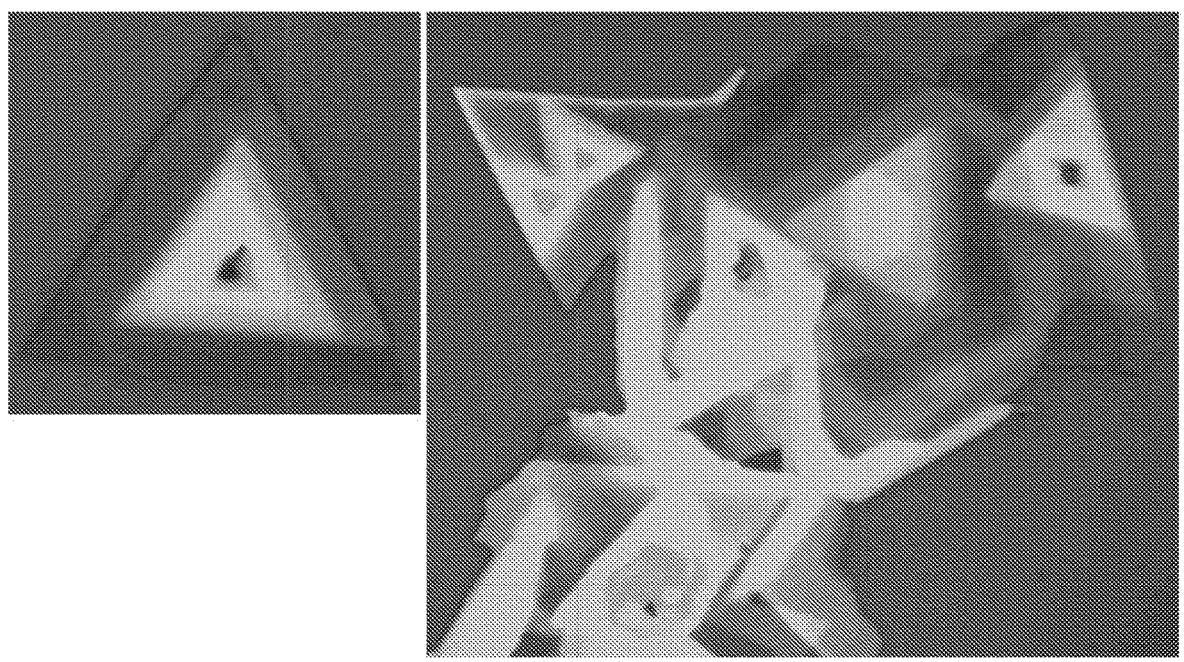

FIGS. 24A-24D: Characterization of as-grown WSe$_2$. FIG. 24A shows a Raman characterization of a monlayer, and FIG. 24B shows a Raman characterization of a bilayer. FIG. 24C shows a known Raman spectra for WSe$_2$. FIG. 24D shows images of the as-grown WSe$_2$.

DETAILED DESCRIPTION

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

Spatially relative terms, such as "beneath," "below," "lower," "above," "upper," and the like, may be used herein for ease of description to describe one element or feature's relationship to another element or feature. However, it should be understood that the spatially relative terms are intended to encompass different orientations of the device in use or operation. Furthermore, use of the terms "on" or "on top of" are not meant to imply "directly adjacent to" or "in direct contact with". When a layer or material is described as being "on" or deposited "on top of" another, the layers may or may not be in direct contact, and may have one or more intervening layers or materials therebetween.

The contemporary prominence of layered materials is driven by their technological and scientific potential in the two-dimensional (2D), monolayer, limit. In general, layered materials are composed of strong in-plane covalent bonds and weak out-of-plane van der Waals forces between layers. These materials can therefore be exfoliated down to a stable two-dimensional single layer form, displaying properties that are often absent in the bulk. In addition to properties such as high mobilities, semiconducting and superconducting behavior, and excellent thermal properties, many of these materials are conducive to transformative opto-electronic applications, with large absorption, strong room-temperature emission, non-linear response, and optical control of spin and valley degrees of freedom. The realization of a technique to unambiguously isolate, identify, and investigate atomically thin materials led to the discovery of graphene in 2004 and the emergence of 2D crystals as a vigorous field of fundamental research.

Devices have been fabricated through the isolation of monolayers followed by making metal contact with the film, commonly using e-beam lithography. The customary method for isolating monolayers is micromechanical exfoliation, which produces high quality crystalline flakes, on the order of up to tens of microns. However, this method provides no deterministic control over sample thickness, size, or location, and provides no path to scalability. Liquid exfoliation uses ionic species as intercalating agents, which facilitates a breakdown of van der Waal forces and results in sub-micrometer sized monolayers of TMDs. In addition to small sizes, liquid exfoliated monolayers are often found to have different structural and electronic properties, requiring further processing.

Chemical Vapor Deposition (CVD) has emerged as a useful synthesis process for TMD growth. Two general methods of CVD growth include heating of a metal oxide powder in the presence of sulfur, or direct sulfurization of thin layers of either metal or metal oxide. Regardless of the technique used to produce monolayer TMDs, once they are grown or isolated, conventional devices are then typically fabricated using lithography and metal deposition, which may require further processing in order to obtain good metal-semiconductor contacts. In contrast, described herein is a method that reverses this procedure, growing TMDs directly on lithographically defined metallic patterns. Using this method, uniform monolayer TMD growth has been successfully produced in a deterministic area, on and between metallic patterns, with high optical quality. Thus, described herein is a method for providing as-grown metallic contacts to a material that also produces high optical quality 2D material within deterministic and selective areas, as well as the materials and devices made therefrom. The method is scalable for large-scale device fabrication and production.

Figure 11:
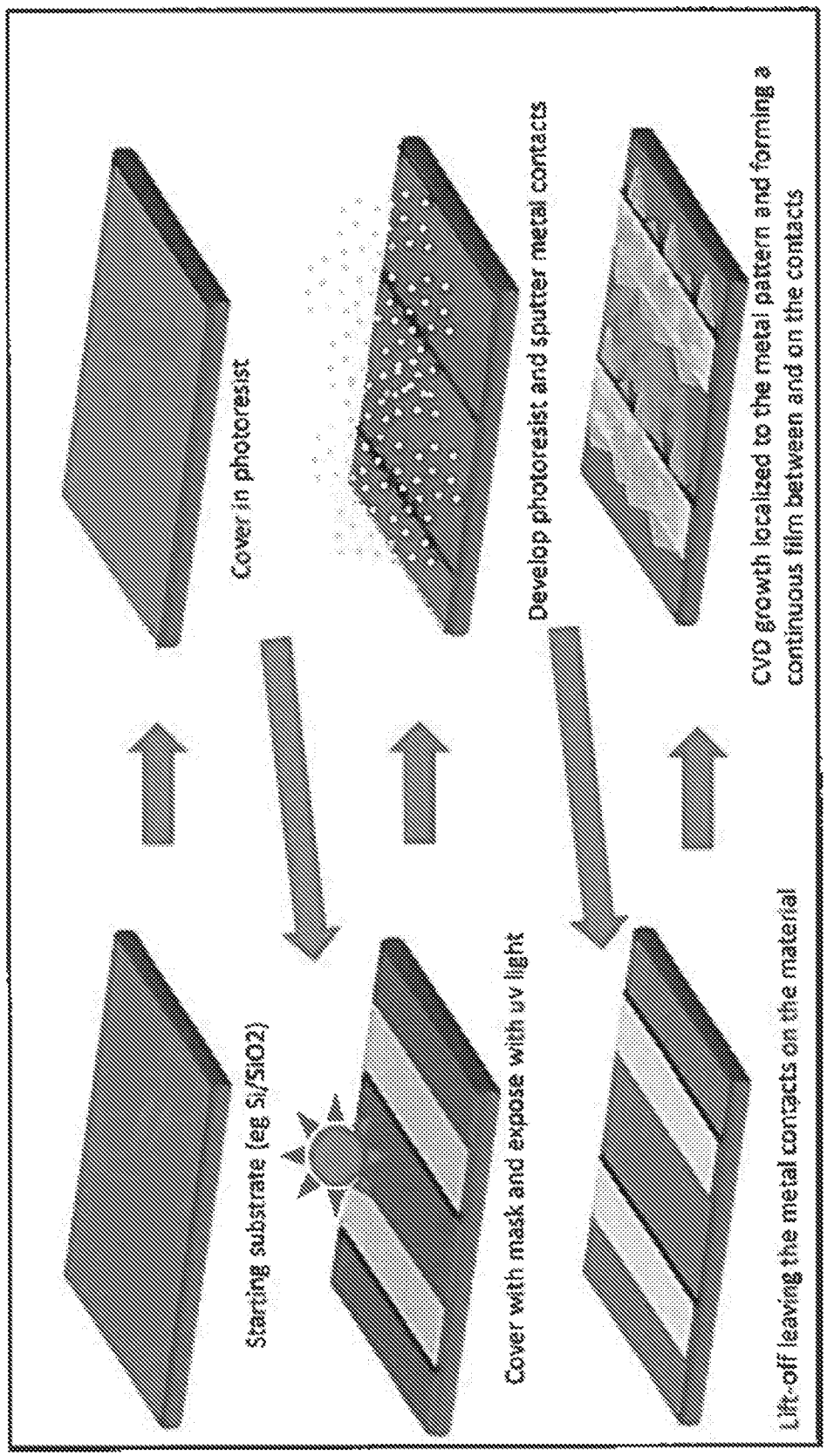
FIG. 11: Illustration of a non-limiting example of a method for making a semiconductor device described herein.

A conventional process, such as depicted in PRIOR ART FIG. 10, generally involves growing a material with CVD before performing a lithography process. As illustrated in FIG. 11, the method described herein somewhat reverses conventional processing known in the art. As illustrated in FIG. 11, the metal contacts are created first (i.e., before a deposition process such as CVD) and serve as the seed/catalyst for the 2D material growth. In effect, the method can grow a device between the contacts. The method generally involves performing a lift-off photolithography process and depositing metal contacts, where the lift-off leaves only the metal contacts/patterns on the substrate, and then growing a monolayer 2D TMD material on and between the contacts via a deposition process to form a naturally contacted device.

A standard lift-off lithography process generally involves applying a photoresist to a substrate, covering the substrate with a photomask and exposing the substrate to ultraviolet (UV) light, removing the photomask, and developing and removing the photoresist exposed to UV light. Optionally, the exposed substrate surface can be etched, depending on the type of device being fabricated. The exposure to UV light causes a chemical change that allows some of the photoresist to be removed with a developer solution. Common developers are solutions containing NaOH or tetramethylammonium hydroxide (TMAH), but other developers are possible. Once the photoresist is no longer needed, it can be removed through conventional means such as a liquid stripper that alters the photoresist such that it no longer adheres to the substrate. Photoresist can also be removed by an oxidizing plasma or a suitable solvent that dissolves the photoresist.

The photoresist material can be any conventional photoresist material commercially available. A photoresist is a light-sensitive material used to form a patterned coating on the surface of the substrate. The photoresist reveals certain regions in the substrate. The photomask is generally an opaque plate with holes or transparencies that allow light to shine through in a defined pattern. Any conventional photomask can be used in the method. The skilled person will recognize that the particular photomask used will depend on the desired pattern of TMD material on the substrate.

TMDs are semiconductors having the formula $MX_2$, where M is a transition metal atom and X is a chalcogen atom. Transition metals include Mo, W, Sc, Ti, V, Cr, Mn, Fe, Co, Ni, Cu, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, and Cn. Chalcogens include O, S, Se, Te, and Po. In certain embodiments, the transition metal is selected from the group consisting of Mo, W, and Nb. In certain embodiments, the chalcogen is selected from the group consisting of S, Se, and Te. Two non-limiting examples of TMDs grown in the Examples herein are $MoS_2$ and $WS_2$. Other non-limiting examples of TMDs include $MoSe_2$, $MoTe_2$, $WSe_2$, $WTe_2$, $NbS_2$, $NbSe_2$, $NbTe_2$, $ZrO_2$, $ZrS_2$, $FeTe_2$, $TiS_2$, $TiSe_2$, and $TiTe_2$. TMDs are generally very optically active materials which absorb light well. Any TMD material can be produced with the method described herein using the appropriate combination of metal contacts and deposition process reactants.

Any deposition process capable of depositing 2D materials can be utilized as the growth process. Suitable deposition processes include chemical vapor deposition (CVD) processes, such as atmospheric pressure CVD, low-pressure CVD, ultrahigh pressure CVD, aerosol assisted CVD, direct liquid injection CVD, hot wall CVD, cold wall CVD, microwave plasma assisted CVD, plasma-enhanced CVD, atomic layer CVD, combustion chemical vapor deposition, hot filament CVD, hybrid physical-chemical vapor deposition, metalorganic chemical vapor deposition, rapid thermal CVD, vapor-phase epitaxy, or photo-initiated CVD; physical vapor deposition processes, such as cathodic arc deposition, electron beam physical vapor deposition, evaporative deposition, pulsed laser deposition, or sputter deposition; or sublimation.

Using CVD as an example, any suitable CVD apparatus can be utilized to perform the CVD process. In general, CVD involves the formation of a non-volatile solid film on a substrate by the reaction of vapor phase reactants that contain desired components. The gases are introduced into a reactor vessel, and decompose and react at a heated surface on the substrate to form the desired film. Typically, the gases are created from vaporized powder reactants, which, upon vaporization, are led into the reactor vessel where they react at the heated surface to form the desired film.

Again referring to CVD for exemplary purposes, a CVD process as described herein is typically conducted at a temperature of at least about 600° C. to ensure optimal TMD material growth. In some embodiments, the CVD process is conducted at a temperature at or above about 600° C., but below about 780° C.

To grow TMD films as described herein, the deposition process can be conducted with powder reactants that can include a chalcogen powder, such as a sulfur powder, and an oxide precursor powder. Alternatively, the powder reactants can include combinations of multiple chalcogen powders and/or multiple oxide precursor powders.

In some embodiments, the deposition process can be conducted with the various reactants and substrate at different temperatures. That is, the growth process can be performed with multiple temperature zones such that the substrate with the lithographically defined, metallic pattern is at a first temperature, the oxide precursor is at a second temperature, and the chalcogen is at a third temperature.

The oxide precursor, when used, is an oxide of a metal, such as a transition metal, and may be in the form of a powder that is vaporized in the deposition process. As one non-limiting example, when $MoS_2$ is desired to be grown, the oxide precursor $MoO_3$ can be used as a powder reactant, in addition to a sulfur powder reactant, in the deposition process. As another non-limiting example, when $WS_2$ is desired to be grown, the oxide precursor $WO_2$ can be used as a powder reactant, in addition to a sulfur powder reactant, in the deposition process. Similarly, when $MoTe_2$ is desired to be grown, the oxide precursor $MoO_3$ can be used in addition to a tellurium powder reactant. As another example, when $WSe_2$ is desired to be grown, the oxide precursor $WO_2$ can be used in addition to a selenium powder reactant. Without wishing to be bound by theory, it is believed that the oxide precursors are important for deterministic monolayer growth of the TMD material. The oxide precursor can be an oxide of any transition metal, or combinations thereof. In some embodiments, as described below, the transition metal in the oxide precursor is the same transition metal as in the metal contacts that are deposited on the substrate. However, it is understood that an oxide precursor is not strictly necessary to grow a TMD material.

The composition of the metal contacts deposited on the substrate, and the presence and composition of the oxide precursor in the deposition process, are important factors for the growth of monolayer TMD in the method described herein. The metal contacts can be deposited through any suitable method, such as DC sputtering. The deposited metal contacts can have a thickness ranging from about 1 nm to about 1000 nm, or from about 50 nm to about 500 nm. In one non-limiting example, the deposited metal contacts have a thickness of about 100 nm. The metal species in the metal contacts can be any suitable metal, but preferably is a transition metal. In some non-limiting examples, the metal species is Mo, W, Pt, or Ti. In some embodiments, the metal species in the metal contacts is the same transition metal as the transition metal in the oxide precursor, and as a result, the same transition metal in the TMD material being grown. In other embodiments, the metal species in the metal contacts is a different transition metal from the transition metal in the oxide precursor, and the resulting TMD material is a hybrid TMD material. Without wishing to be bound by theory, it is believed that the metallic patterns serve as both a nucleation site as well as a feedstock for limited growth. Furthermore, when an oxide precursor is not used, the growth is generally limited to the areas of the metal contacts.

The substrate (also referred to as a wafer) used in the method can be any substrate on which material can be grown through a deposition process. Because the deposition process may involve temperatures of at least about 600° C., the substrate should be capable of withstanding at least about 600° C. Some non-limiting examples of suitable substrates include silicon, $Si/SiO_2$, quartz, aluminum oxide, glass, sapphire, germanium, gallium arsenide, and indium phosphide.

A wide variety of devices can be fabricated using the method described herein, such as by adding further semiconductor layers and/or electrodes to the semiconductor devices made by growing a TMD material on a substrate. Possible devices include, but are not limited to, diodes, transistors, photodetectors, and solar cells. The skilled person will recognize that any type of device conventionally made from normal semiconducting methods can be made with the method described herein. The overall procedure is relatively straightforward and robust, and provides a technique for scalable fabrication of monolayer TMD-based devices.

As exemplified in the Examples, the devices made according to the method as described possesses contacts that are better than in comparable devices made from other methods. Without wishing to be bound by theory, it is believed that using conventional methods causes a barrier to be created between the contact and the semiconductor because there are no physical, chemical bonds therebetween, whereas the method described herein results in contacts that are chemically bonded to the TMD material. Conventional methods result in contacts being simply deposited onto a semiconductor layer and forming van der Waals interactions therebetween, whereas the method described herein results in contacts that are more naturally grown, and are chemically bonded to the TMD material. This alleviates or eliminates the barrier created from other methods.

EXAMPLES

Example I

Examples of the layered materials described herein were prepared for the transition metal dichalcogenides $MoS_2$ and $WS_2$, which have diverse and useful electronic and optical properties. The basic technique used in this Example involved a standard lift-off lithography process along with DC sputtering to produce patterns composed of a given transition metal, which then act as the nucleation and/or seed for the subsequent CVD growth. The CVD procedure involved sulfurization of the as-deposited metallic patterns in the presence a small amount of a powder oxide precursor, either $MoO_3$ or $WO_2$, in addition to the sulfur powder.

Figure 1A:
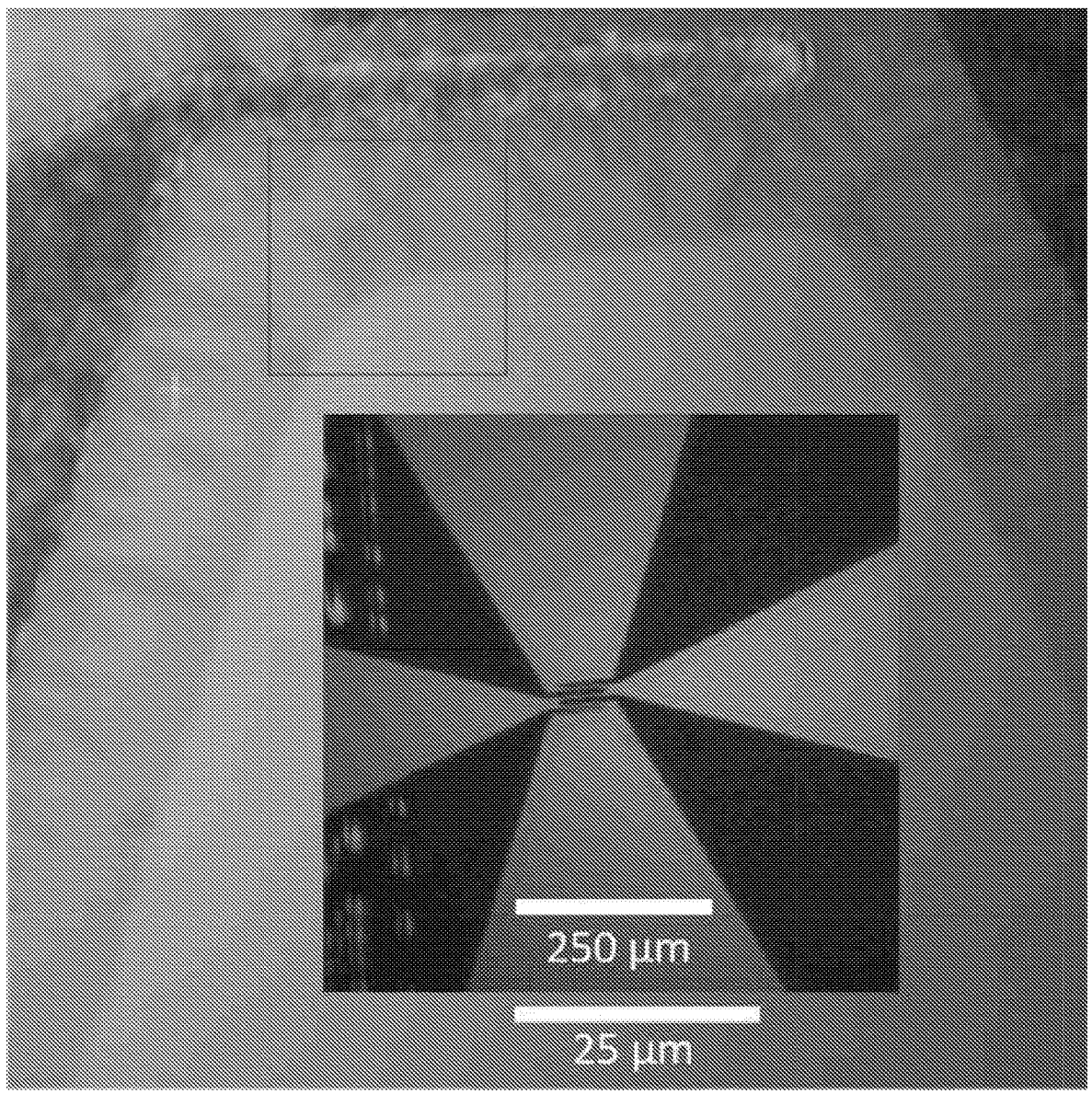
FIGS. 1A-1H: Optical and AFM analysis of $MoS_2$ grown on a molybdenum four-probe device.
Figure 1B:
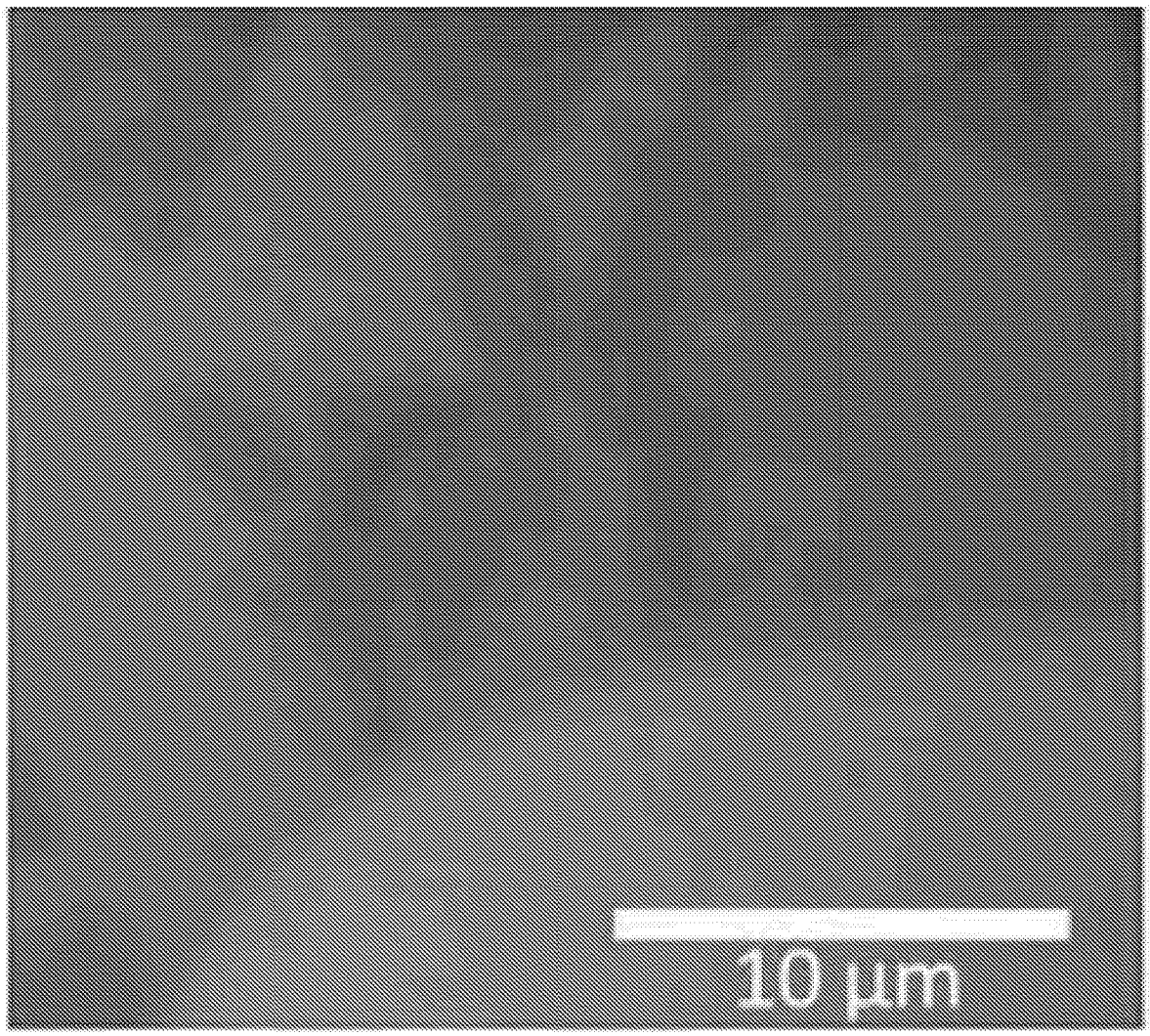
Figure 1C:
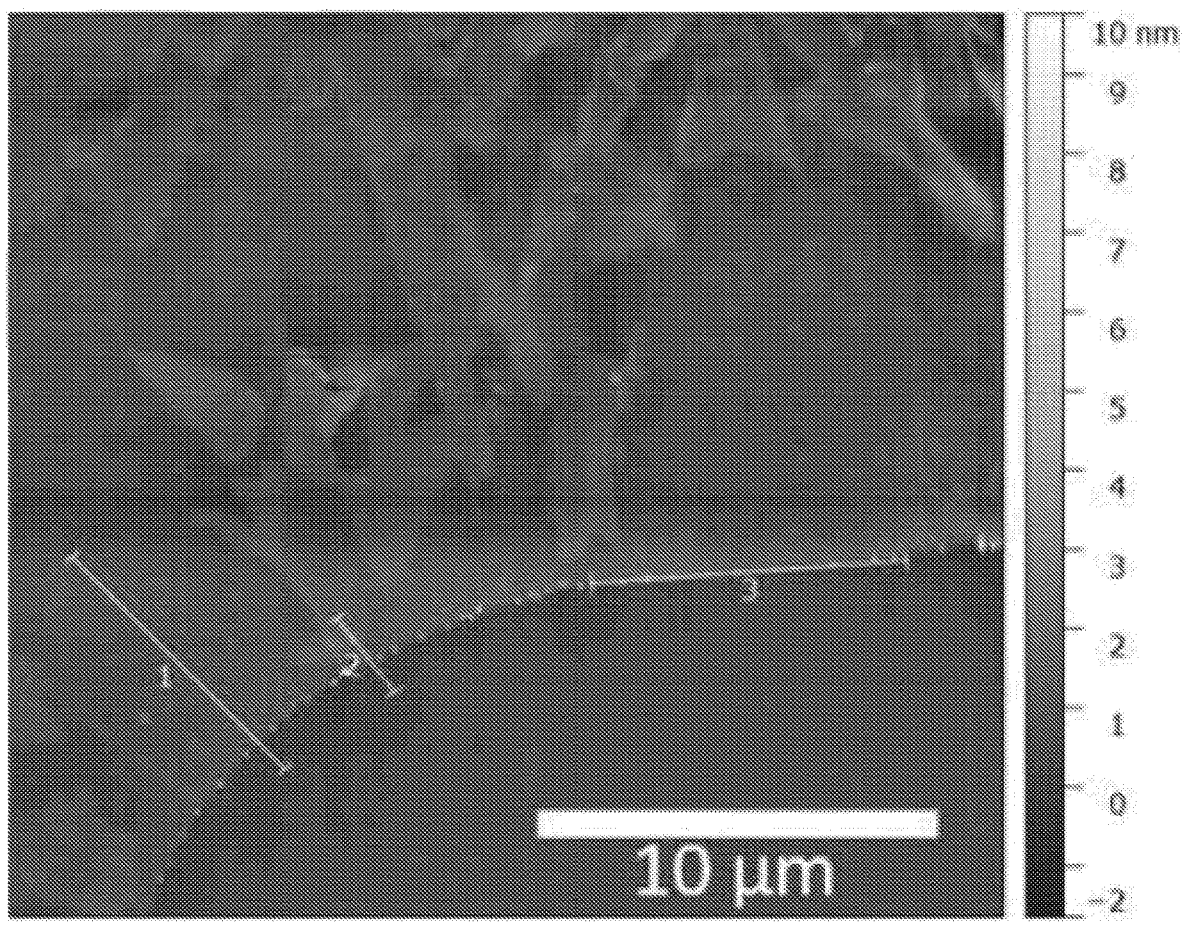
Figure 1D:
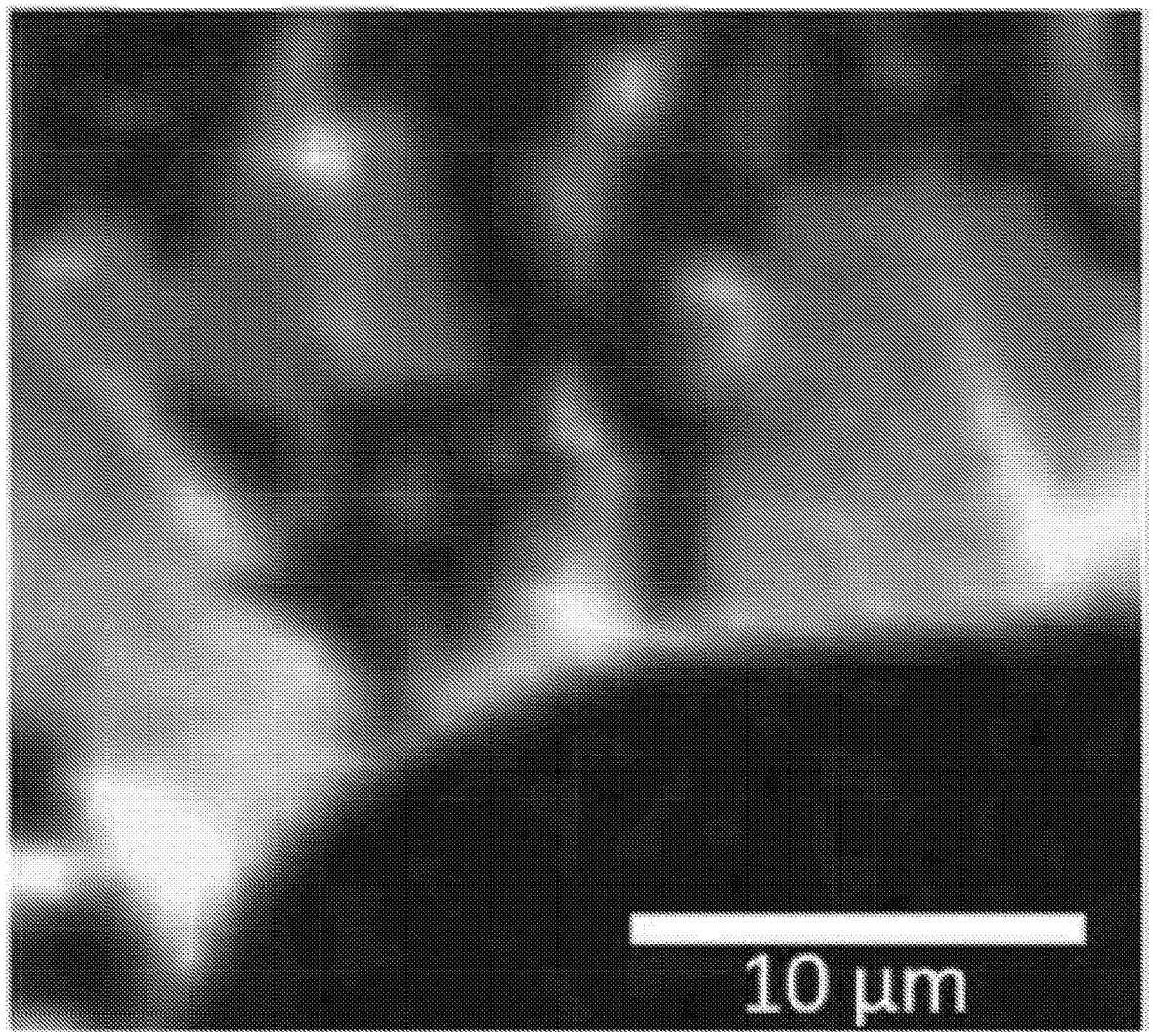
Figure 1E:
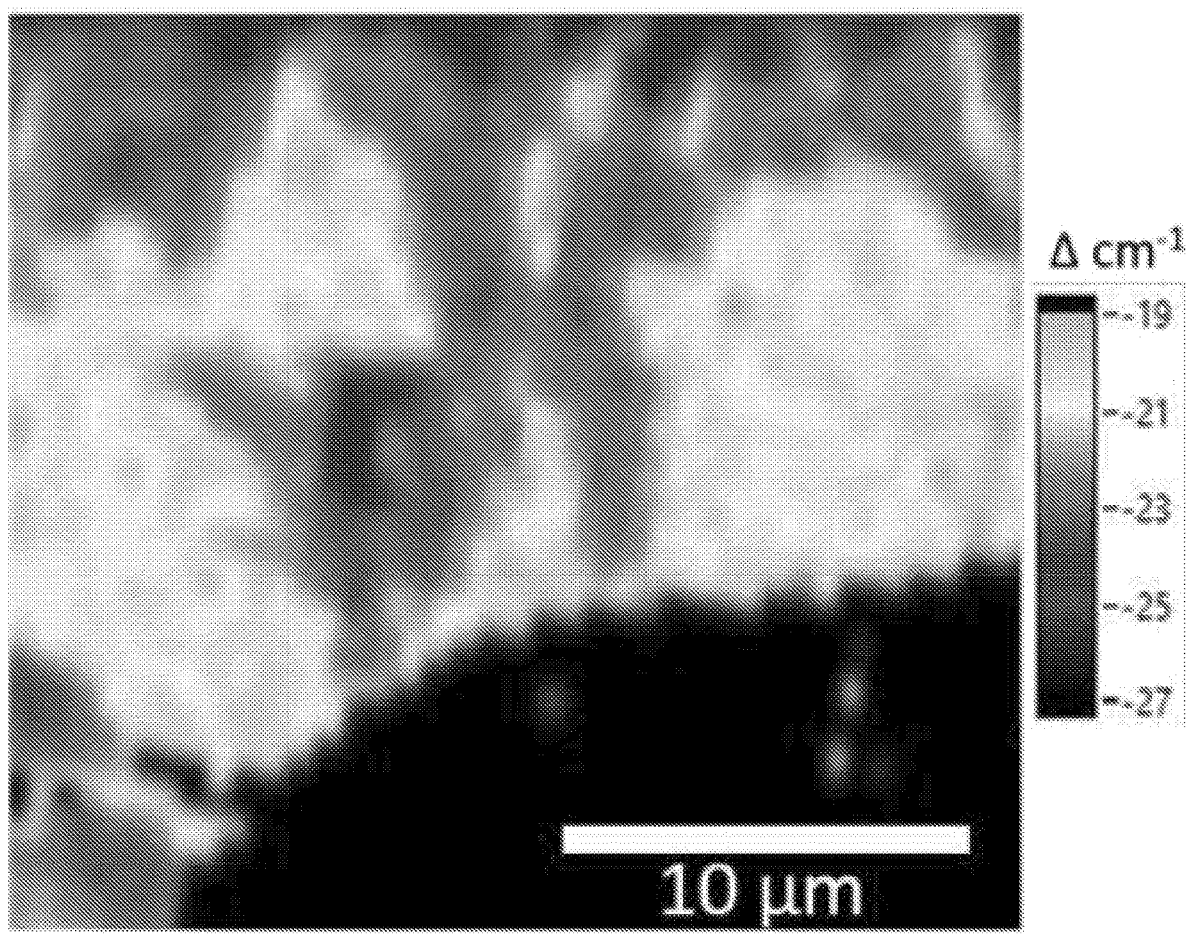
Figure 1F:
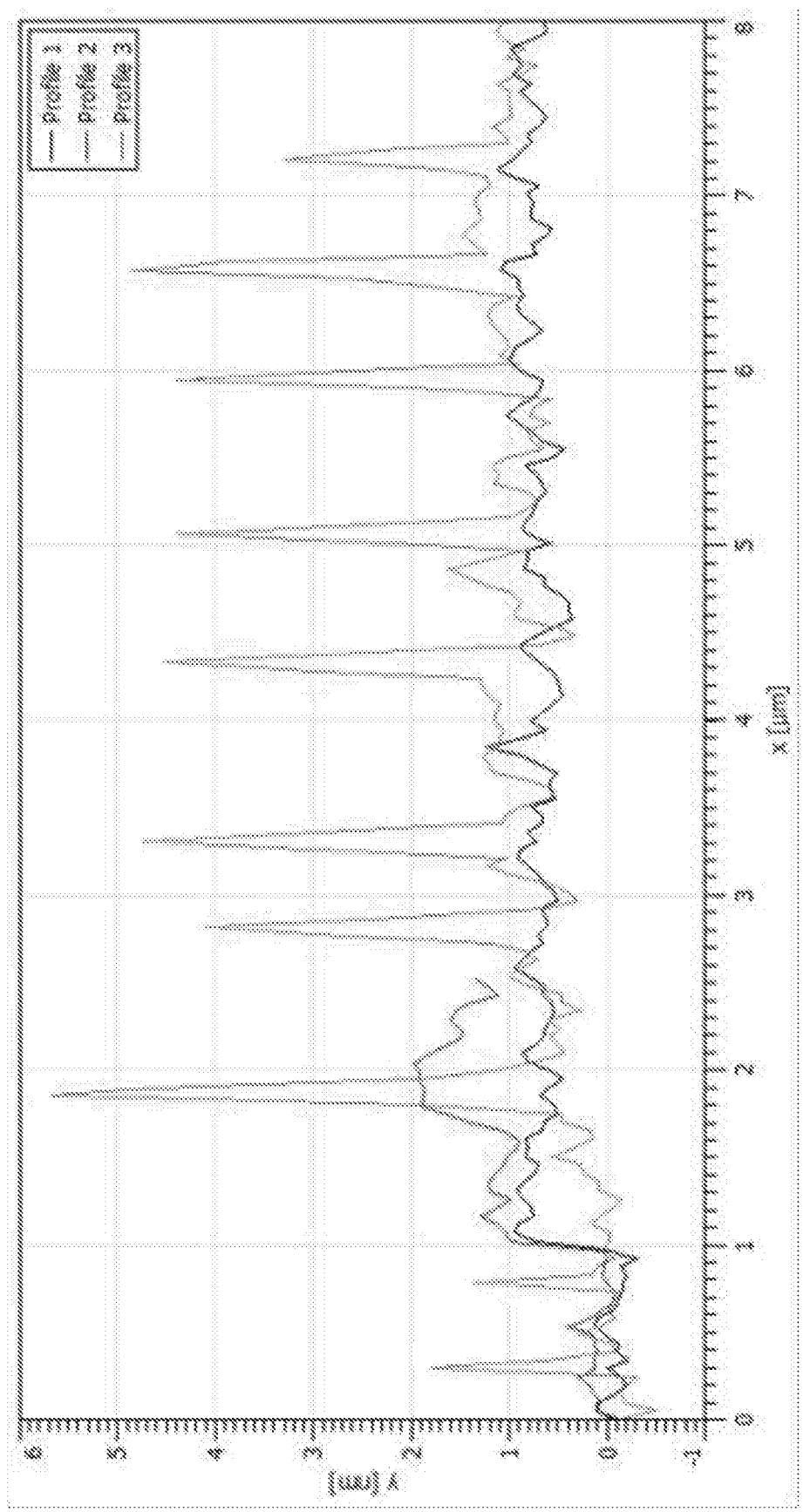
Figure 1G:
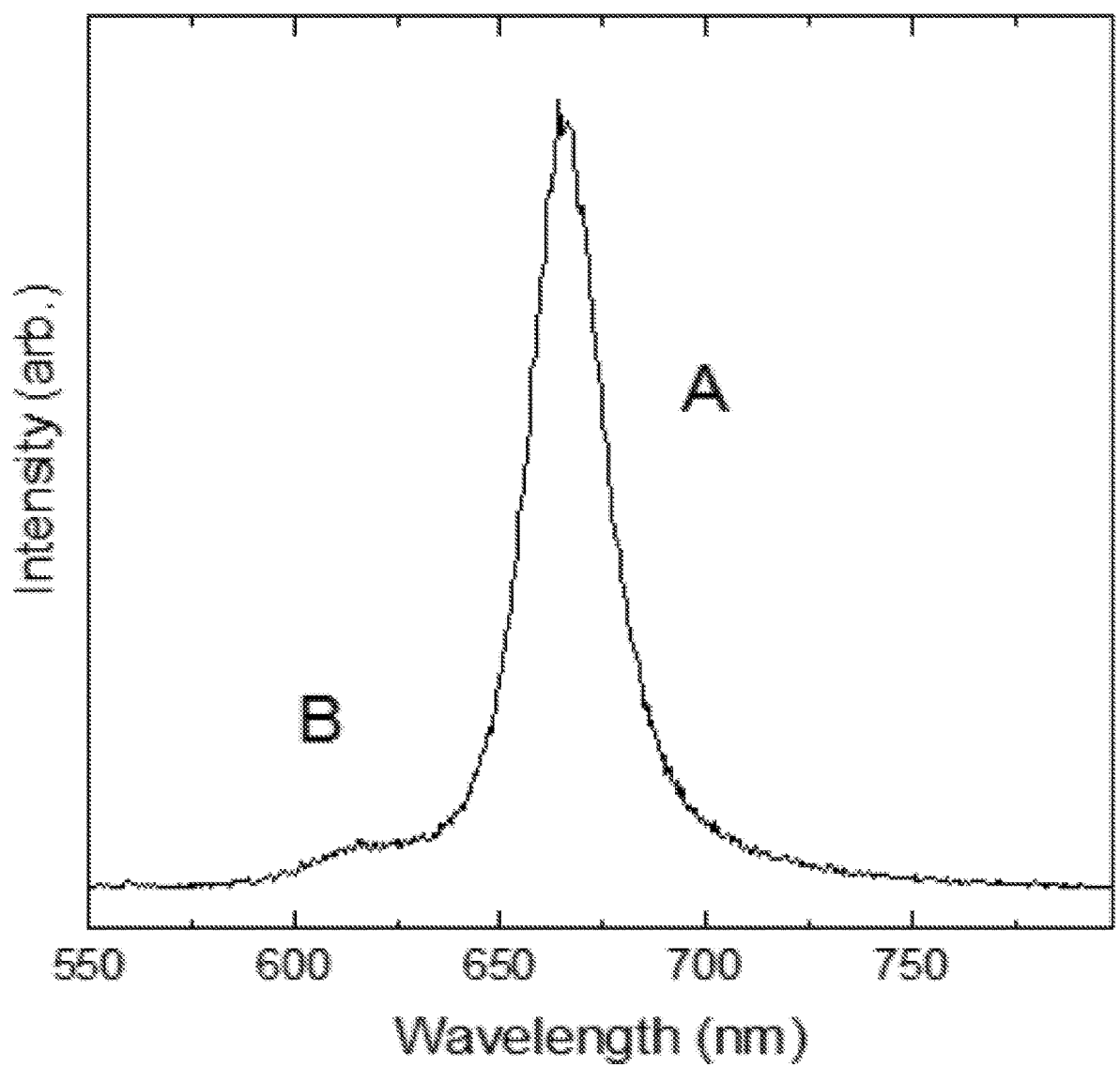
Figure 1H:
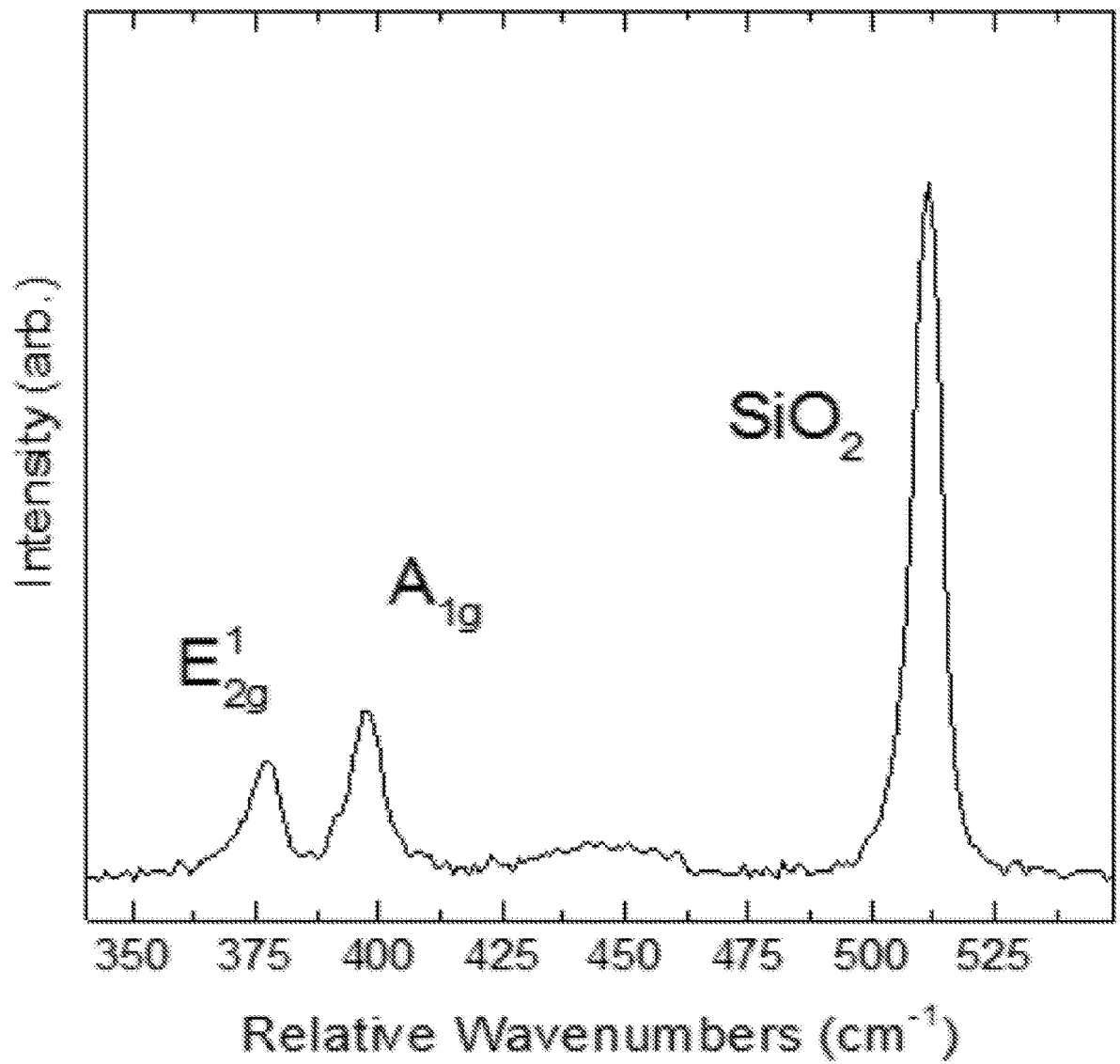
Figure 2A:
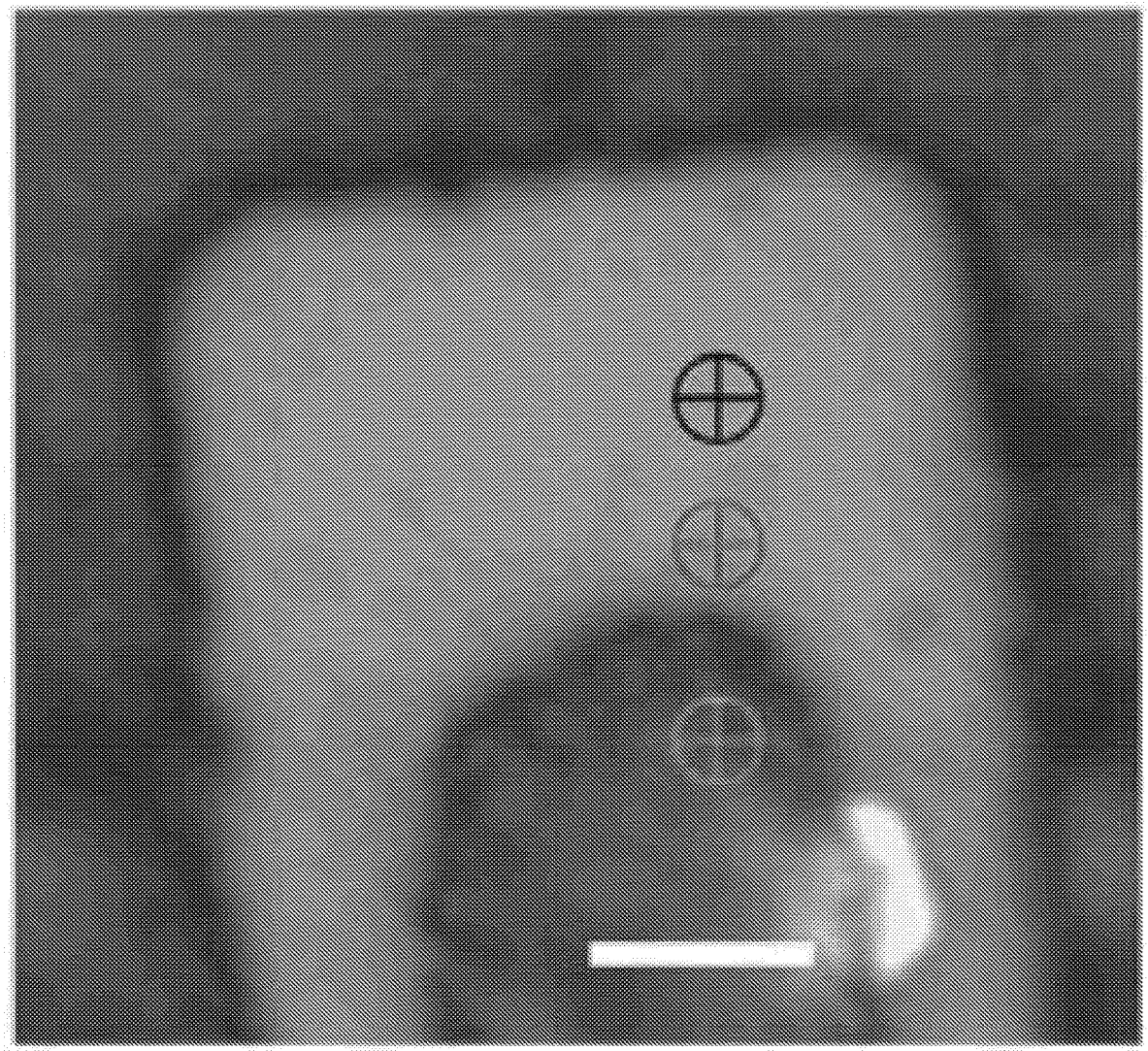
FIGS. 2A-2E: Optical analysis of continuous monolayer $MoS_2$ film formation between molybdenum features.
Figure 2B:
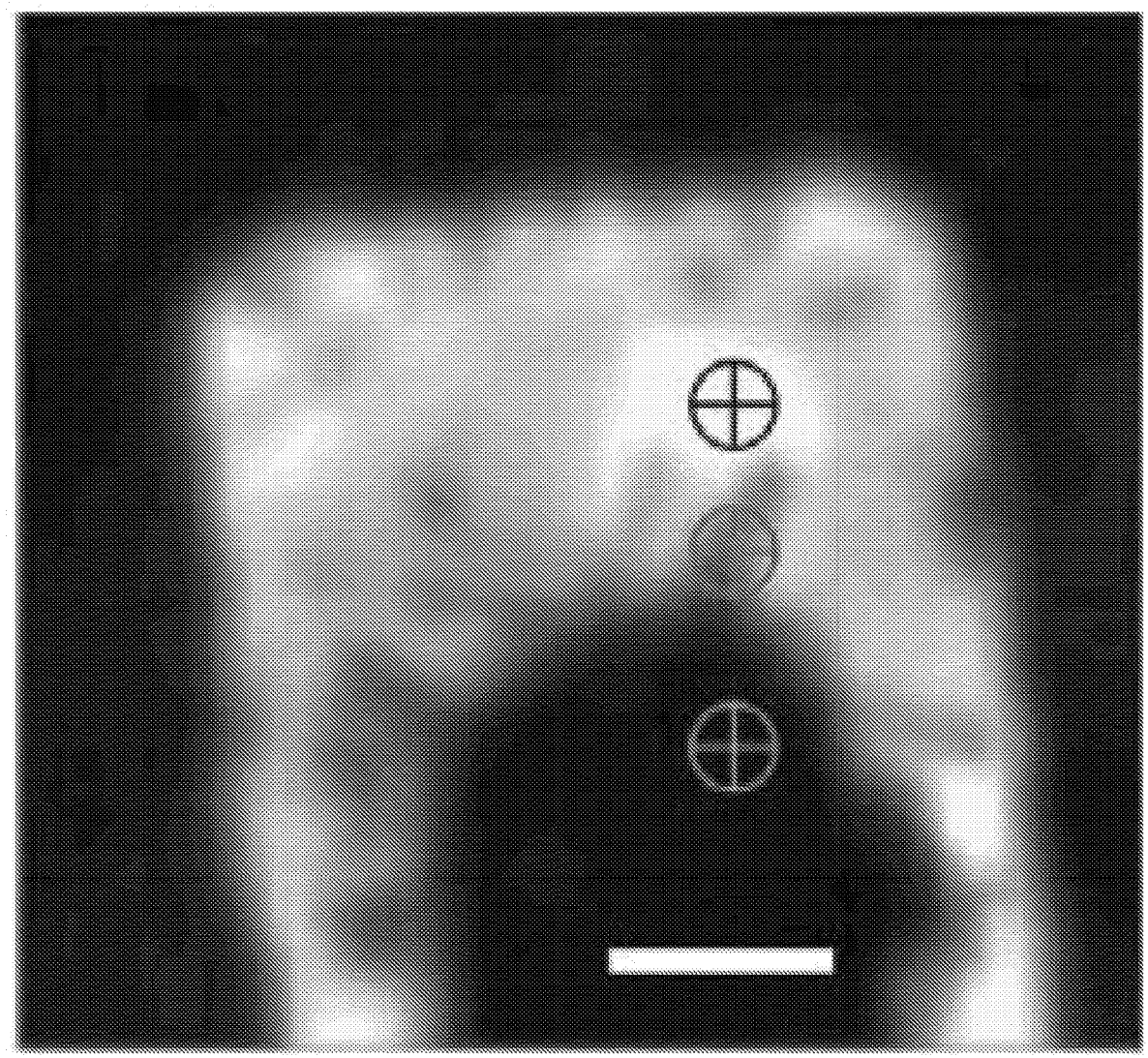
Figure 2C:
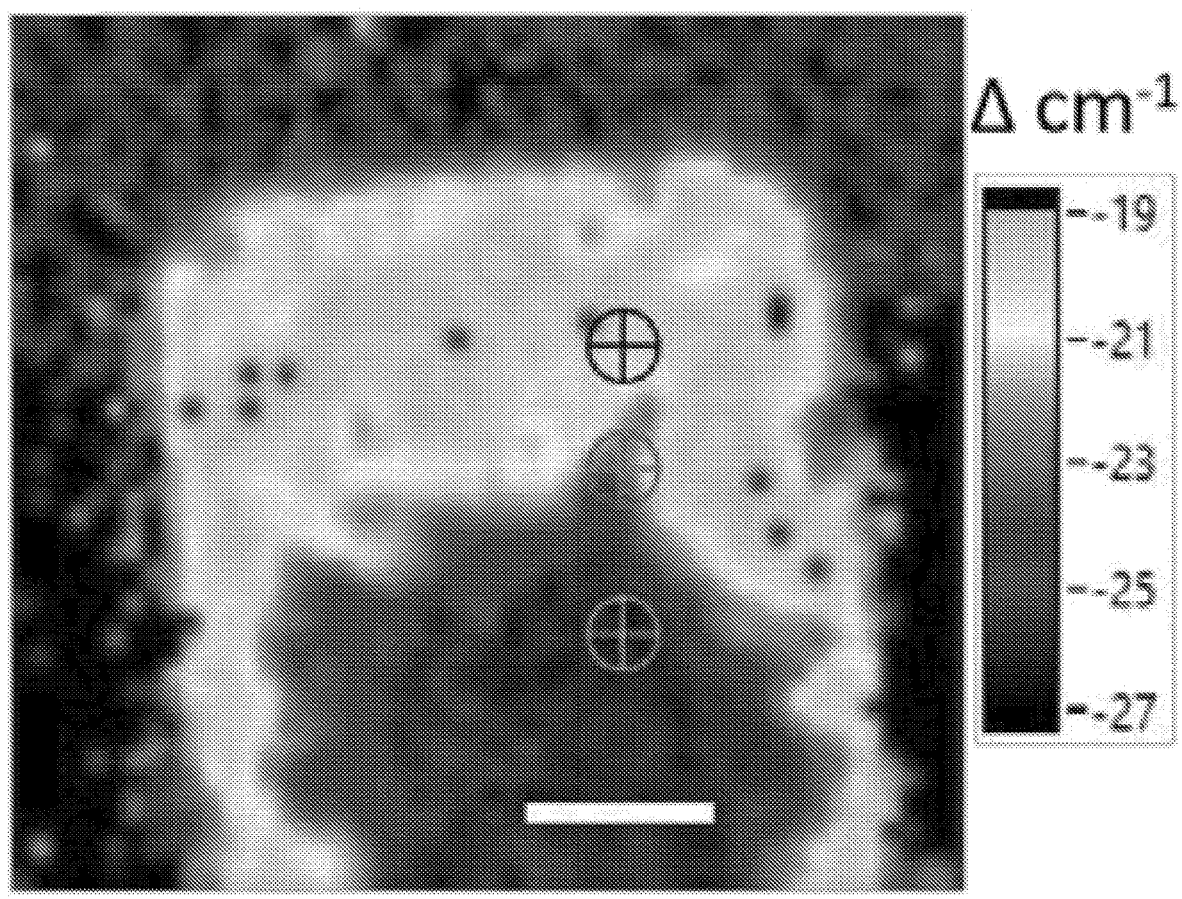
Figure 2D:
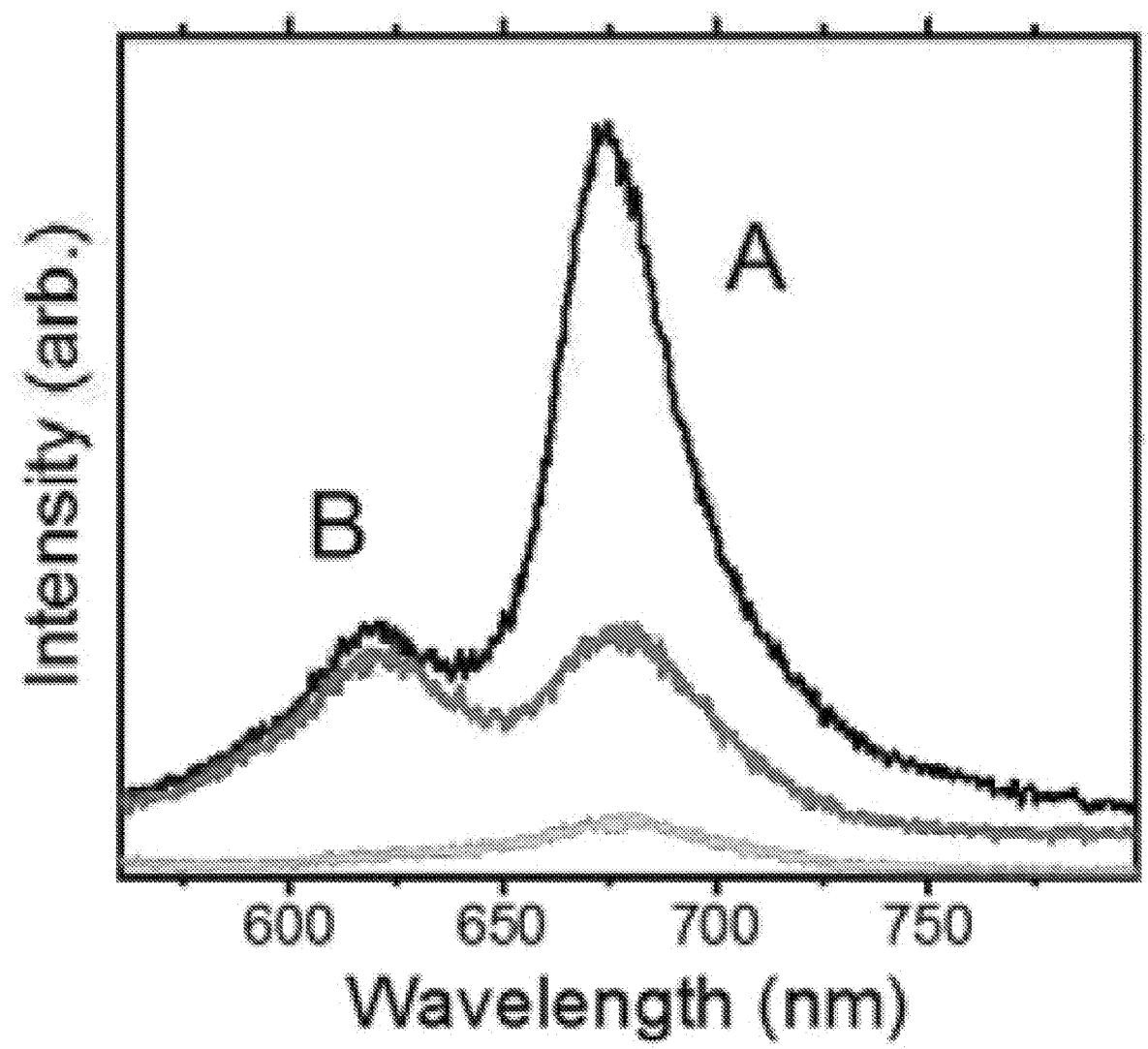
Figure 2E:
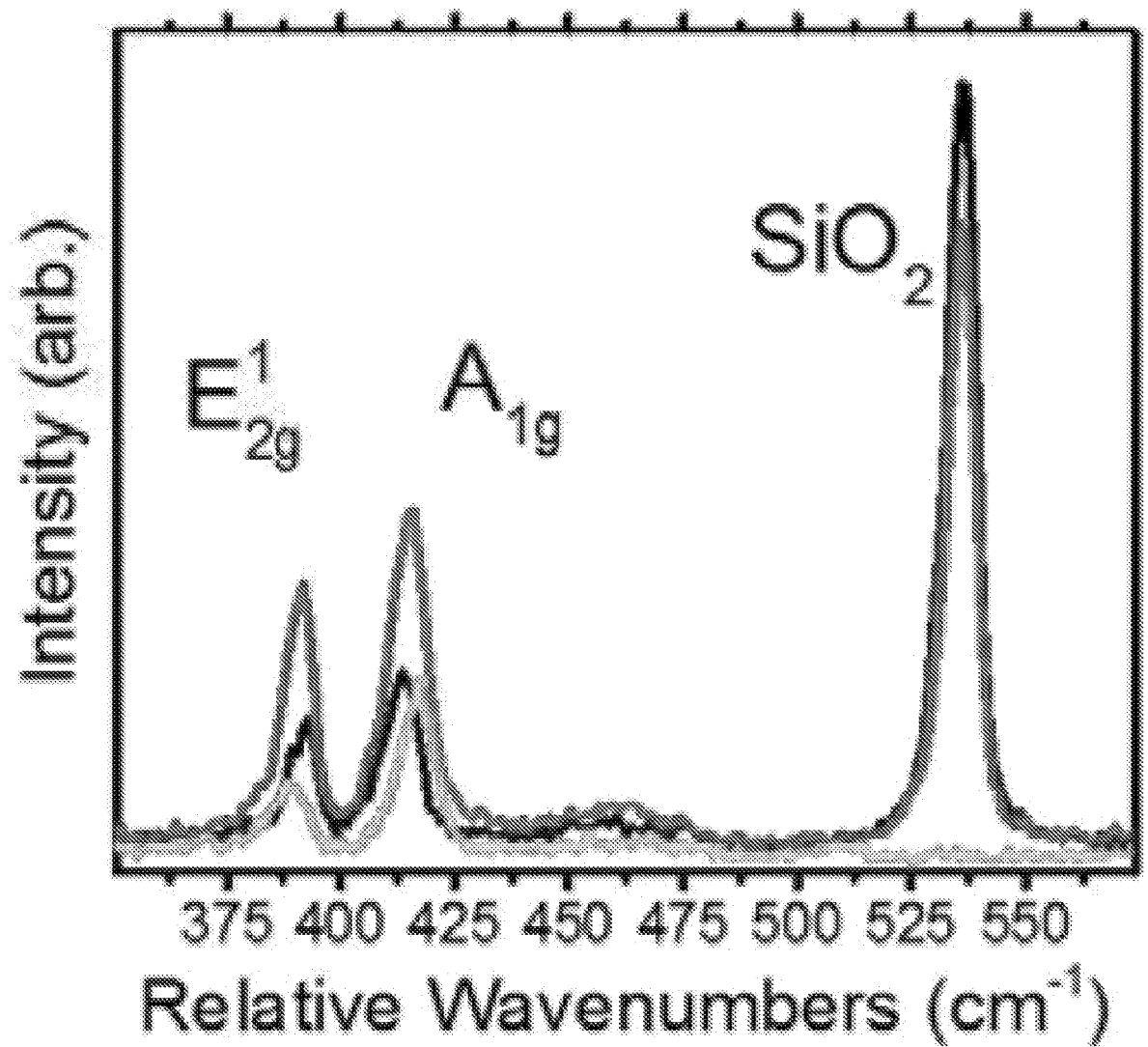
Figure 2F:
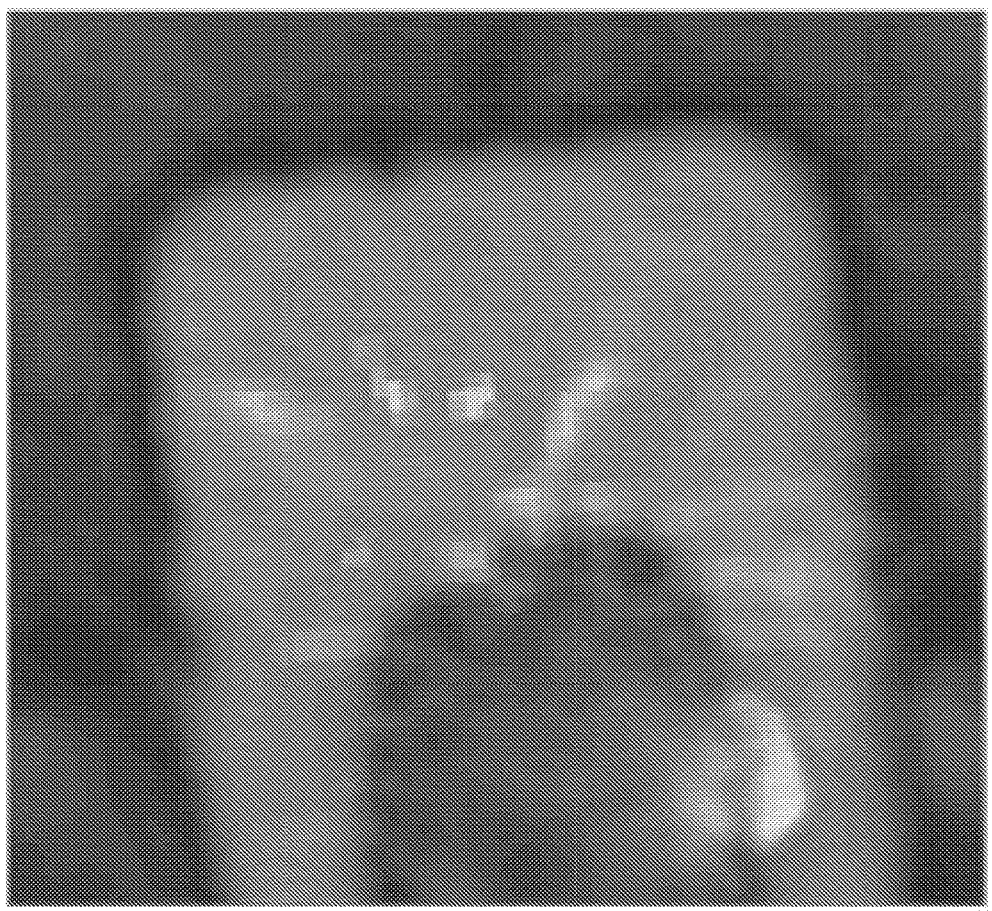
FIG. 2F shows polarization resolved second harmonic generation (SHG) imaging indicating crystalline grains on the order of a few microns. The SHG intensity is seen to alternate between the two polarizer angles, 10° (red) and 40° (blue), indicating orthogonal crystal domains.
Figure 3A:
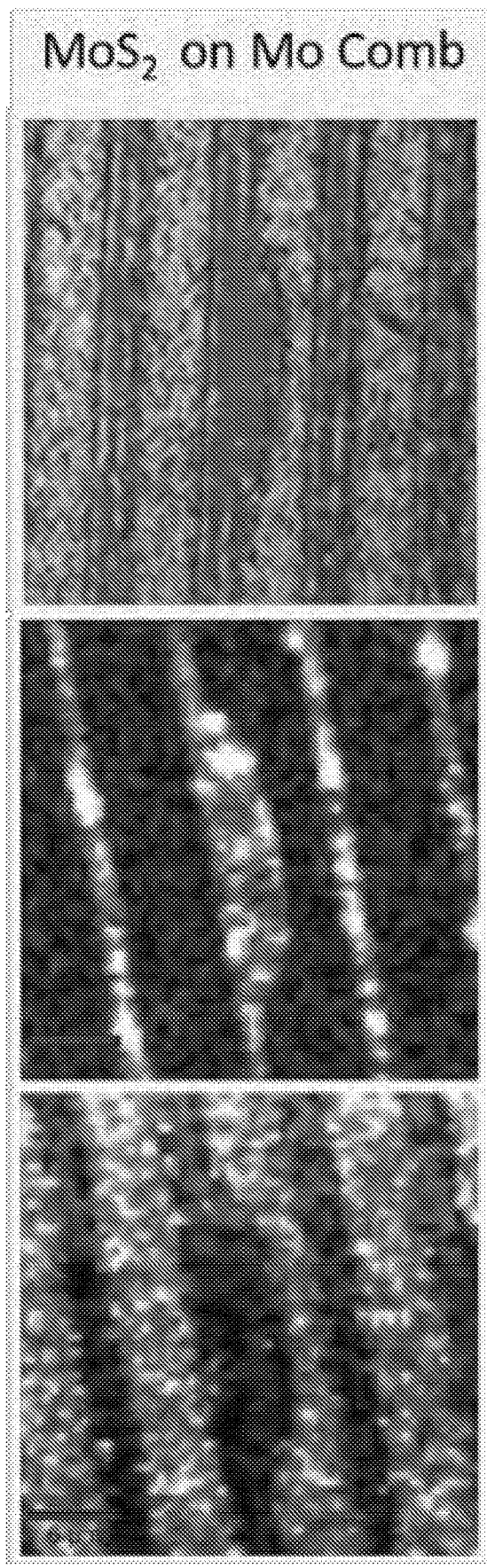
FIGS. 3A-3D: Series of TMD film growths on metaillic features, shown by (from top to bottom) optical, PL, and Raman images of TMD film formation on two types of sputtered metallic patterns (molybdenum and tungsten). In all four growths, luminescent TMD film growth is observed. Growth on titanium patterns resulted in no detectable PL or Raman signatures of TMD material. Cross species growths ($MoS_2$ on W and $WS_2$ on Mo) showed evidence of hybrid, $MoS_2/WS_2$, material formation.
Figure 3B:
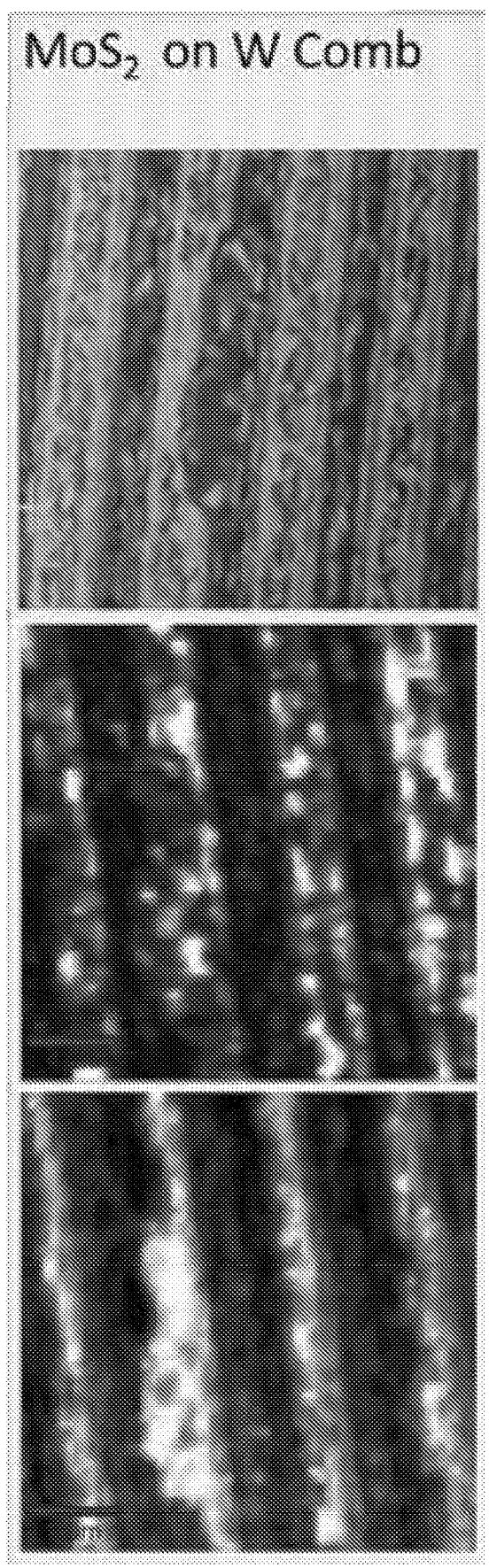
Figure 3C:
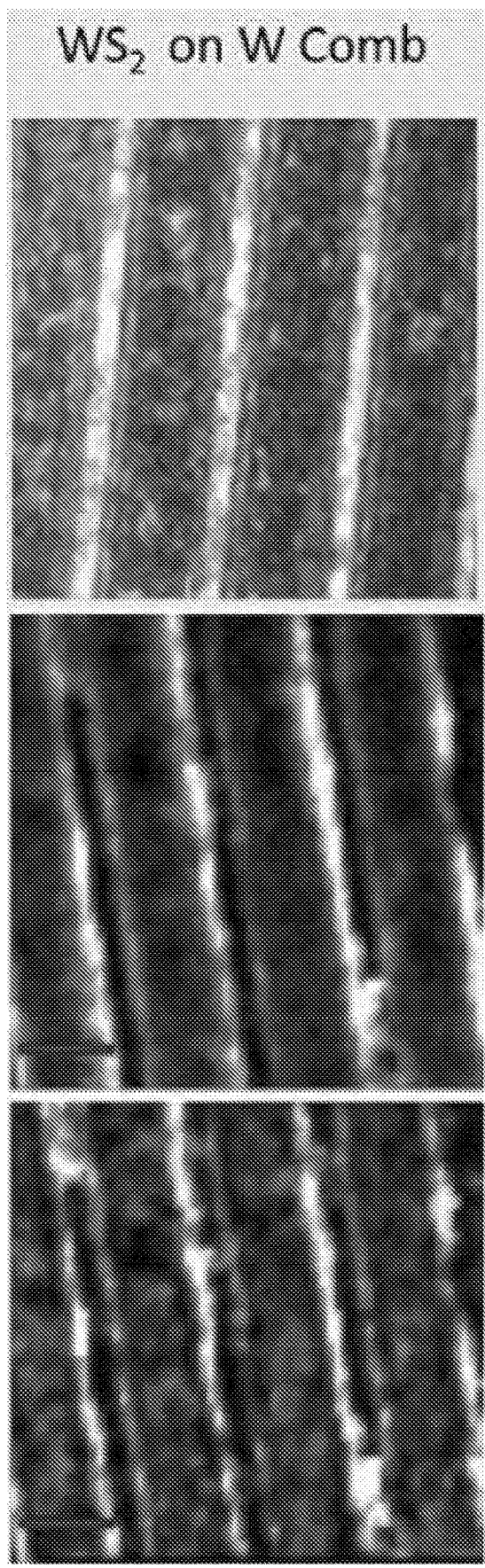
Figure 3D:
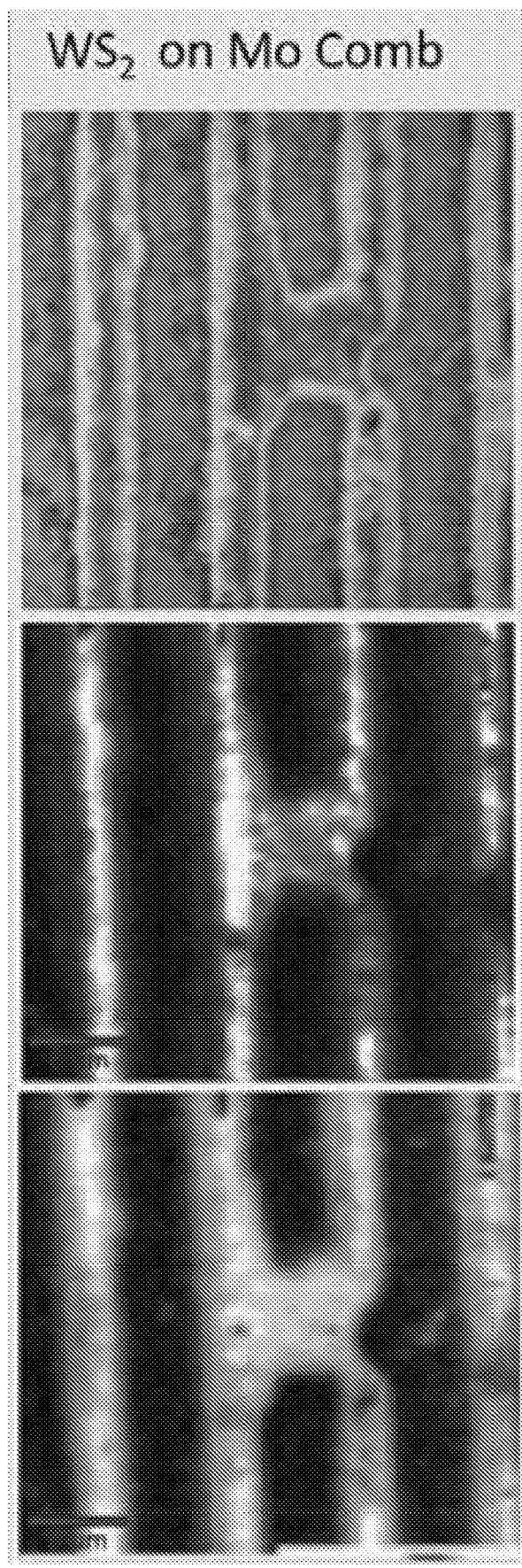
Figure 4A:
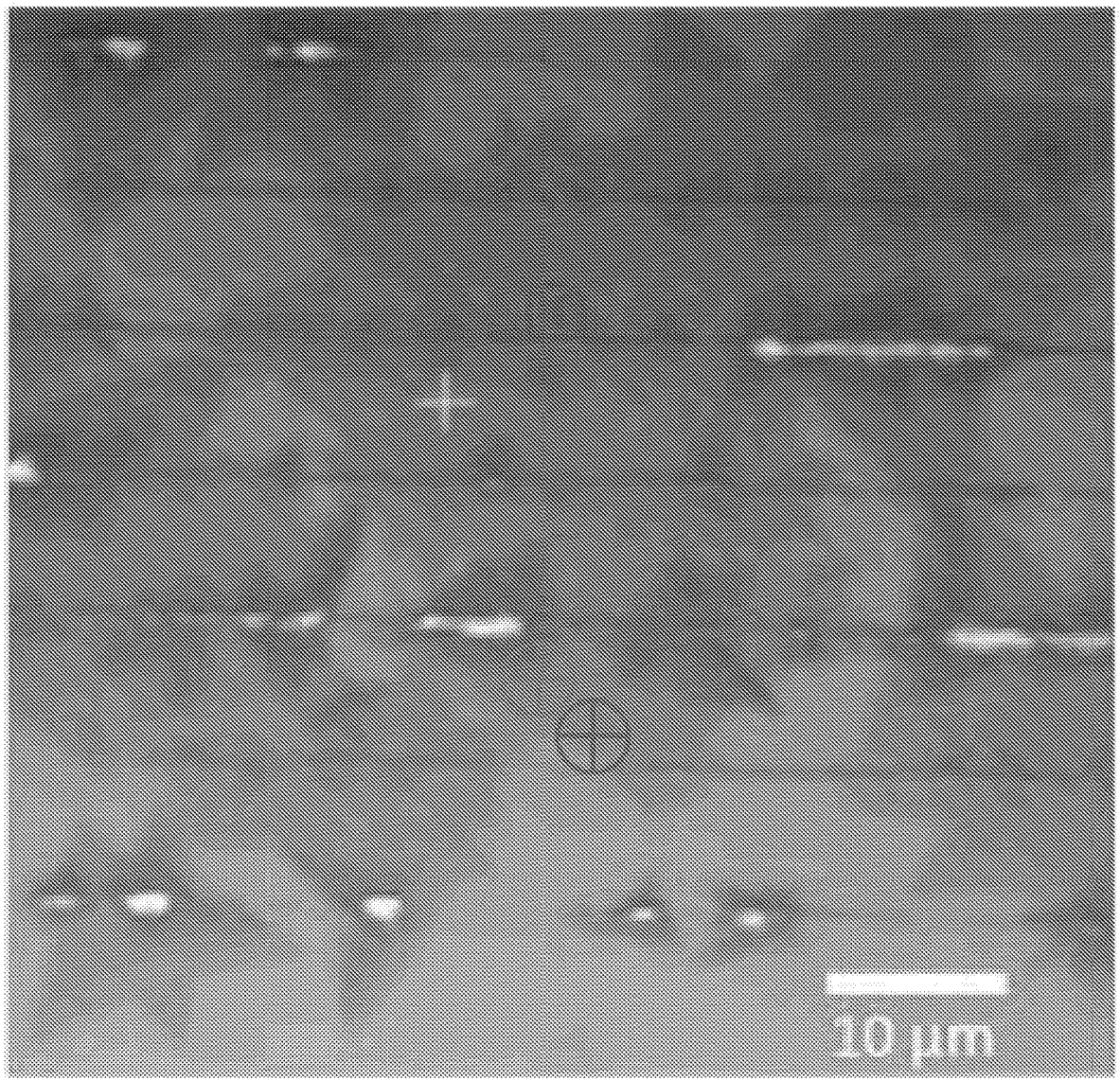
FIGS. 4A-4F: Hybrid $MoS_2/WS_2$ material grown on thin tungsten metallic lines.
Figure 4B:
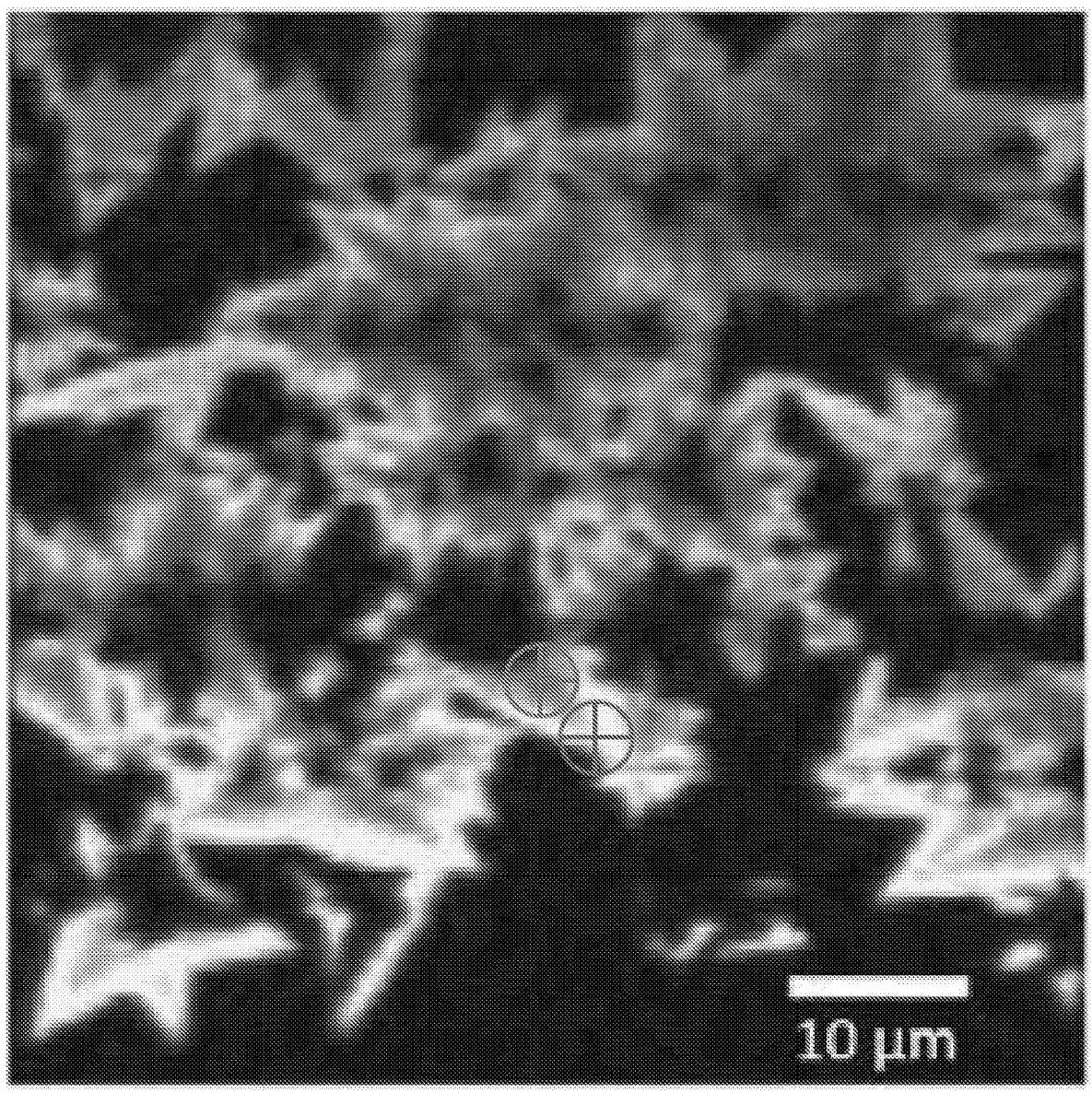
Figure 4C:
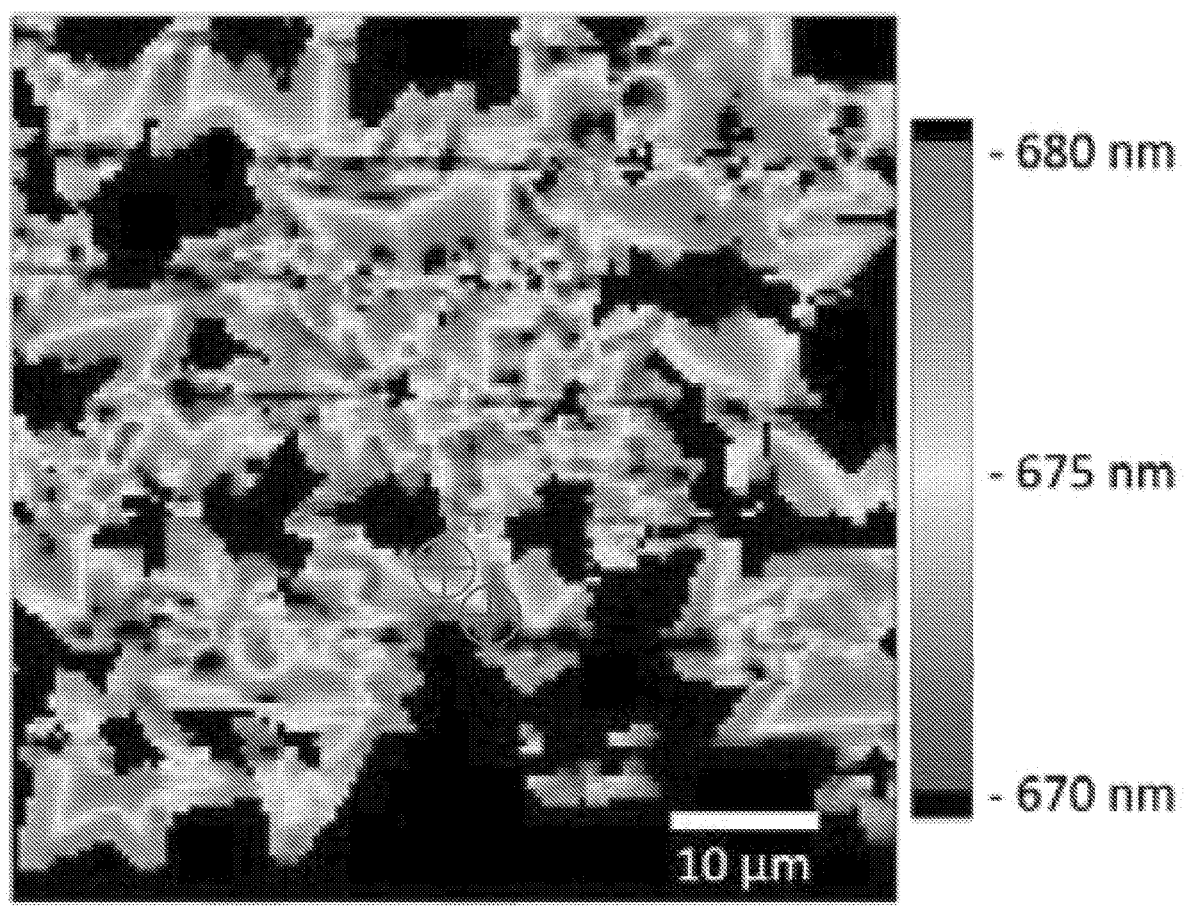
Figure 4D:
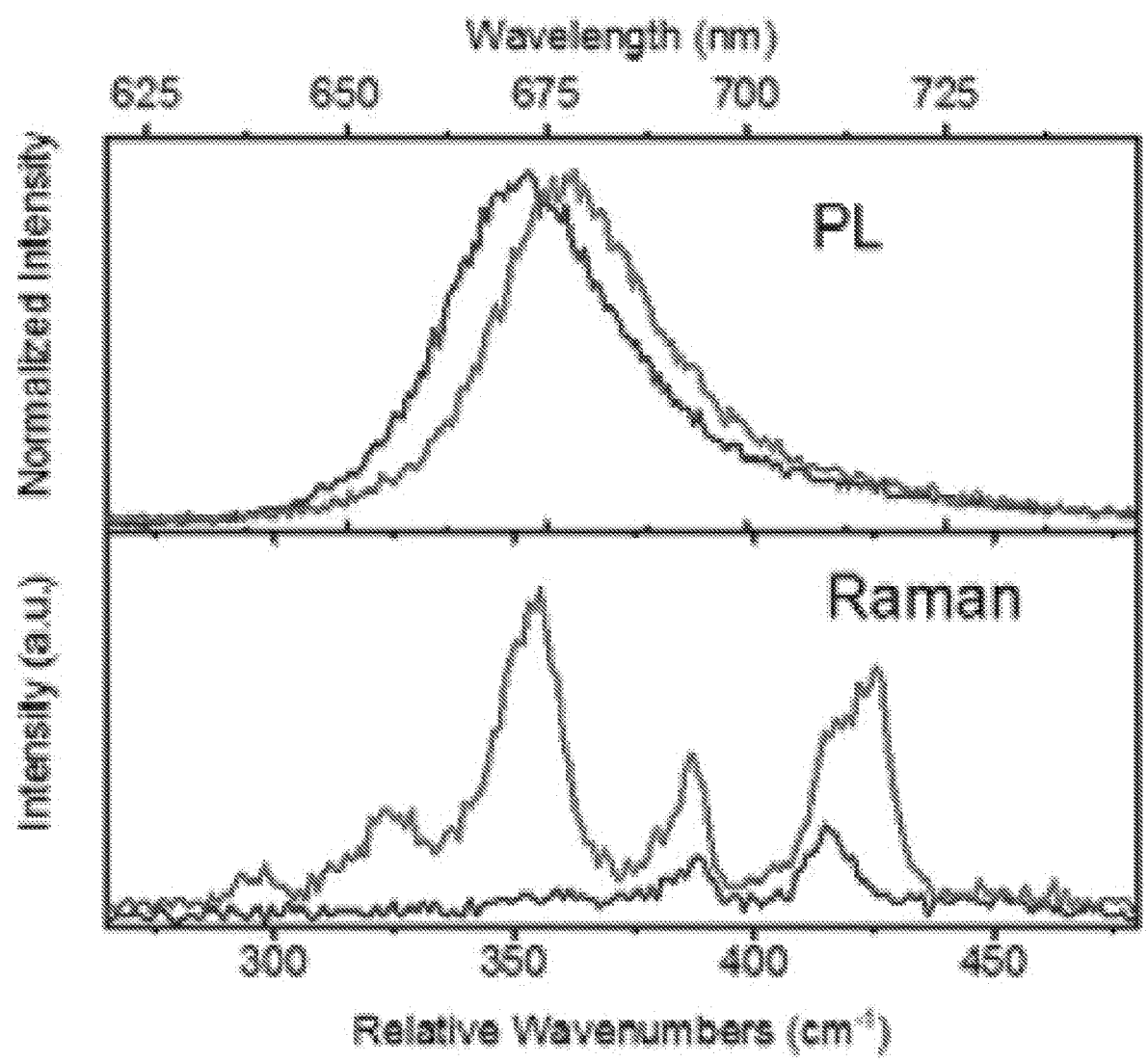
Figure 4E:
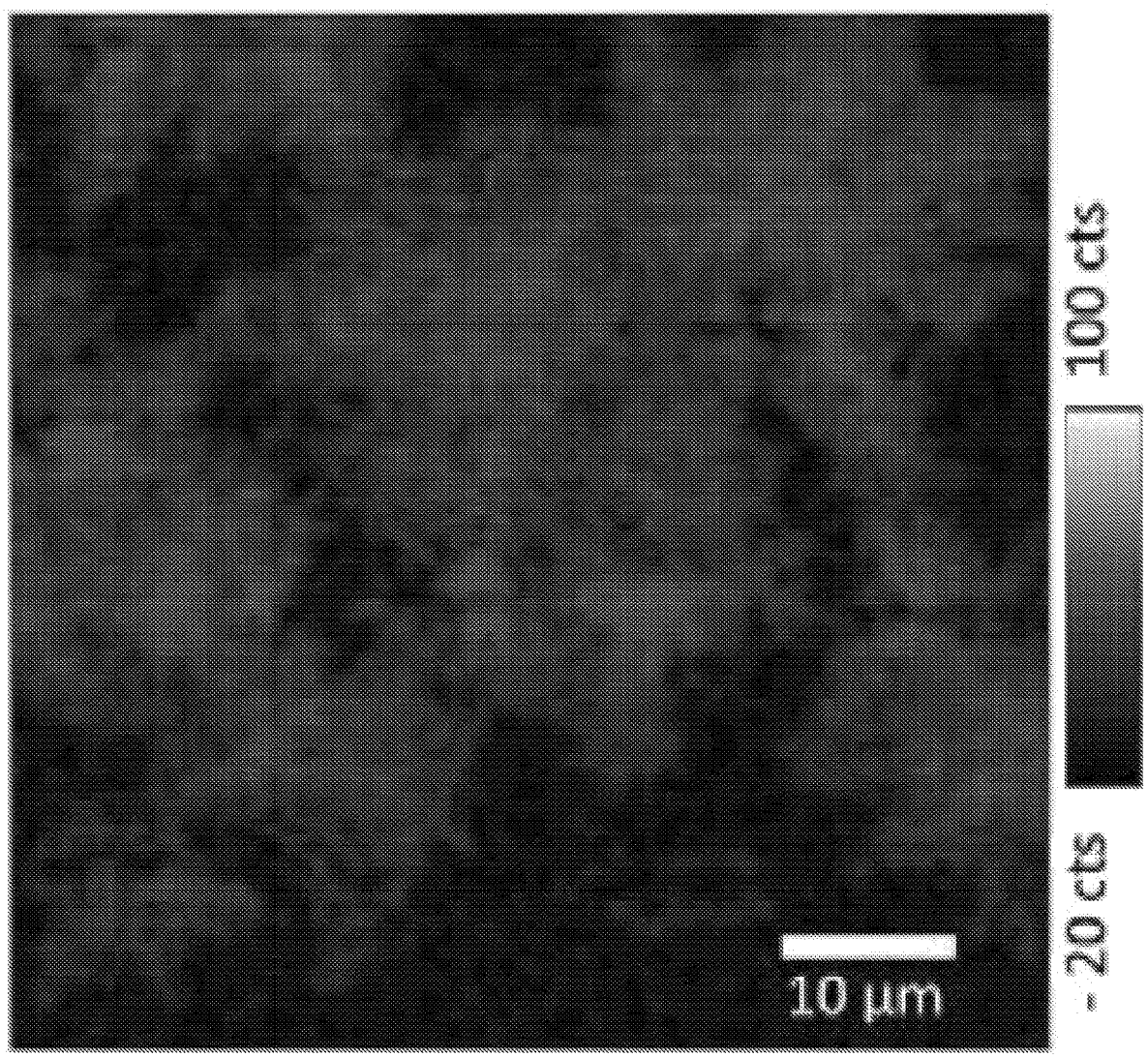
Figure 4F:
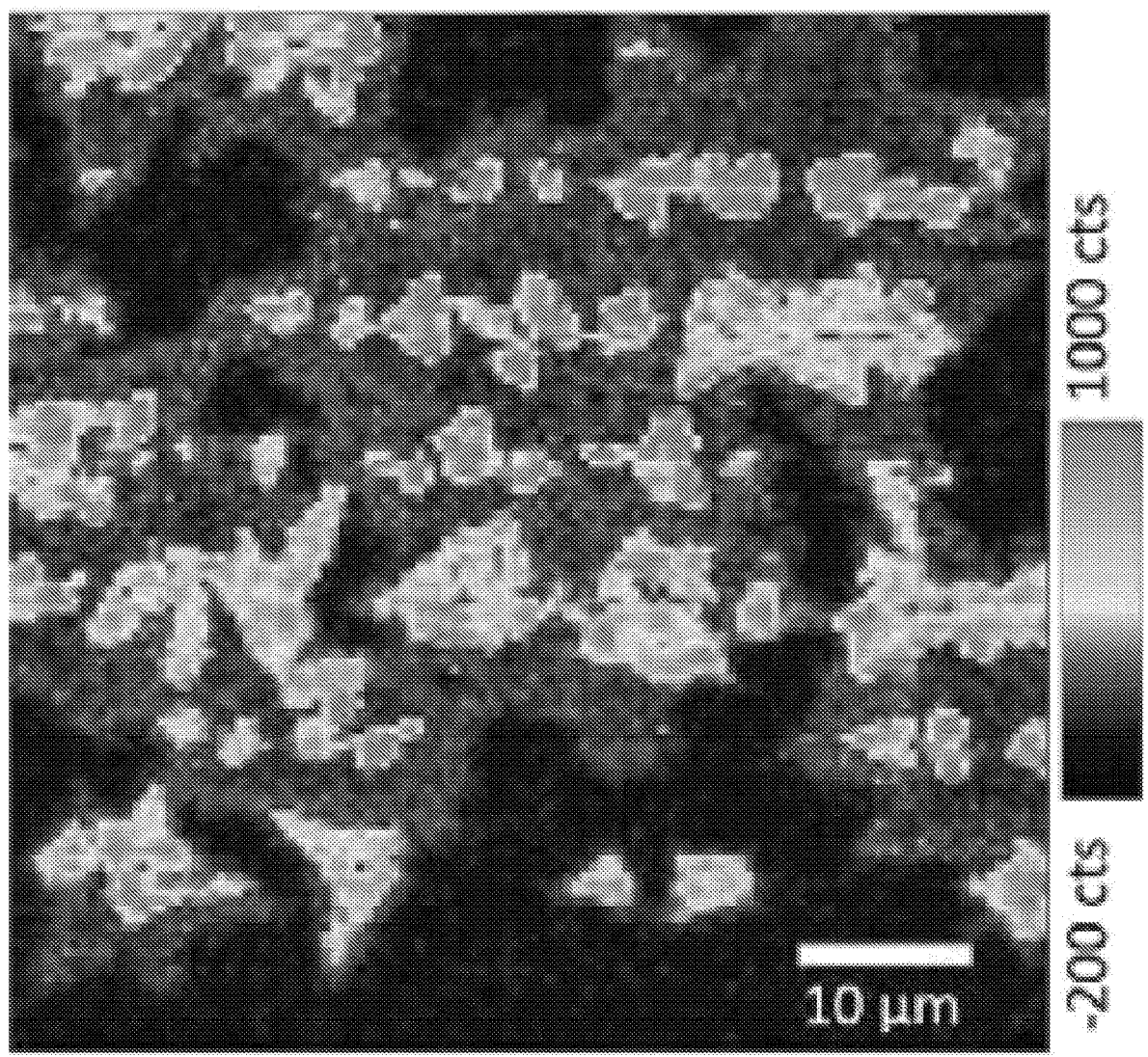

The inset in FIG. 1A shows an example four-probe structure of molybdenum on an $Si/SiO_2$ substrate where the Mo thickness was approximately 100 nm before growth. The metal patterns were sulfurized in the presence of $MoO_3$ powder at 780° C. for 15 mins in a continuous flow of Argon gas. As seen in FIG. 1A, there is a continuous and uniform film growth around the metallic pattern. The width of the film is approximately 20 μm around the entire 58 mm perimeter of the device. A representative area of the film, highlighted by the red square in FIG. 1A, is analyzed in detail in FIGS. 1B-1E. The general characteristic of the film is a continuous monolayer with outgrowths of multi-layer material near the metallic pattern. The optical image, FIG. 1B, and photoluminescence (PL) spectra, FIG. 1D, show good quality material and emission, comparable to typical exfoliated material. Atomic force microscopy, FIG. 1C, and Raman spectroscopy, FIG. 1E, confirm the mono-to-few layer nature of the growth. From these images it can be seen that near the metal patterns the growth is mostly multi-layer, and as the film extends out, the vast majority is composed of monolayer material. A periodic array of islands is observed in the AFM scan at the edge of the film (FIGS. 1C, 1F). The exact nature of these islands is unknown. In this device pattern, the probe separation is 4 μm. Within the region between the probes, the material was found to be predominantly multi-layer $MoS_2$. A subsequent series of growths was performed to optimize the production of monolayer material within the confined region between metallic features.

To produce monolayer material between metallic features with 4 μm spacing, it was important to reduce both the time and temperature of the growth process. FIG. 2 shows a representative region of $MoS_2$ grown on Mo patterns at 600° C. for 5 minutes where a continuous monolayer region can be found between the metallic patterns. The detailed optical analysis reported in FIG. 2 shows characteristic monolayer photoluminescence and Raman signatures and is representative of the patterned region as a whole. Polarization-resolved second harmonic generation imaging of the region indicates that the material is polycrystalline with grain sizes on the order of a micron or less. An added benefit of the reduced substrate temperature is the reduced sulfurization of the sputtered metallic patterns. When the samples were subjected to 780° C. it was found that the metal patterns would completely sulfurize and no longer be conductive, while at the lower temperature only a thin layer of the metal would sulfurize, which could be easily removed, revealing clean and highly conductive material underneath. Though this generation of patterned devices is not sufficient to perform precision electrical characterization, preliminary basic conductivity measurements indicate Ohmic behavior of the devices with as-grown TMD material. This indicates this growth process is a scalable method for producing device structures with deterministic contacts to the material.

To investigate the role of the sputtered metal species on the growth of $MoS_2$ and $WS_2$, patterns of molybdenum, tungsten, and titanium were deposited together on a pair of substrates. The substrates were then placed in the CVD furnace and subjected to identical procedures in the presence of $MoO_3$ and $WO_2$ powder. The results, shown in FIG. 3, indicate that the type of metal deposited is an important parameter in the formation of the TMD films. For the titanium patterns, as well as a platinum pattern done separately, there was no evidence of either species of TMD, indicating that the metal pattern serves not only as a nucleation site for the initiation of the film, but acts as a feedstock for initial and/or continued growth. To confirm this, a set of samples was grown without oxide precursors, and it was found that direct sulfurization of the metallic pattern also resulted in monolayer TMD formation around the patterns. A major difference between direct sulfurization and sulfurization in the presence of an oxide precursor is the lateral extent of the growth. Direct sulfurization appears to result in self-limited lateral films determined by the geometry of the initial metal pattern, whereas, with oxide precursors present, the growth may continue, fed by the precursor material. This also indicates that nucleation depends on not only topological features, but also on the chemical and materials properties of the deposited patterns. This is supported by the observation of lateral heterostructure formation in the cross species growth. For example, $MoS_2$ grown on tungsten patterns shows a hybridization of the $MoS_2$ and $WS_2$ Raman features as well as a red shift in the PL emission with increasing $WS_2$ (FIG. 4). This indicates that complex multifunctional heterostructured materials are produced through the use of mixed types of metallic patterns and transition metal/chalcogenide precursors.

The size, both laterally and vertically, of the initial metallic patterns, was also found to affect the TMD formation. For growth on sub-micron metallic lines, TMD formation appears to be highly crystalline with large regions of monolayer material spanning tens to hundreds of microns. Again, the fact that the thin metallic patterns remain after growth indicates that, though the pattern may be providing material to feed the growth, it is not entirely consumed, and the dominant supply of material is from the oxide precursor. Occasionally it was found that, after the photoresist removal and sample cleaning procedure, regions of the sputtered metal patterns would appear to be removed. However, patterned growth of high quality monolayer TMD material would often emerge in these regions, indicating that very thin, optically transparent, layers of metal were still present. The film formation is predominantly constrained to the lithographically defined areas. This specificity coupled with the previous observation that small area growth tends to be crystalline can be used to produce wafer sized patterns of single-crystal regions suitable for subsequent device fabrication.

Figure 5A:
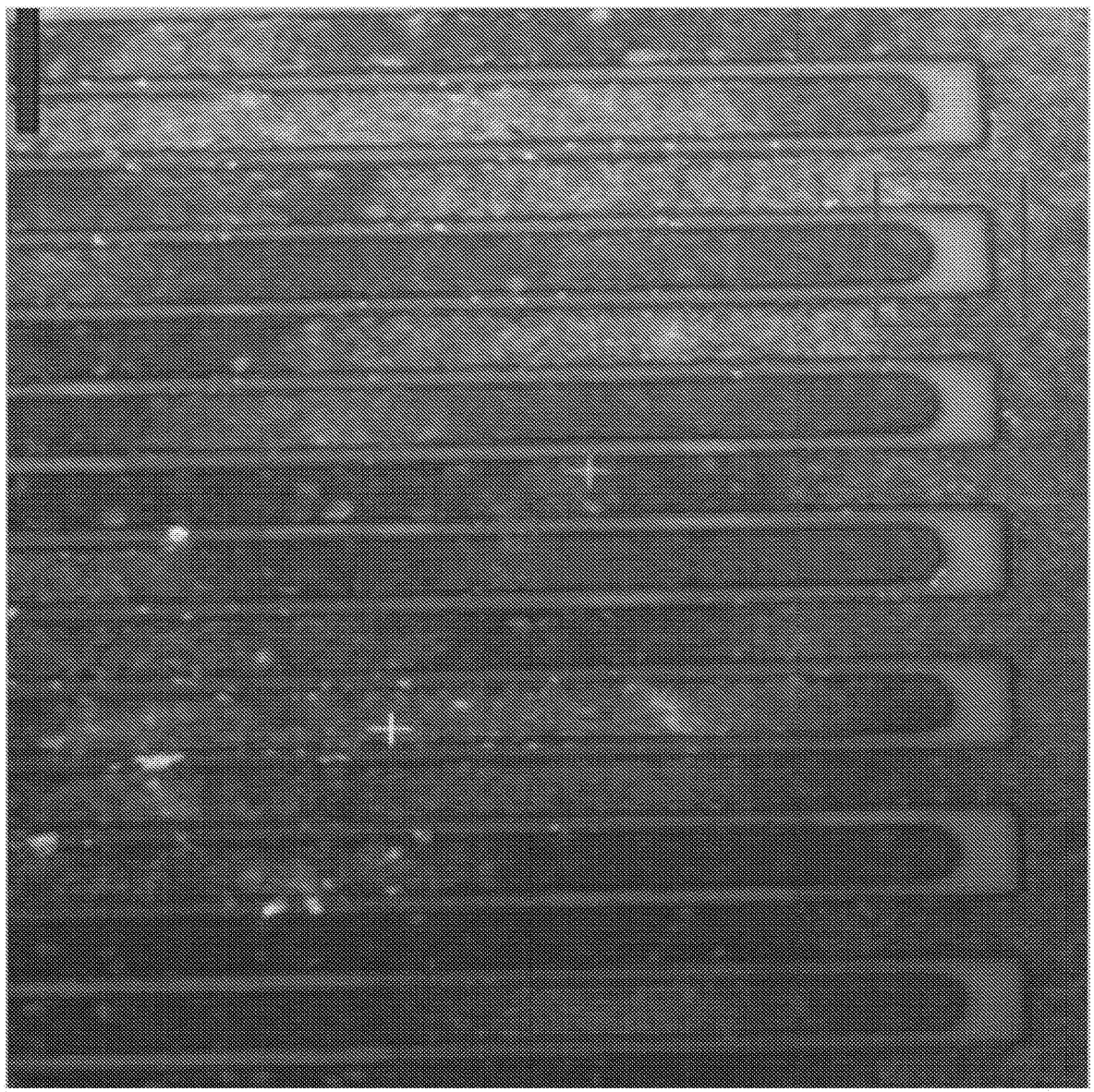
FIGS. 5A-5C: Large area growth of monolayer $MoS_2$ on Mo patterns, shown by optical (FIG. 5A), PL (FIG. 5B), and Raman (FIG. 5C) images of TMD film formation on a large area pattern of interdigitated molybdenum fingers. The region highlighted by the red square in FIG. 5A is similar to the region studied in detail in FIG. 2.
Figure 5B:
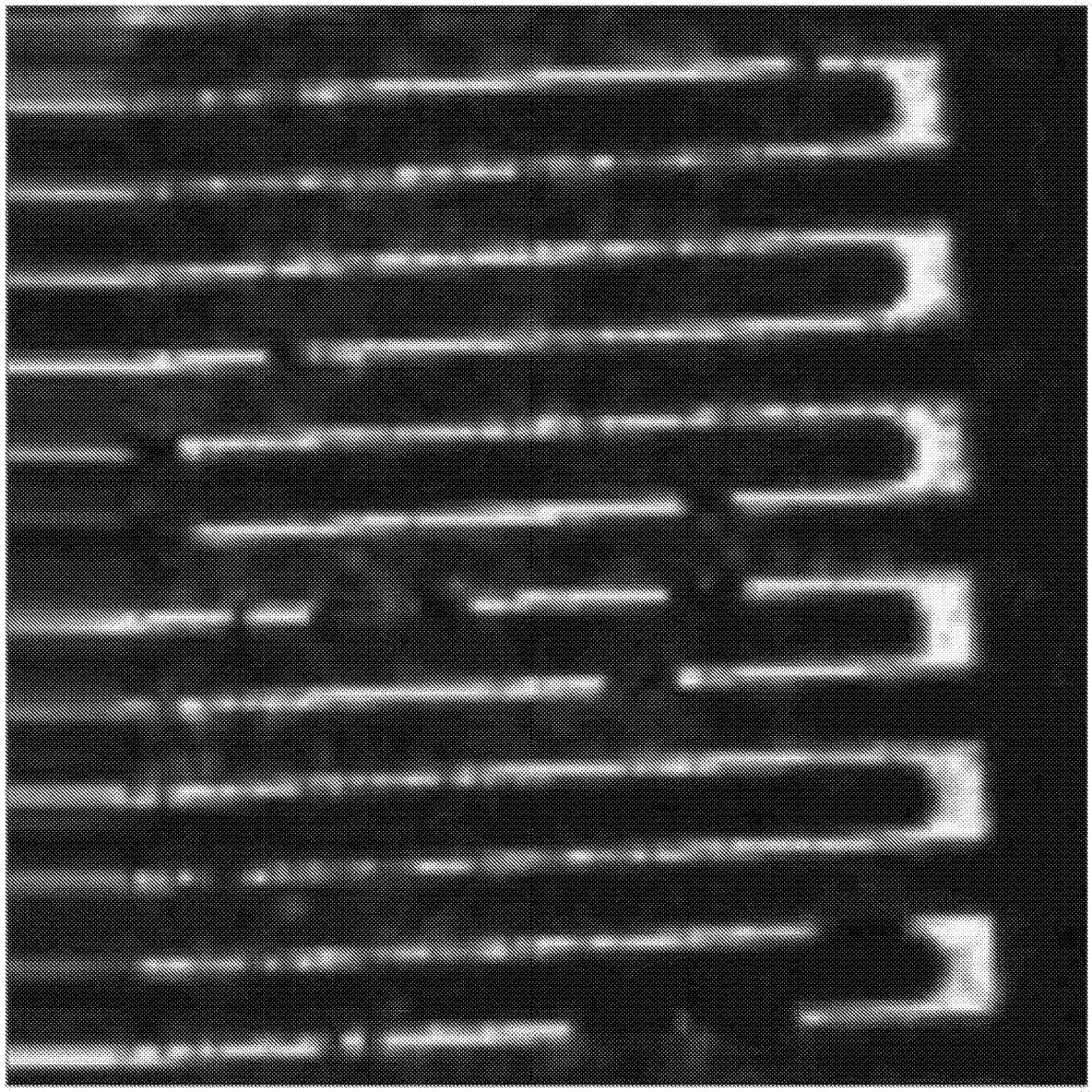
Figure 5C:
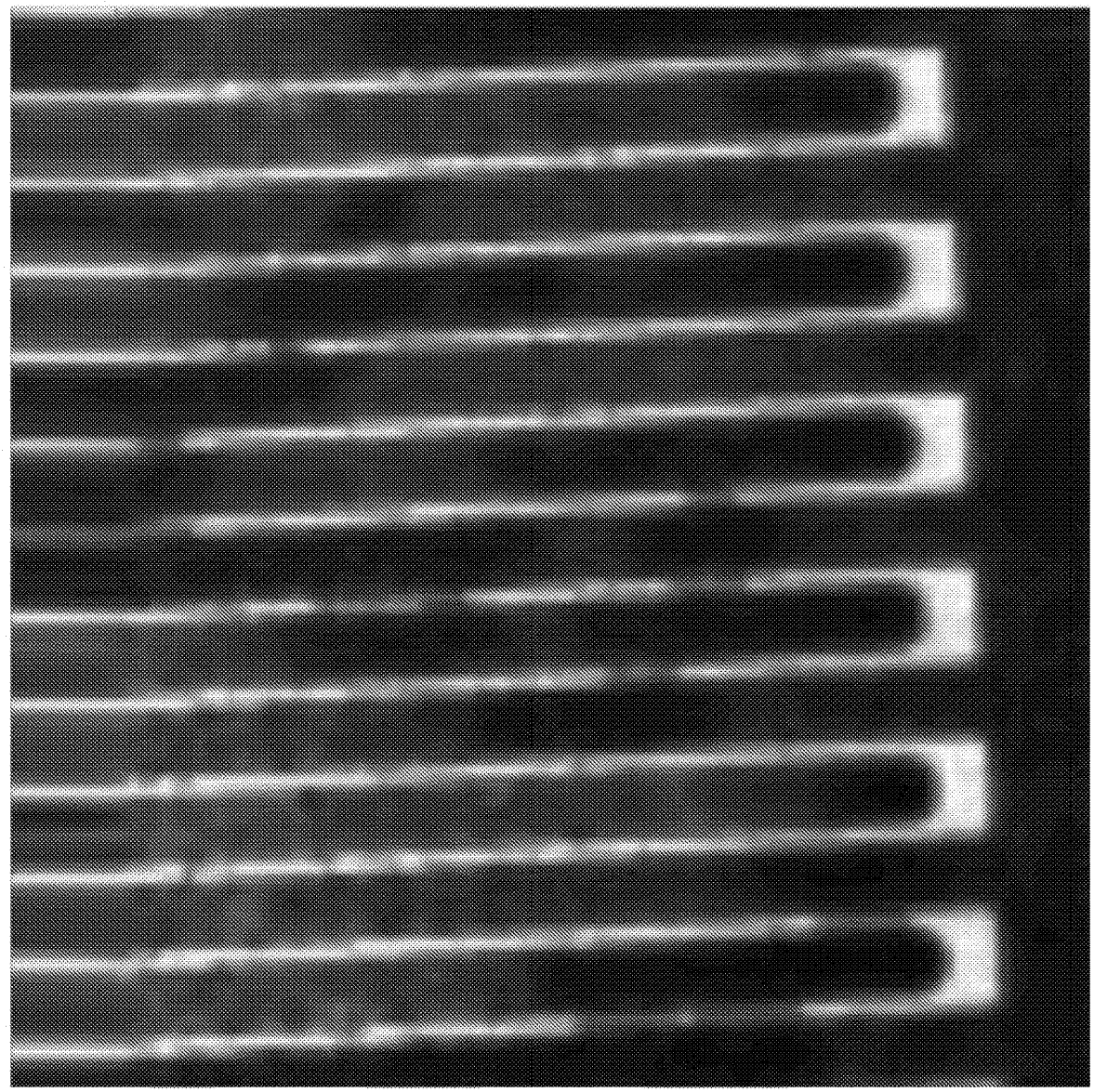

It is important to note that the results presented, for example in FIGS. 2A-2F, are representative of the larger area growth on the sample. FIGS. 5A-5C show a 100-by-100 micron square area of interdigitated molybdenum patterns where highly consistent and uniform monolayer growth is observed. These results indicate that a general procedure of monolayer TMD growth on lithographically defined metallic patterns can be tuned to produce good optical, as well as electronic, quality material over a range of dimensions from nanometers to hundreds of microns. In fact, as the feature sizes reduce, the crystal domains will be on the order of the device, forming the basis of large scale incorporation of monolayer-based TMD materials in opto-electronic device applications. Instead of trying to start with a large area of high quality material and then creating devices by, for example, patterning, contacting, and etching, provided herein is a process whereby material is selectively grown only in deterministically patterned regions. In addition to being relatively straightforward and scalable, this method has other advantages, including as-grown contacts to the material with consistent quality, high crystallinity due to smaller growth area, the ability to easily mix materials, and straightforward incorporation into existing semiconductor device fabrication techniques.

Figure 6A:
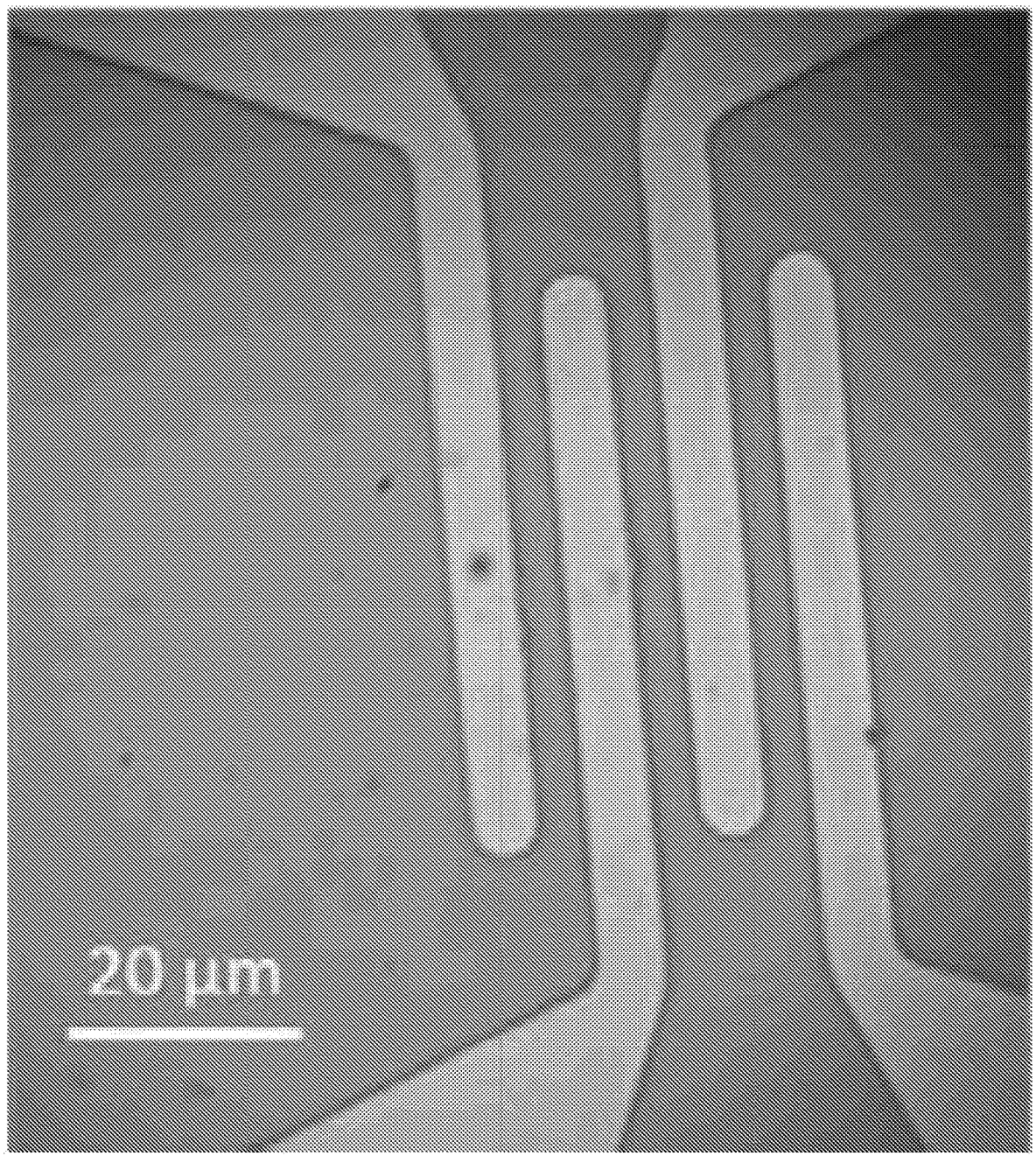
FIGS. 6A-6C: Multi-layer growth in 4-probe sample.
Figure 6B:
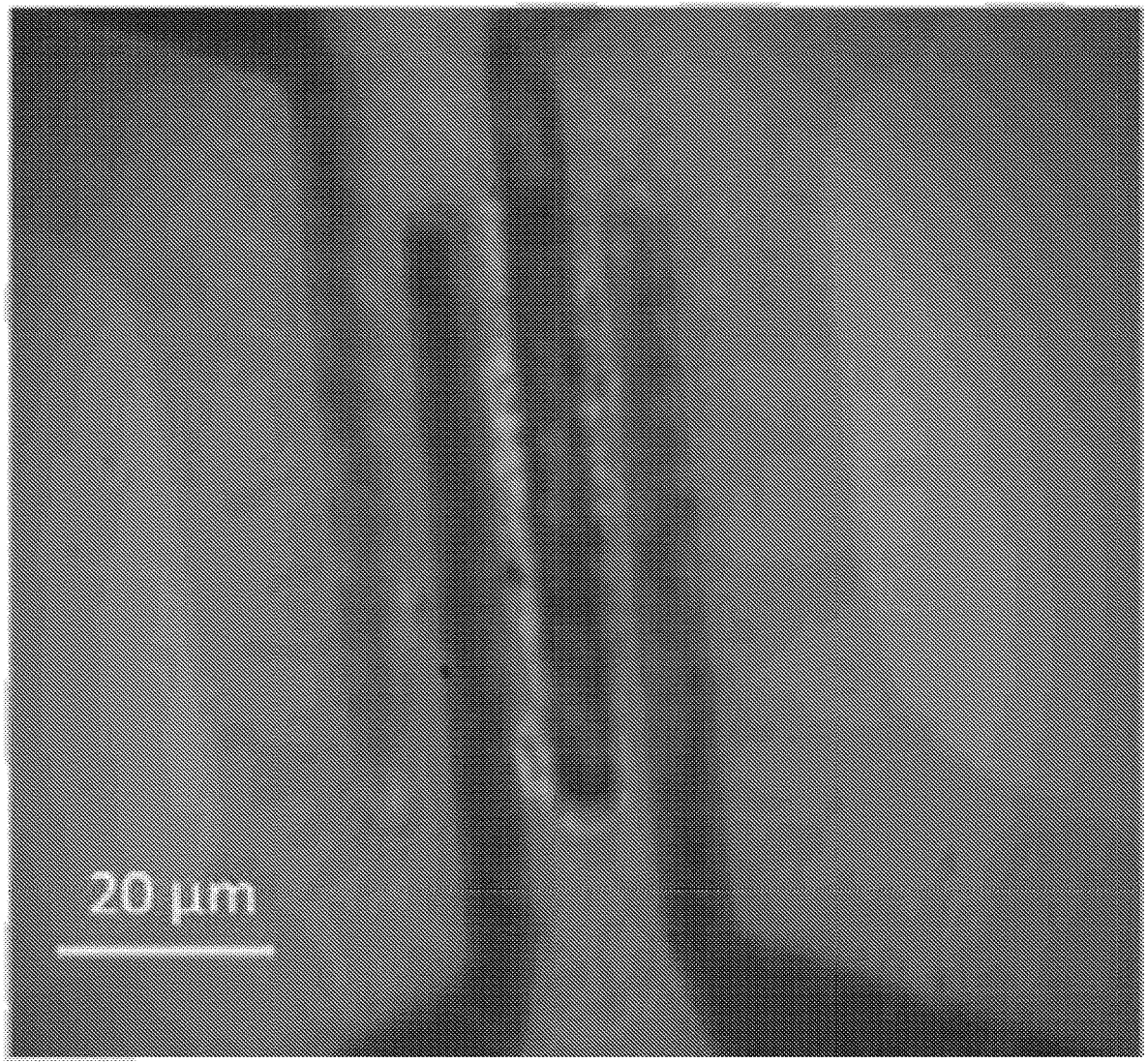
Figure 6C:
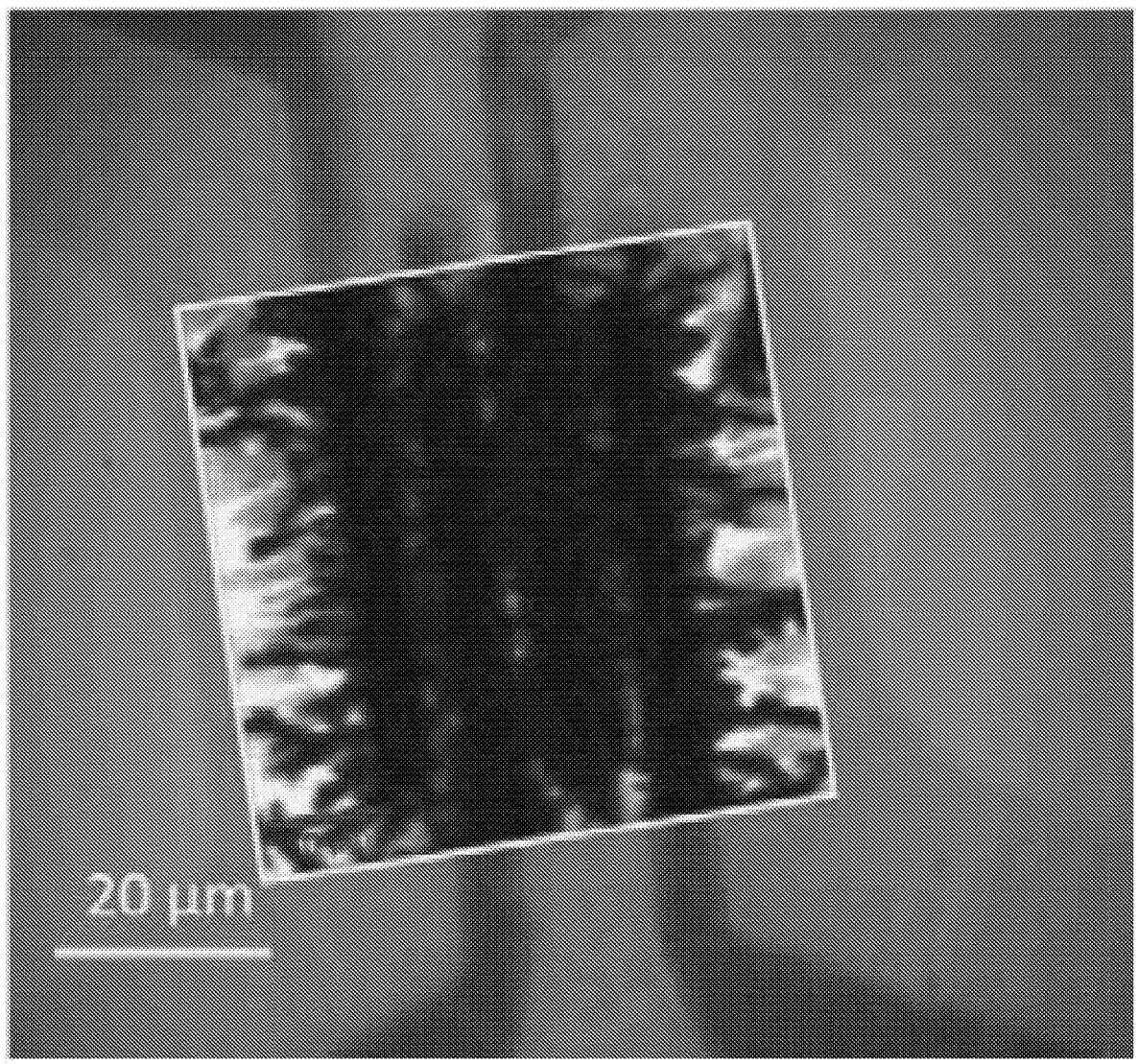

The region (4 μm width) between the probes was found to have predominantly multi-layer material. An image of the probe region is shown in FIG. 6A for comparison. The multi-layer growth is seen in the optical image (FIG. 6B), as well as the PL image (FIG. 6C).

Figure 7:
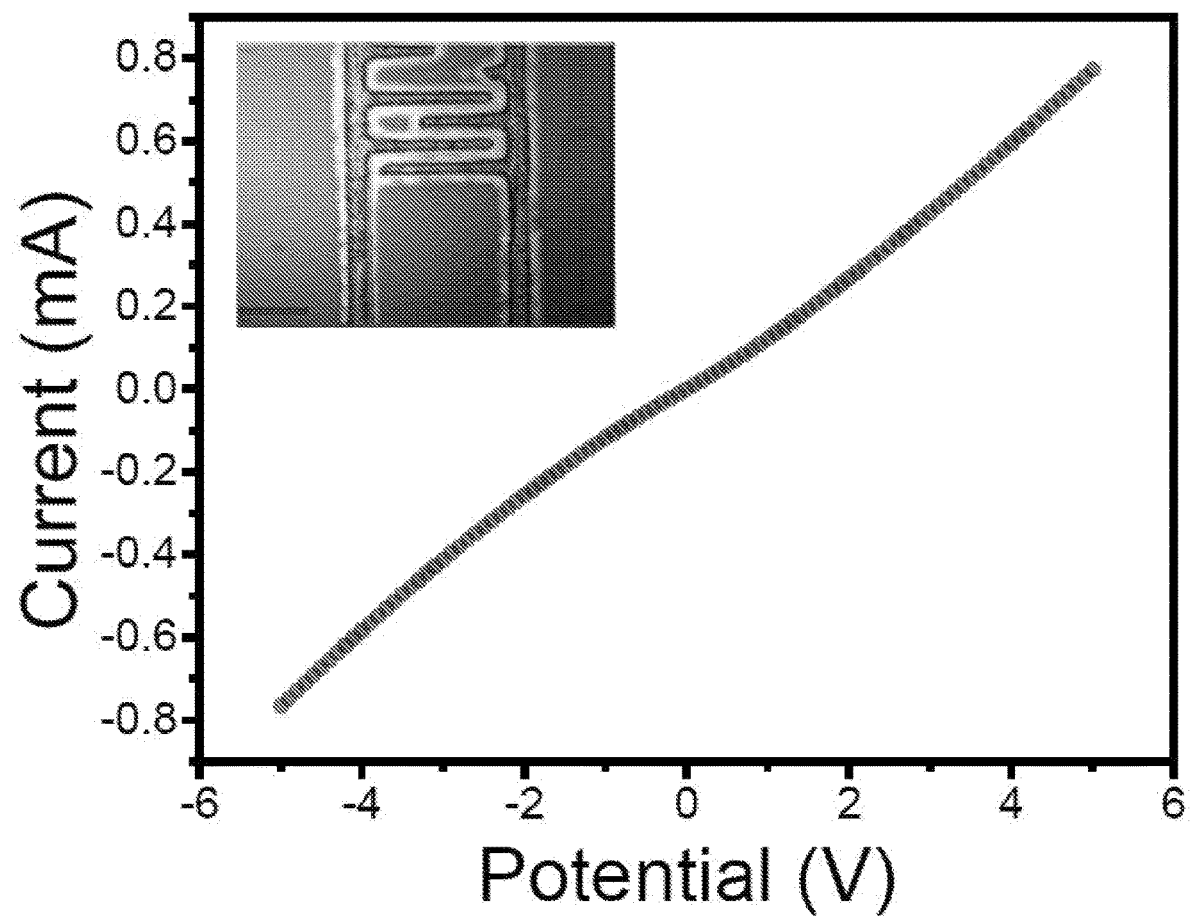
FIG. 7: I-V measurement of an as-grown $WS_2$ sample. The inset is an optical image of the device showing few-to-multi-layer growth of $WS_2$. The I-V curve indicates a small rectifying behavior for lower voltages. A fit to the linear regions gives a total resistance for the device, including conductive epoxy contacts, of ~7 kΩ.

FIG. 7 shows a measurement of a simple I-V curve, using a Keithley model 2400 sourcemeter, for an as-grown $WS_2$ device structure of interdigitated probes. Contact to the device was made using a conductive epoxy. The results shown in FIG. 7 indicate possible Ohmic behavior with a total device resistance of approximately 7 kΩ.

Figure 8A:
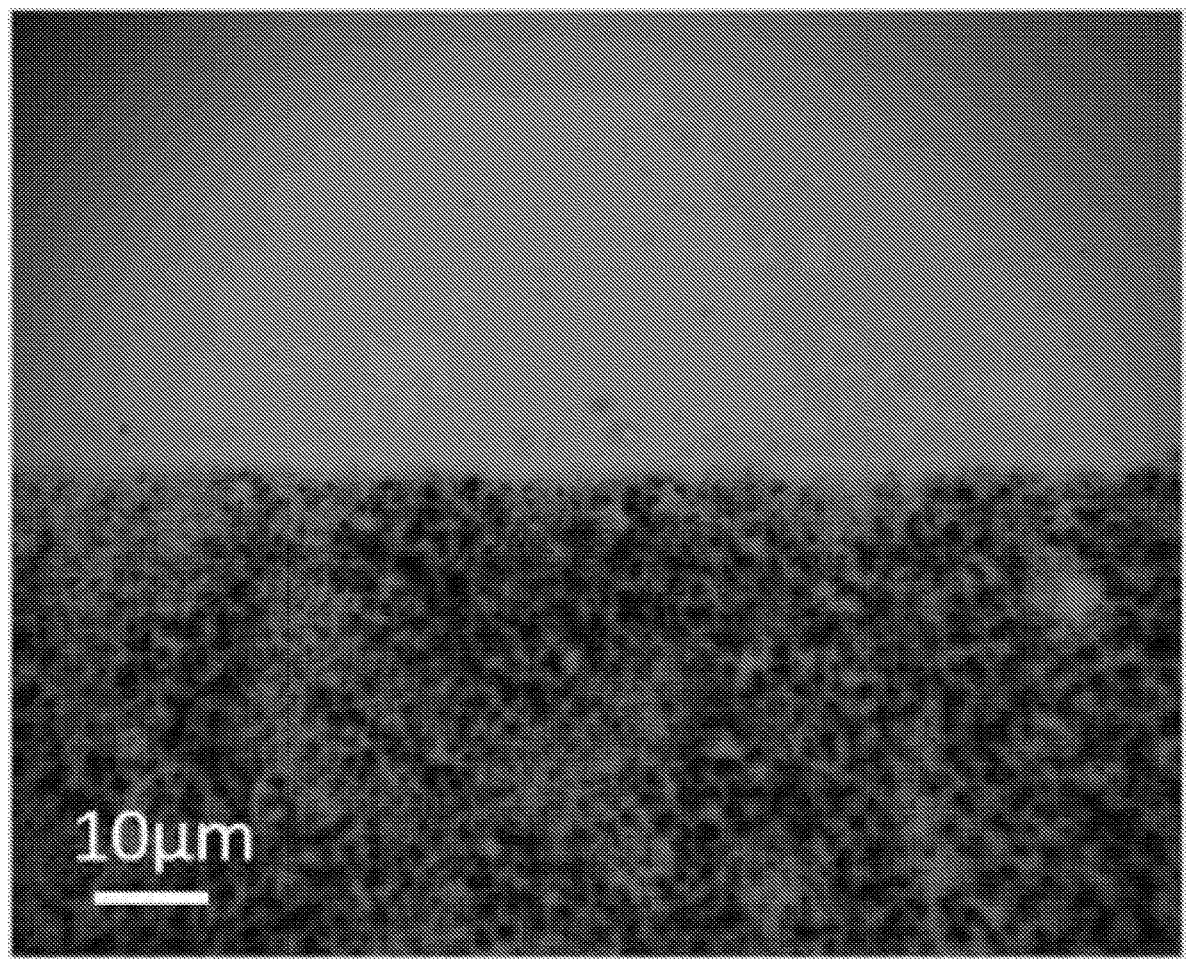
FIGS. 8A-8C: Direct sulfurization of molybdenum patterns, showing temperature-dependent sulfurization of a molybdenum metallic pattern. Film formation is observed to extend from the pattern for temperatures at or above 600° C.
Figure 8B:
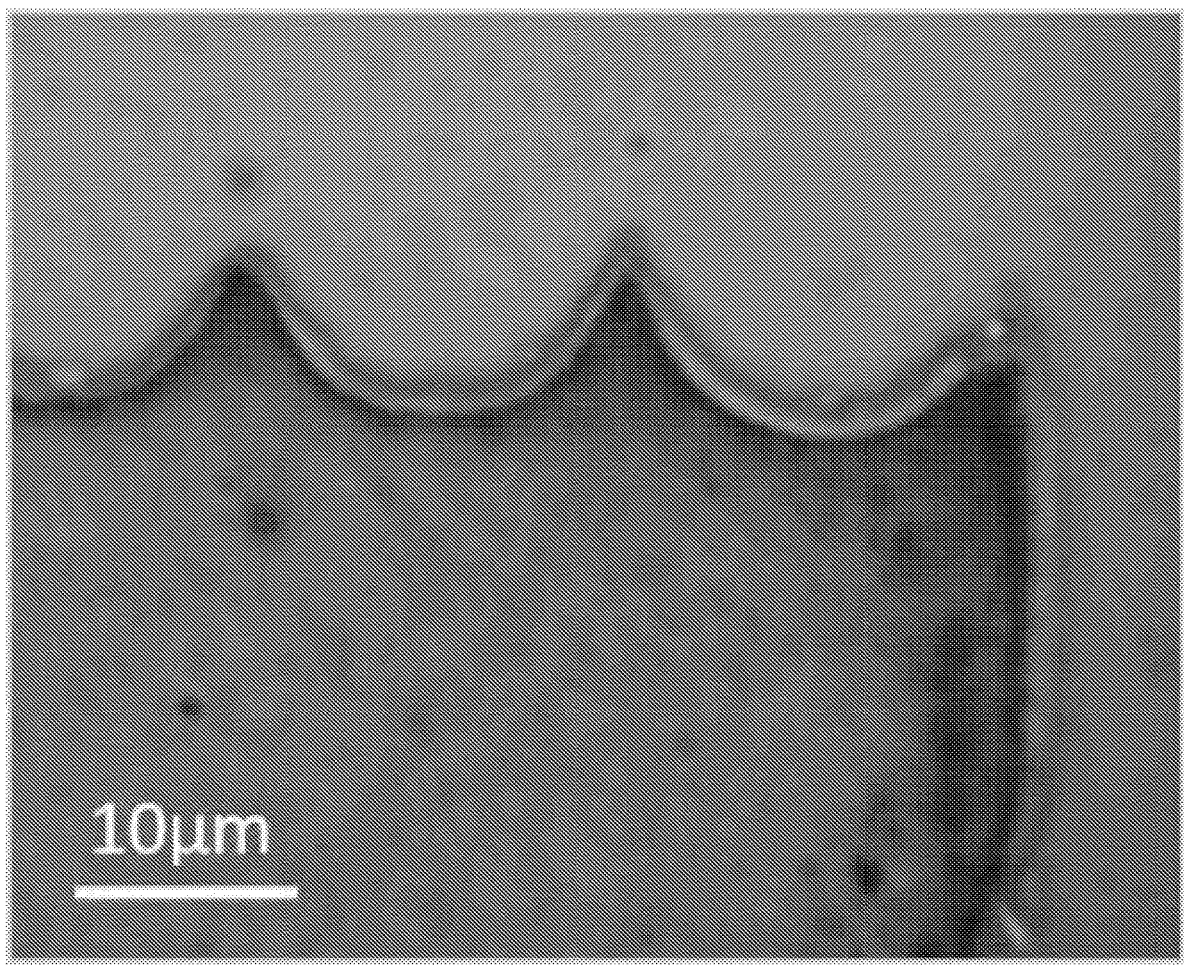
Figure 8C:
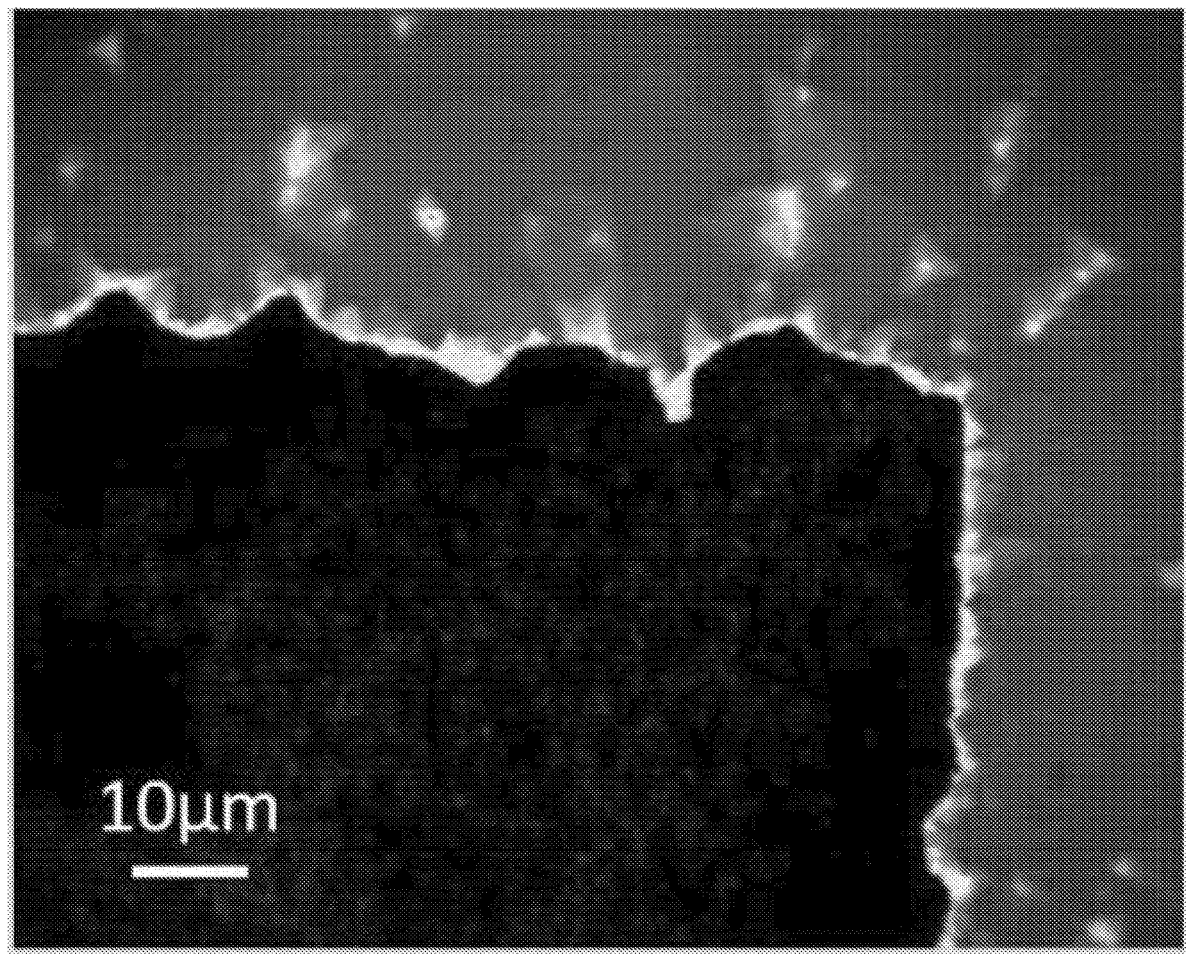
Figure 9A:
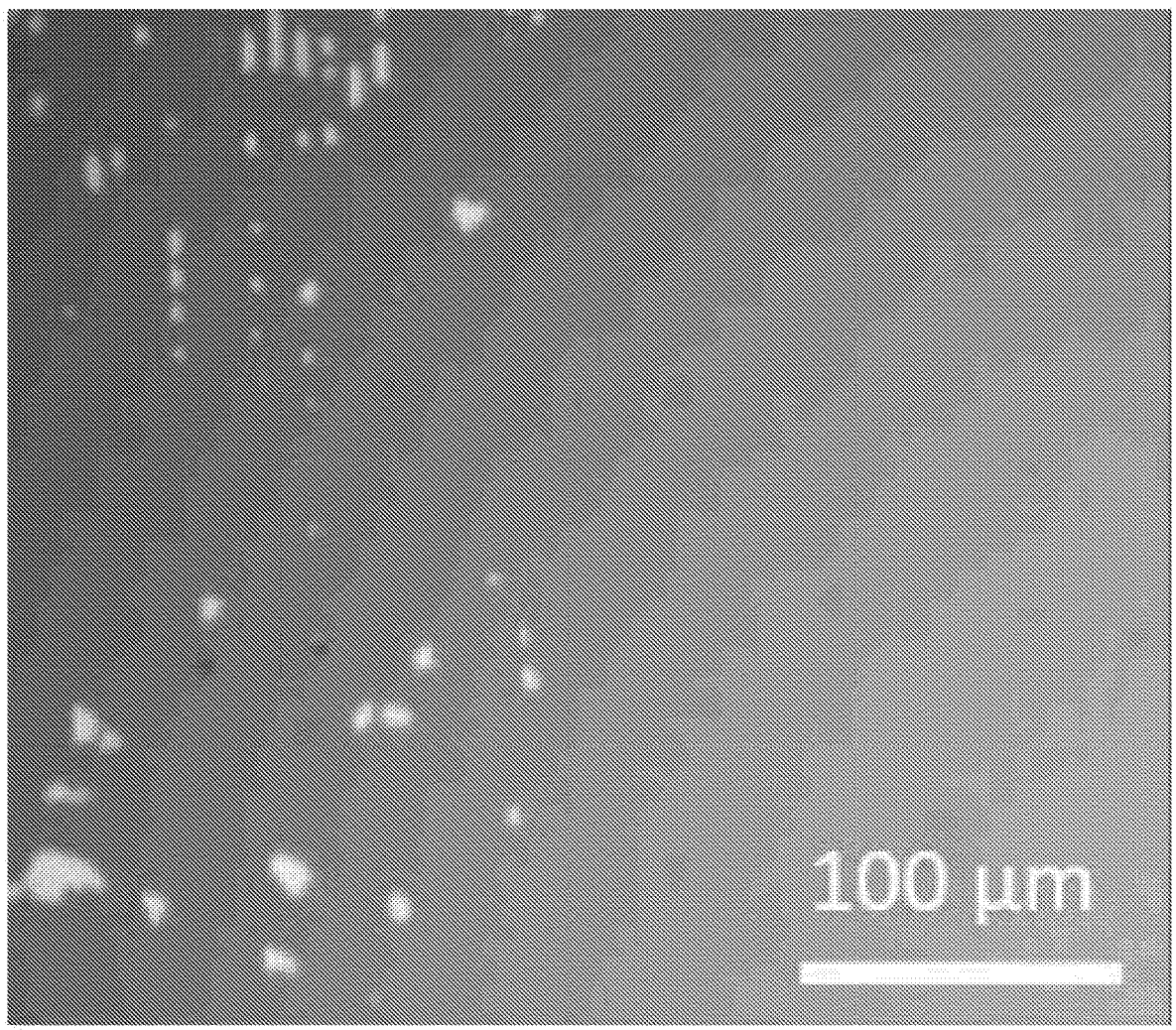
FIGS. 9A-9D: TMD film growth on thin metal films. Film formation on monolayer, optically transparent, sputtered metal is observed. Here the growth is confined to the lithographically defined regions.
Figure 9B:
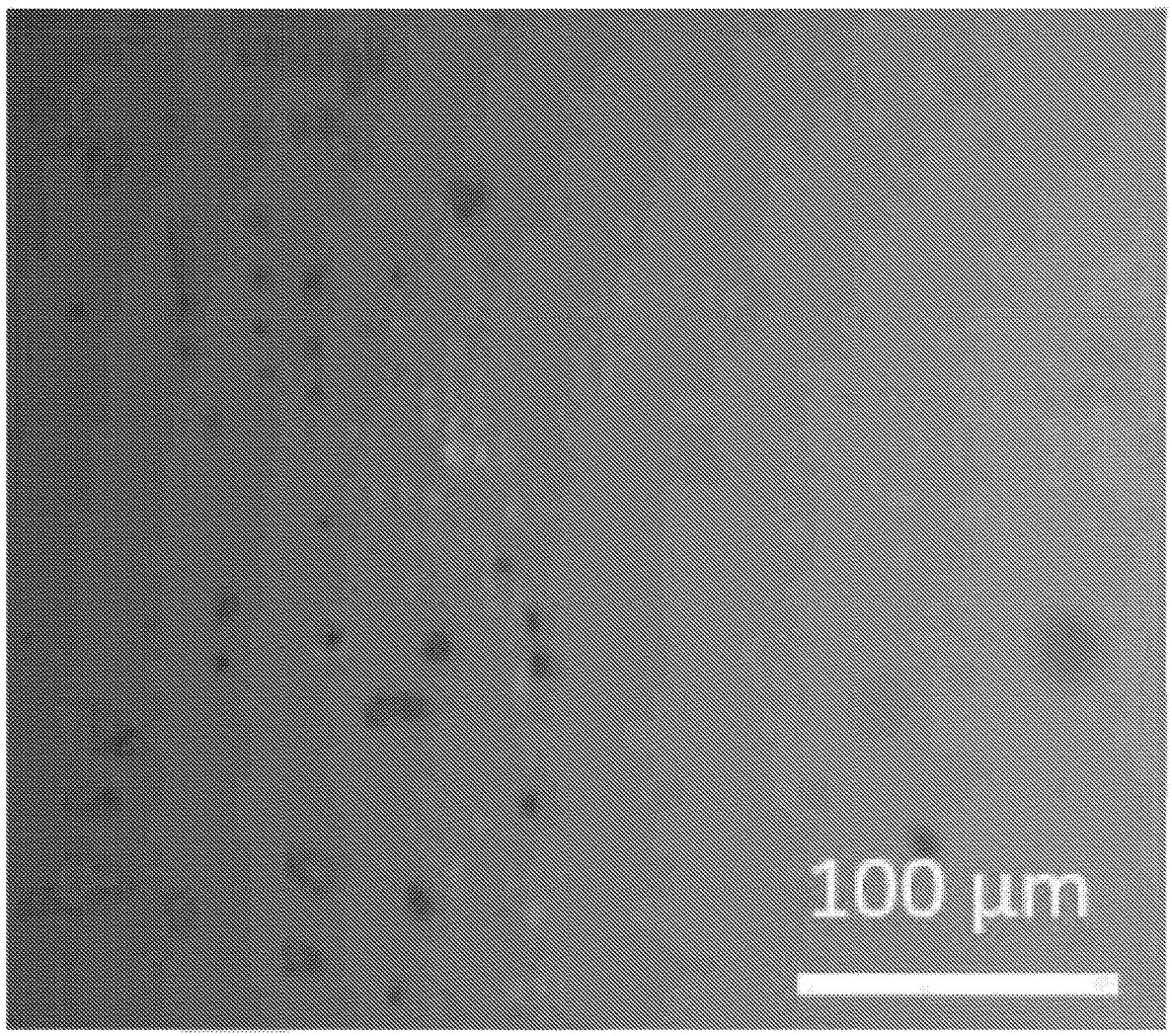
Figure 9C:
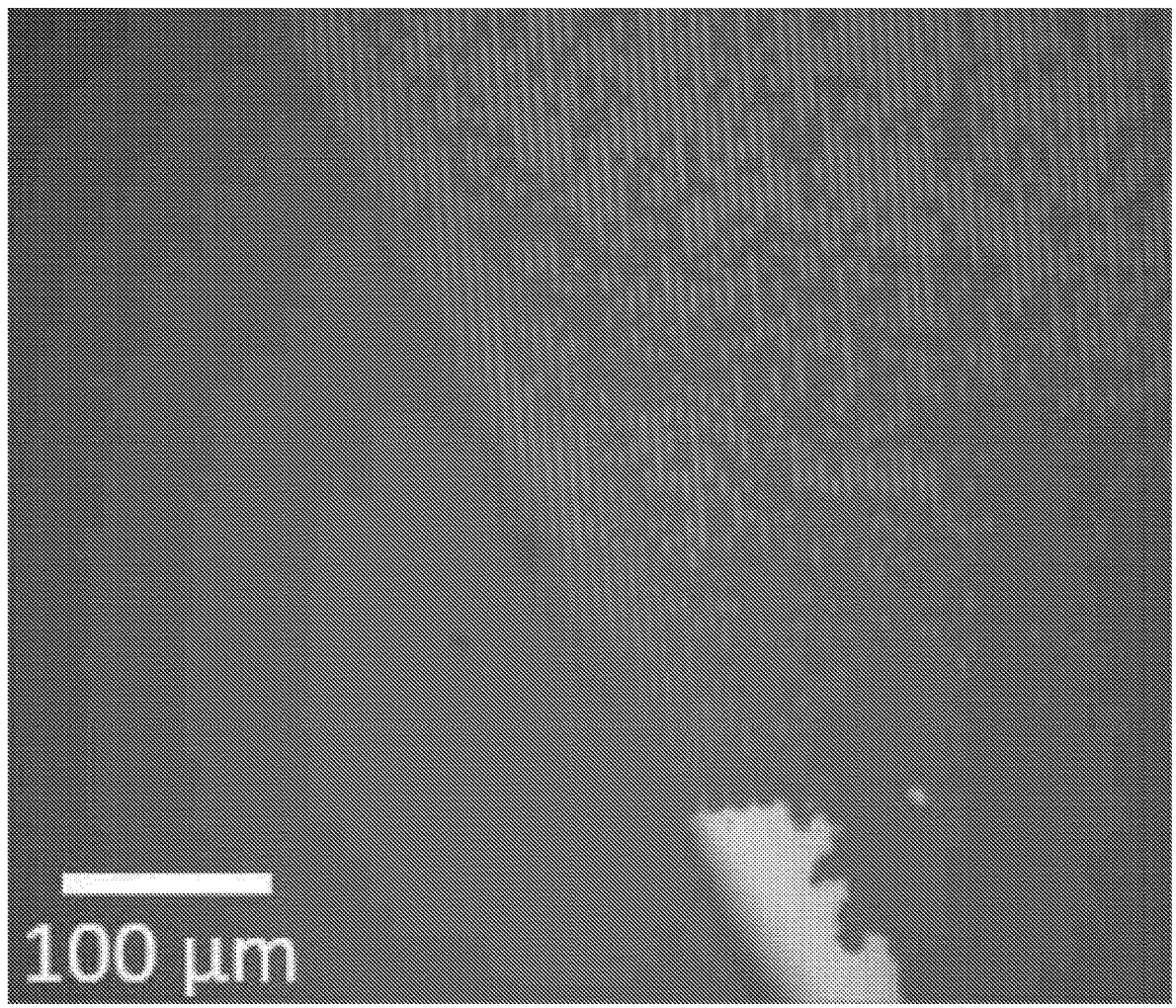
Figure 9D:
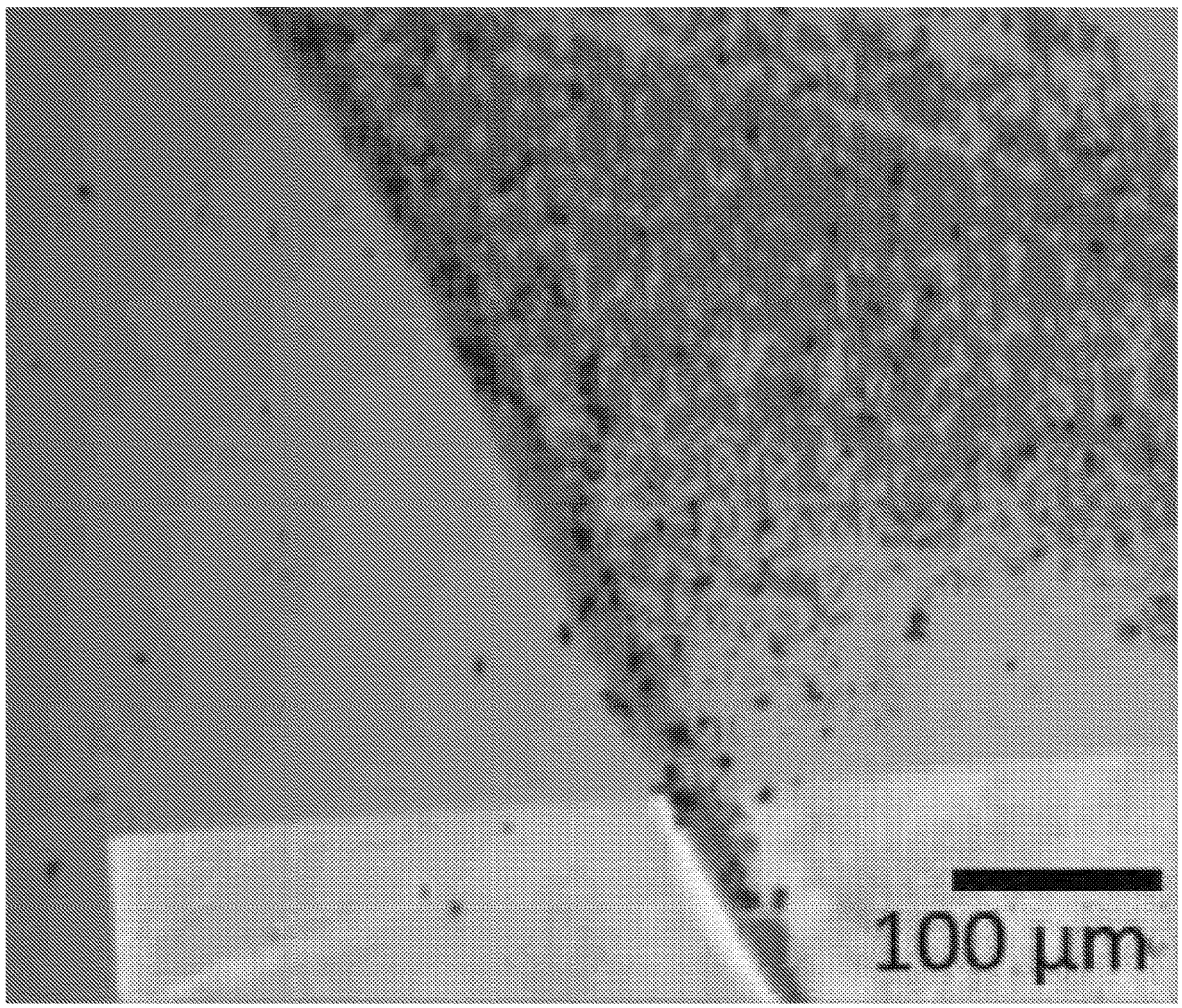

Samples grown without oxide powder still displayed film growth extending from the metallic patterns. FIGS. 8A-8C show an example of a molybdenum metallic pad subjected to only sulfur vapor at various growth temperatures. This indicates the metallic patterns serve as both a nucleation site as well as a feedstock for limited growth. Temperatures below 600° C. display no extended film growth and the initial metallic patterns show evidence of sulfurization. For growths at 600° C., the metal shows initiation of growth at the edges, leaving the bulk metal slightly sulfurized. At 780° C. it is found that the metal pad is heavily sulfurized, forming an extended film of $MoS_2$. This temperature also results in complete transformation of the metallic pattern into bulk $MoS_2$. At the highest temperature, multi-layer formation is also observed in the extended film. The film appears to act as an active growth site for subsequent layers.

Unintentional variations in the photolithography system resulted in regions where the sputtered metal widths were sub-micron. In such regions the TMD formation appears to be highly crystalline with large regions of monolayer material spanning tens to hundreds of microns. Again, the fact that the thin metallic patterns remain after growth indicates that, though the pattern may be providing material to feed the growth, it is not entirely consumed, and the dominant supply of material is from the oxide precursor. Occasionally it was found that, after the photoresist removal and sample cleaning procedure, regions of the sputtered metal patterns would appear to be removed. As seen in FIGS. 9A-9D, patterned growth of high quality monolayer TMD material would often emerge in these regions, indicating that very thin, optically transparent, layers of metal were still present. This is consistent with the film formation being predominantly constrained to the lithographically defined areas.

It should be noted that when $WS_2$ was grown on a substrate through lithography when the substrate was cleaned before metal deposition, regular growth was seen but did not follow the metal pattern which it had done before. This ruled out the possibility of the photoresist being the seeds.

Methods

Sample Growth

Metallic patterns on $Si/SiO_2$ substrates were produced via a standard lift-off procedure. Patterns were made using an image reversal photoresist (Calriant AZ-5214E) and a home-built contact optical lithography rig, which was followed by DC sputtering of the metal (Denton Vacuum DV-502A), and removal of the photoresist. The substrates, with patterns, were cleaned thoroughly using DI water, acetone, and isopropanol. A graphite boat was used to hold the oxide powder with the substrate placed upside down above the oxide region on the holder. For $MoS_2$ growths, molybdenum trioxide, ACS, 99.5+%, CAS: 1313-27-5, from Chemsavers was used was the oxide precursor. For $WS_2$ growths, tungsten (IV) oxide, 99.9%, CAS: 12036-22-5, from Chemsavers was used as the oxide precursor. The graphite boat with oxide powder and sample was then placed toward the closed end of a one-inch diameter, 14 in long, half open, quartz tube. A boron nitride boat with sulfur powder (Sublimed Sulfur, CAS: 7704-34-9, from Spectrum Chemicals) was place inside the same tube at the open end. This tube was then placed inside a larger, 2 inch, tube inside a Barnstead Thermolyne Digital Lab Tube Furnace, Model F21135, such that the sample was in the middle of the furnace and the sulfur was outside where external heater tape was used to produce the sulfur vapor. The larger tube was closed and a flow of argon gas inside the main tube was maintained in the direction of the open to closed end of the smaller tube. The ratio and amounts of oxide and sulphur powder were based on the feature size of metallic pattern or the intended area of growth of semiconductor film.

For growth at 780° C., the furnace temperature was raised to 550° C., at the rate of 35° C./min; to 650° C., at the rate of 15° C./min, and then to the final growth temperature of 780° C., at the rate of 4° C./min. For growth at 600° C., the furnace temperature was raised to 550° C., at the rate of 35° C./min; and to 600° C., at the rate of 15° C./min. Once the growth temperature was reached, sulfur was evaporated at about 200° C. using the external heater, and was allowed to enter into the growth chamber. The start of the growth time was measured from the point at which sulphur starts to melt. At the end of the growth period, the furnace was turned off and left to cool down to room temperature.

Sample Characterization

Established methods for the characterization of as-grown materials were used, including optical contrast imaging, photoluminescence (PL) spectroscopy, Raman spectroscopy, AFM imaging, and polarization resolved second harmonic imaging. Optical imaging, with color contrast of the sample, was carried out using a Navitar MicroMate video microscope. PL and Raman spectra were collected using a WITec α-SNOM300 s microscope where the excitation source was a 532 nm cw-dpss single-mode fiber coupled laser, and the power was kept less than 1 mW. AFM scans were performed using a Thermomicroscopes Autoprobe CP-Research in non-contact mode. Polarization resolved second harmonic generation imaging was done to measure crystallinity and grain size using a pulsed Ti-Sapphire (SpectraPhysics Tsunami) producing 2 ps pulses (80 MHz rep rate) at 830 nm and an energy per pulse of approximately 5 µJ (tens of mW average power).

Example II

Scalable fabrication of two-dimensional materials-based devices with consistent characteristics remains a significant impediment in the field. In this Example, as-grown monolayer $MoS_2$ metal-semiconductor-metal photodetectors were produced using a CVD process which results in self-contacted two-dimensional materials-based devices. The photodetectors show high responsivity (~1 A/W) even at a low drain-source voltage (VDS) of 1.5 V and a maximum responsivity of up to 15 A/W when $V_{DS}$=4 V with an applied gate voltage of 8 V. The response time of the devices is found to be on the order of 1 µs, an order of magnitude faster than previous reports. These devices demonstrate the ability and advantages of this simple, scalable, and reproducible method for creating as-grown two-dimensional materials-based devices.

Two dimensional (2d) materials such as graphene, hBN, black phosphorus, and the family of transition metal dichalcogenides (TMDs) possess many characteristics desirable for future generations of optical and electronic devices such as high mobilities, semiconducting and superconducting behavior, and excellent thermal properties. For example, semiconducting TMDs like sulfides and selenides of Mo and W are promising material for devices including field effect transistors, phototransistors, molecular gas sensors, and biosensors. One example of 2d materials is $MoS_2$, a semiconductor with a direct band gap of ~1.8 eV in its monolayer limit, and strong absorption and emission in the visible range. To date, mono-to-few-layer $MoS_2$ metal-semiconductor-metal photodetectors (MSM PDs) have been reported with photoresponsivities ranging from 1.1 mA/W, to as high as $1 \times 10^3$ A/W, and response times from 10 s, to as low as ~30 μs. The wide disparity in these figures of merit is related to variables such as device structure, choice of contact metal, physical positioning of contact (i.e., edge, top, or back contact), role of the dielectric material, gate voltage, and environmental conditions. However, one common characteristic to all of these studies is that contacts are made after the material has been grown or isolated, using lithography and metal deposition, a process which may introduce additional variability and limit industrial scalability. To address these issues, a process has been developed in which 2d material is grown around lithographically defined metallic patterns, forming naturally self-contacted as-grown device structures. In this Example $MoS_2$ based MSM PDs were made using this technique, and they display above average responsivities, and response times ~10× faster than the best reported results. The concurrent growth of mono-to-few-layer $MoS_2$ and natural formation of an electrical connection with the metallic molybdenum contacts not only result in consistently high quality as-grown opto-electronic devices, but also provide a straightforward method for reproducibly and controllably growing two-dimensional materials-based devices with broad implications for basic research and industrial applications.

$MoS_2$ devices were grown on p-doped Si substrates with a 500 nm $SiO_2$ layer using the CVD process described in Example I. This method involves producing the desired device structure on the substrate using optical lithography followed by DC sputtering of molybdenum. After thoroughly cleaning the patterned substrates, they were placed on a graphite boat with $MoO_3$ powder, facing down and positioned at the center of a single zone tube furnace. Sulfur was placed in a BN boat upstream, outside the furnace, and was separately heated by an external heater to have control over the growth time. Evidence of sulfurization of the molybdenum patterns and subsequent formation of $MoS_2$ indicate that the as-grown film is chemically bonded to the metallic patterns, forming a direct, natural, contact between the electrodes and the channel. Though the growth often appears multi-layer near the contacts, as the film extends out, the connecting channel was predominantly composed of monolayer material. This general technique results in as-grown monolayer devices with the ability to be used in complex configurations and advanced functionalities.

Figure 12A:
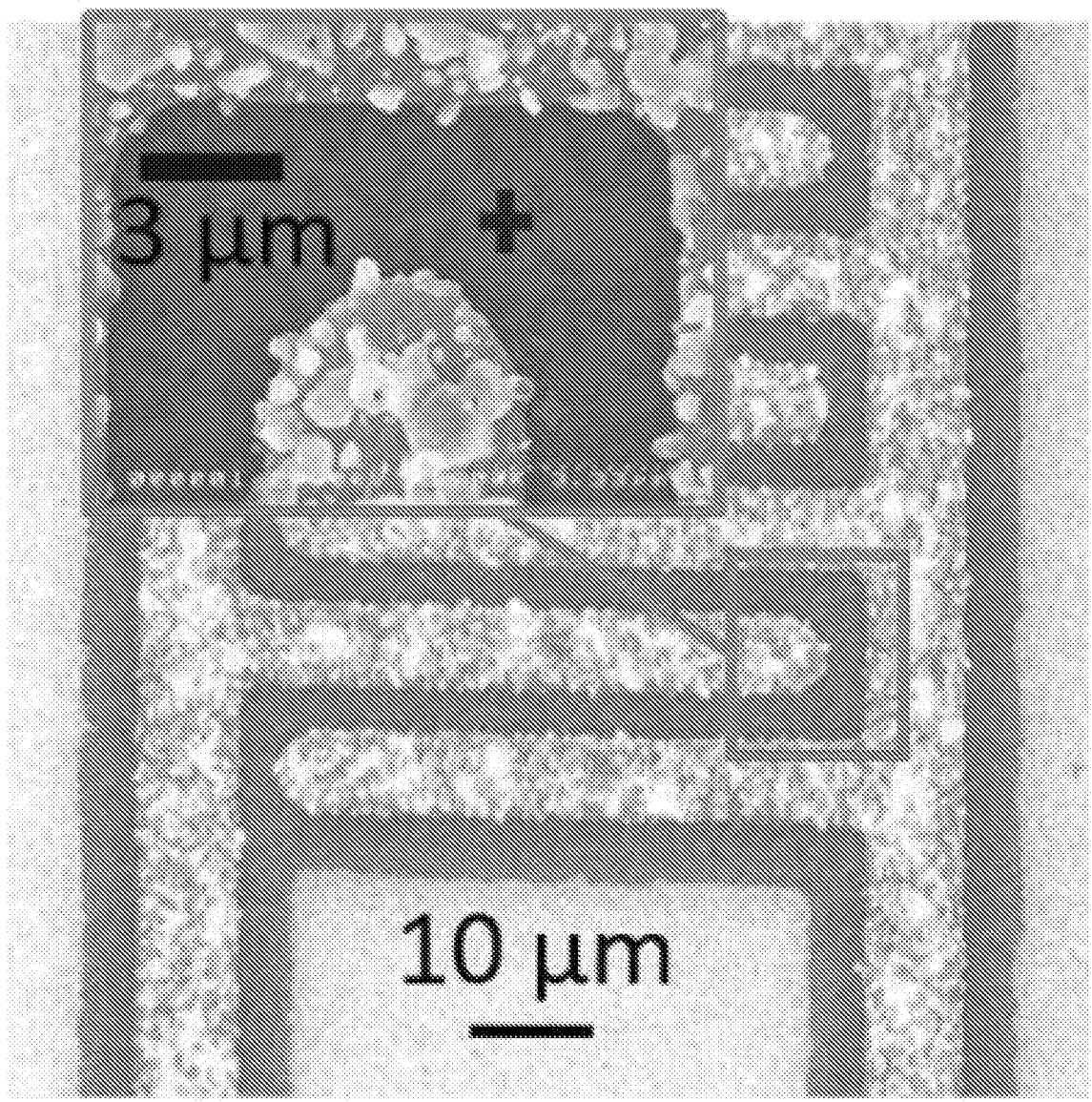
FIGS. 12A-12F: Optical characterization of CVD-grown Mo—$MoS_2$—Mo photodiode.
Figure 12B:
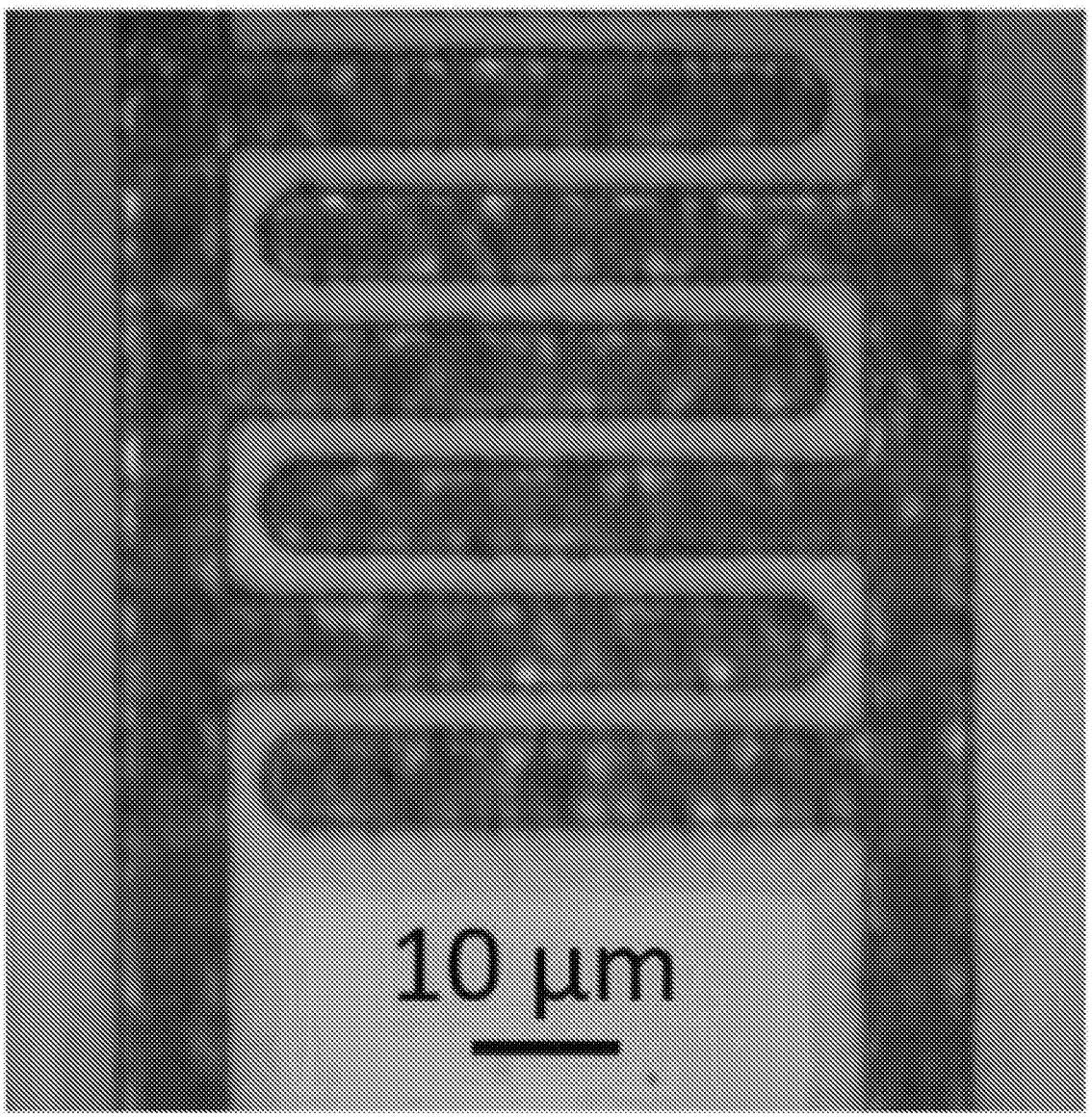
Figure 12C:
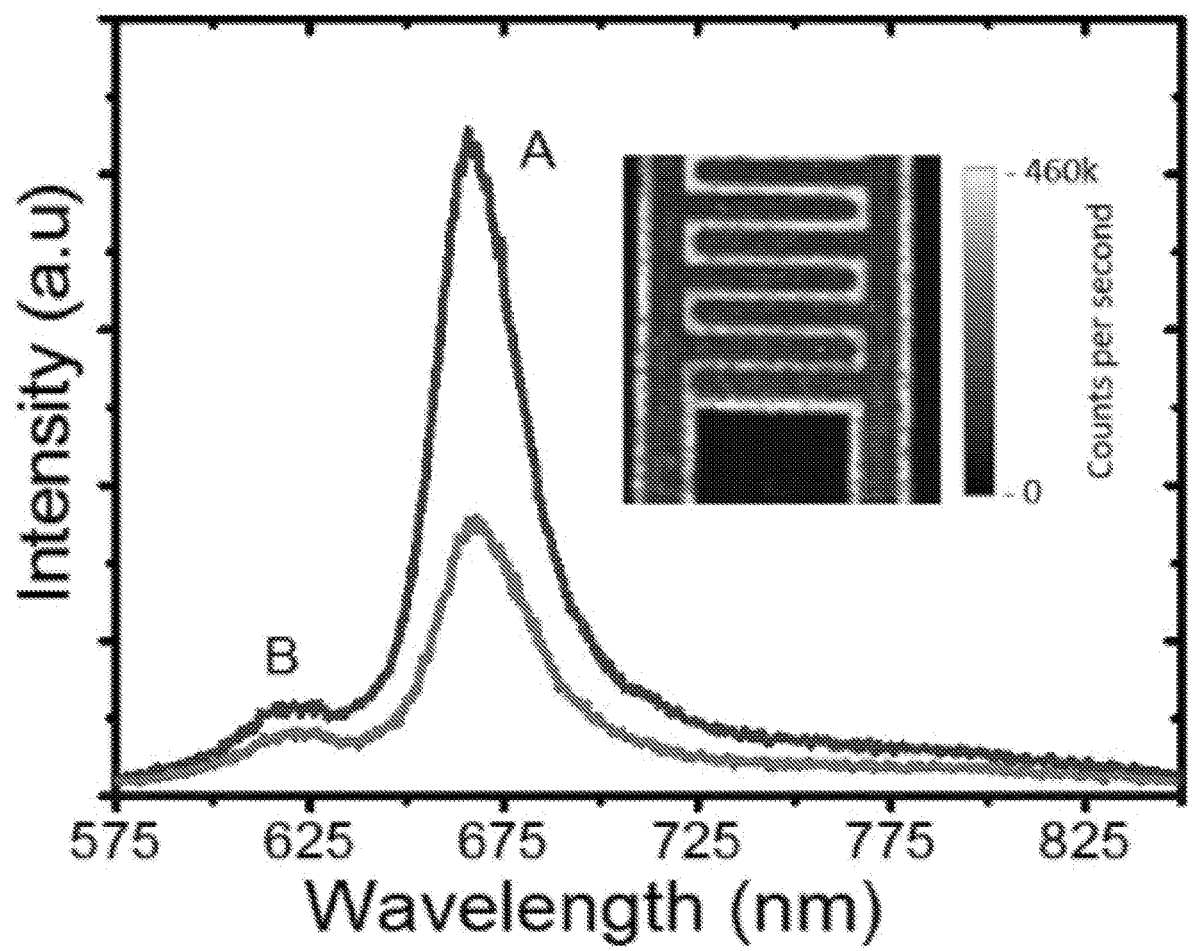
Figure 12D:
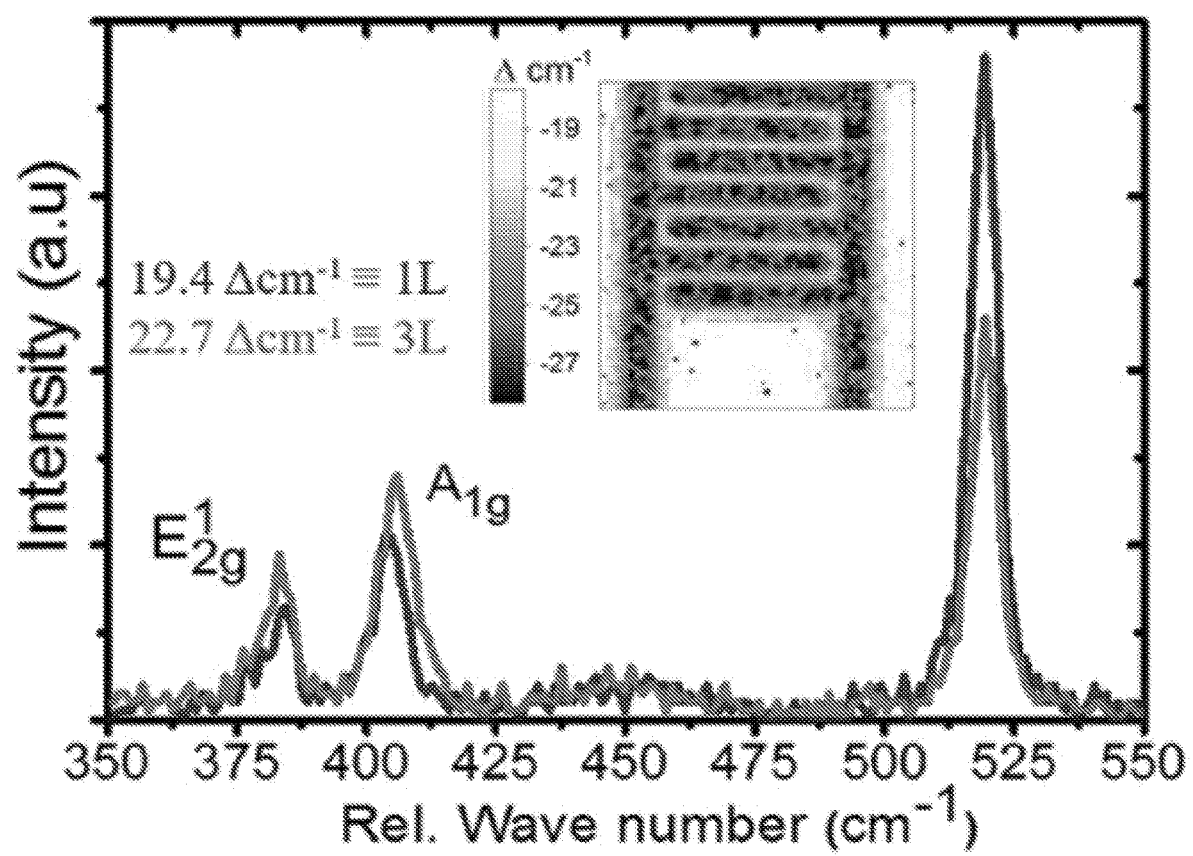
Figure 12E:
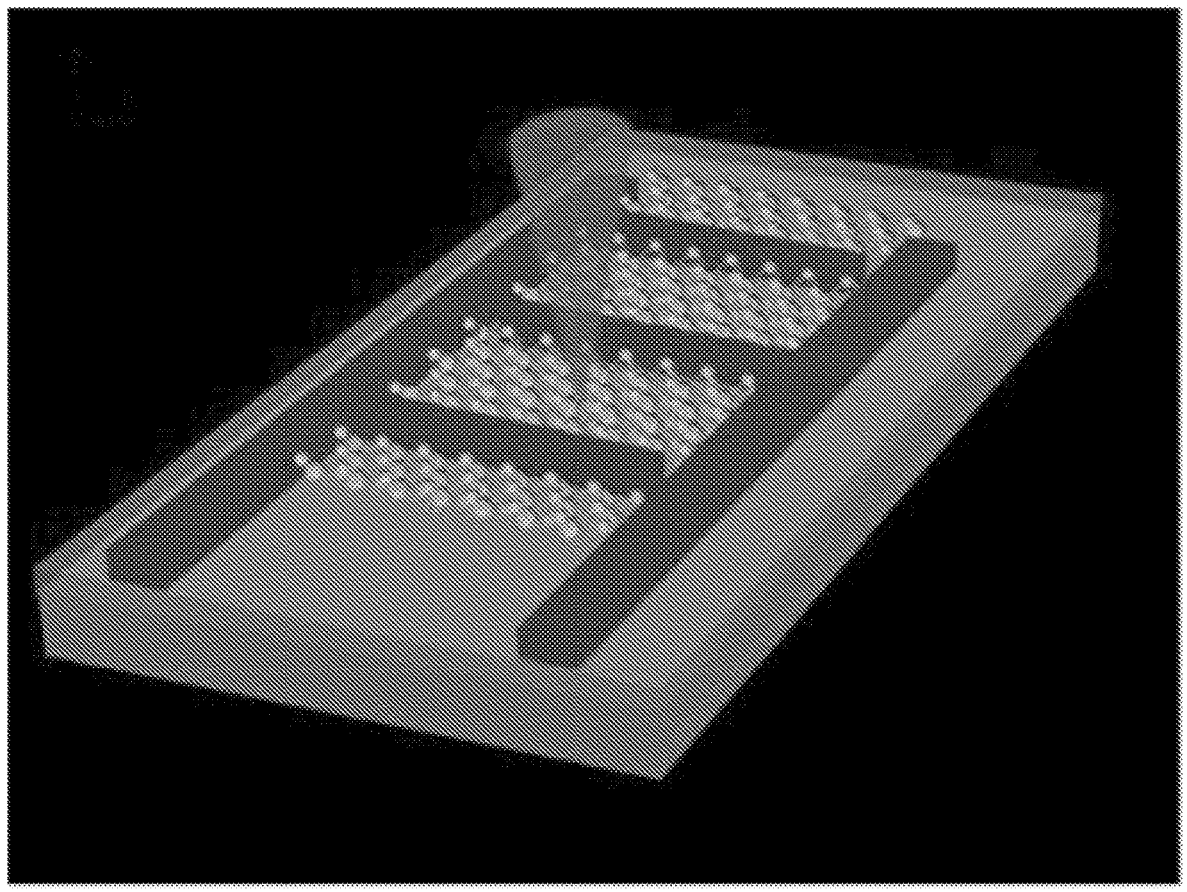
Figure 12F:
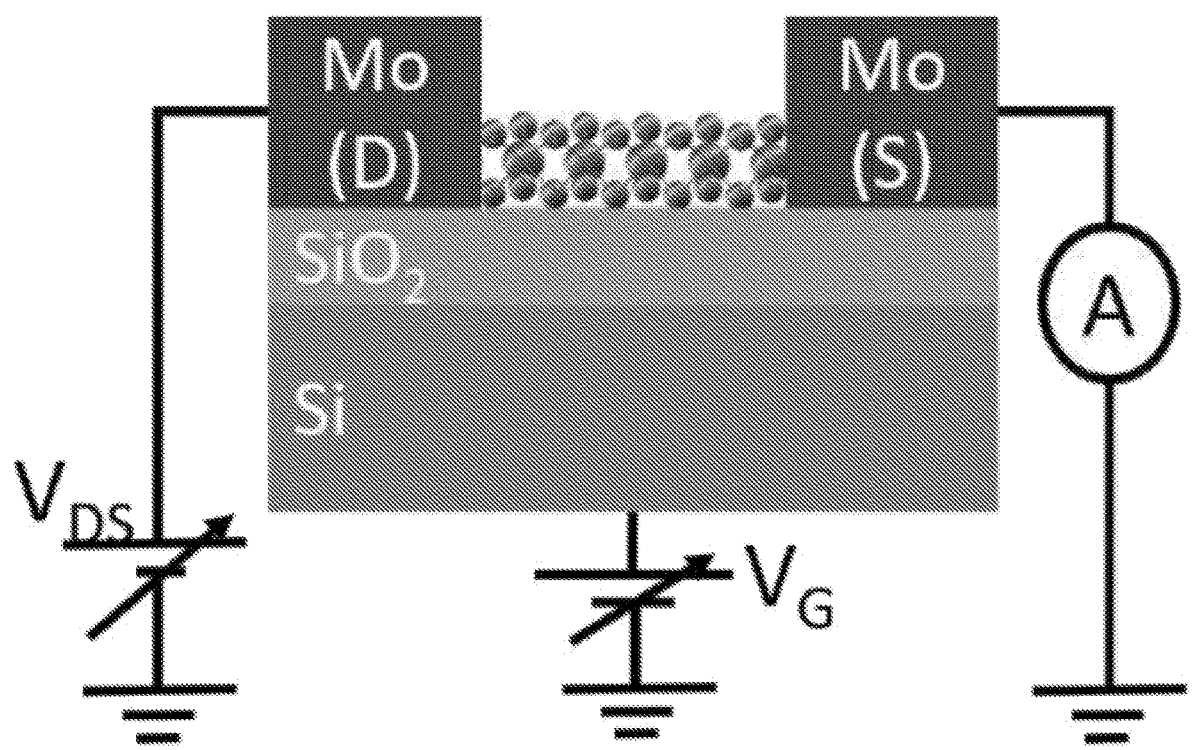

A series of standard characterizations were performed to confirm the nature of the material grown between the contacts. Optical and electrical measurements were carried out at room temperature in air using either a commercial Witec confocal Raman/PL microscope or a homebuilt system using a motorized stage with 22 nm resolution where the samples were illuminated with a laser (532 nm or 405 nm) focused through a high numerical aperture microscope objective (either 50× or 100×) resulting in a sub-micron spot size. Current versus voltage (IV) measurements were done using an HP4140B pico-ammeter where FIG. 12F is a schematic illustration of the electrical connections. FIG. 12A shows a SEM micrograph of a typical Mo—$MoS_2$—Mo photodetector (PD) where the changing contrast in the area between the Mo contacts (FIG. 12A inset) indicates two distinct regions, one with darker contrast represents a few-layer region in the channel and the other, with lighter contrast, represents monolayer material that covers a wider area in the junction between the two electrodes. This is consistent with the optical contrast image shown in FIG. 12B, and is confirmed by photoluminescence (PL) and Raman spectra, FIG. 12C and FIG. 12D, respectively. The PL spectra from the multilayer and monolayer region, indicated by the red and blue crosses, respectively, in the inset of FIG. 12A, display the characteristic excitonic states, A (~668 nm) and B (~620 nm), derived from the spin-orbit split valance band and the degenerate conduction band, similar to typical exfoliated material. In FIG. 12D, the difference in wavenumbers between the $E^1_{2g}$ and $A_{1g}$ modes in the Raman spectra show a separation of ~19 cm⁻¹ for the monolayer region and greater than 22 $cm^{-1}$ for the multi-layer region, consistent with previous CVD grown material. FIG. 12E shows a 3D representation of the as-grown device on $Si/SiO_2$ substrate.

Figure 13A:
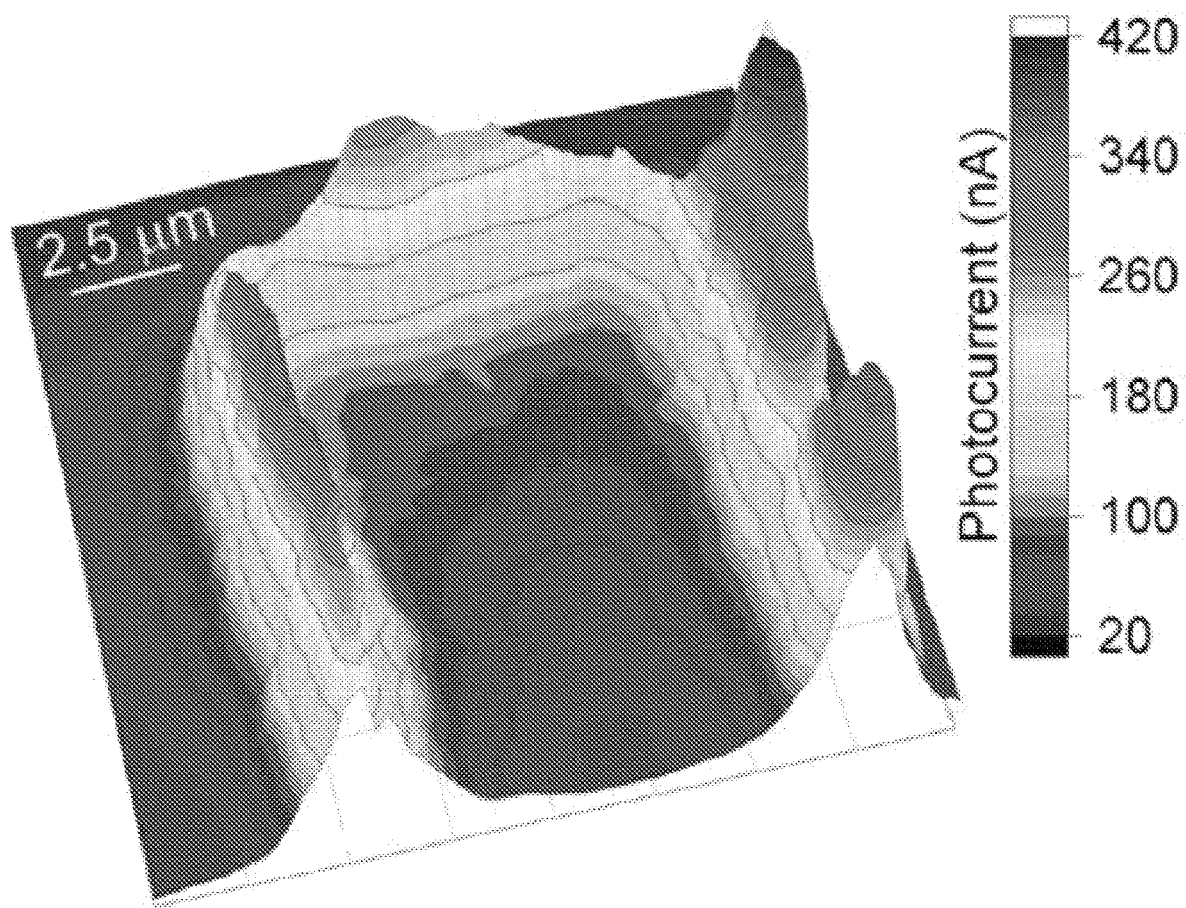
FIGS. 13A-13B: Photocurrent and photo responsivity of as-grown Mo—MoS$_2$—Mo IDF photodiode.
Figure 13B:
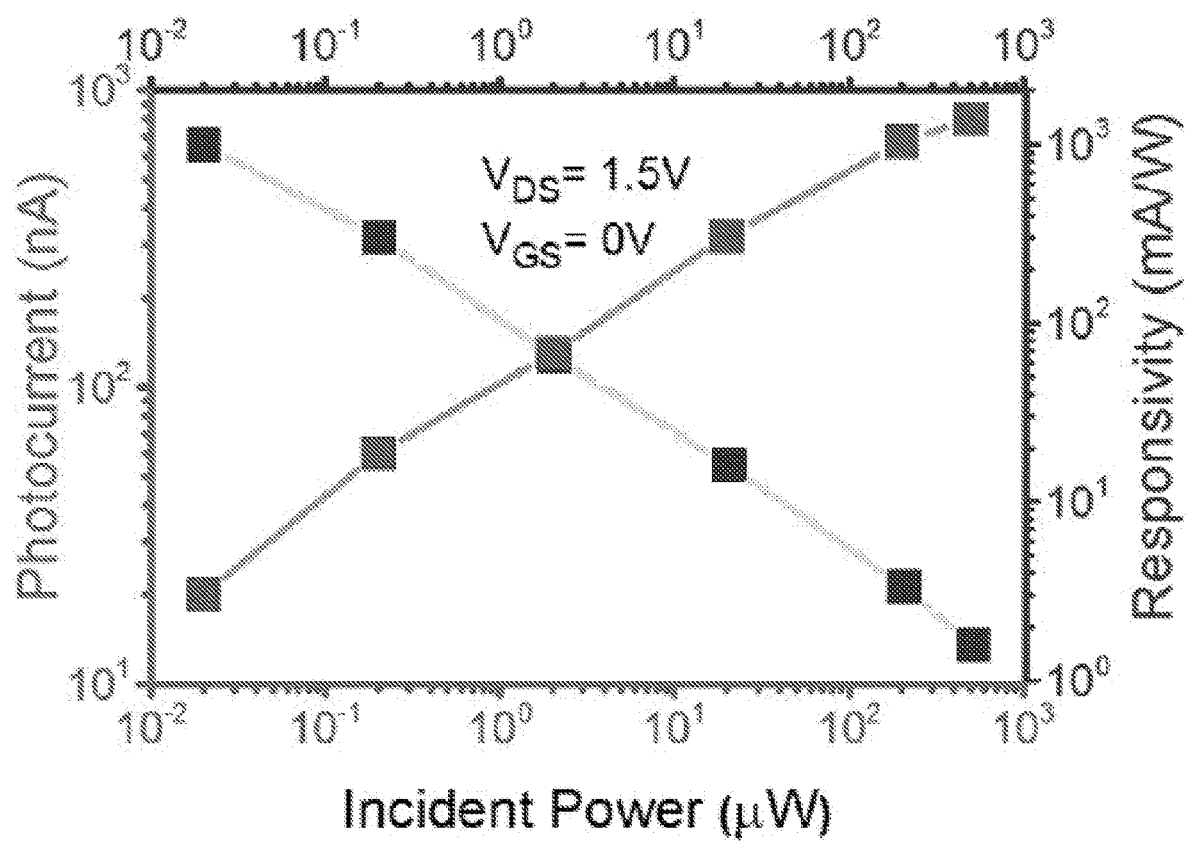
Figure 14:
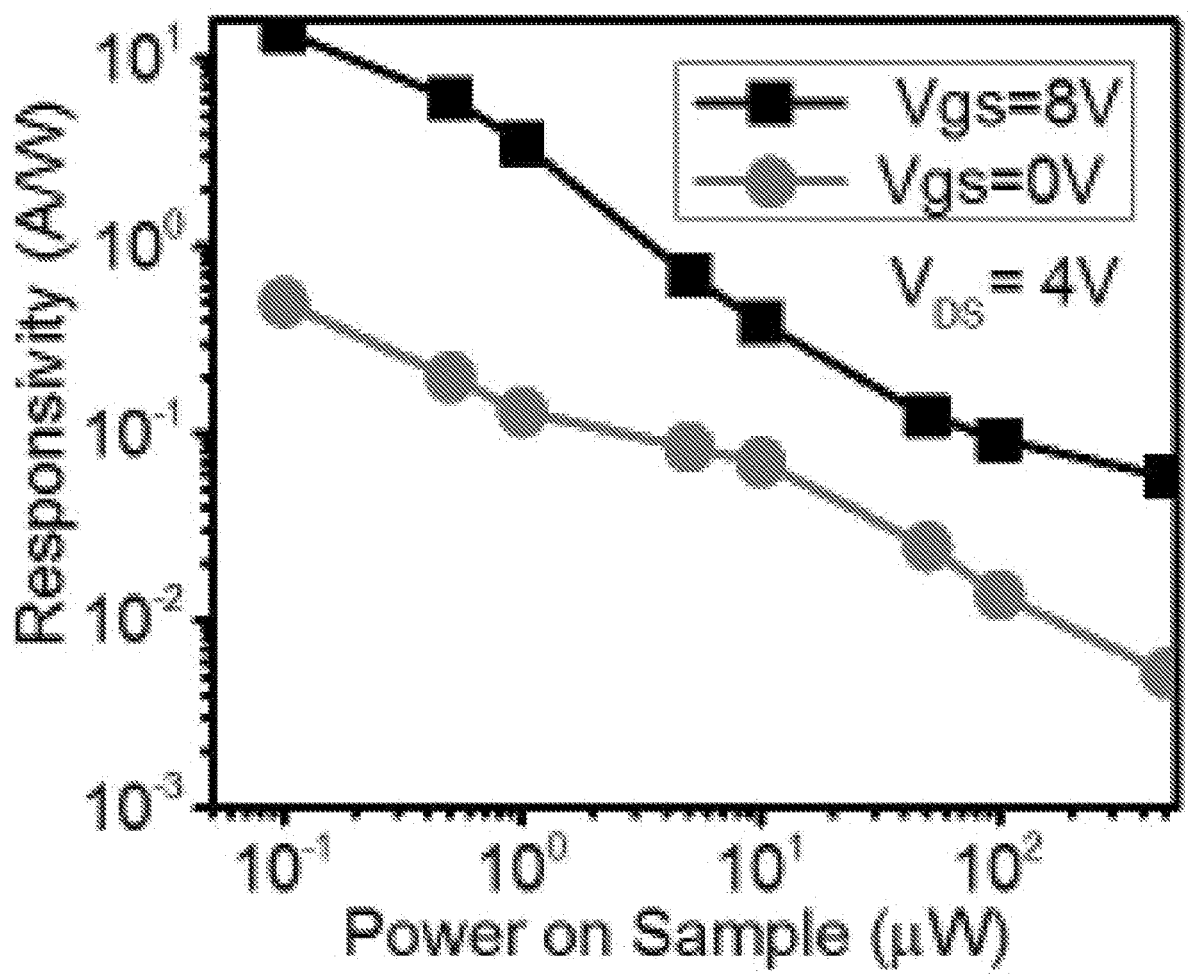
FIG. 14: Responsivity of as-grown device with and without the application of Gate Voltage. Photo responsivity was measured with the laser focused through a 50× microscope objective, and an applied drain-source bias of 4 V with illumination power range of 100 nW to 1 mW. Maximum responsivity without gate bias was observed to be ~600 mA/W. This value increased by an order of magnitude to 15 A/W when the device was gated at VGS=8 V. Hence, subjecting the devices to a suitable ON state would enhance the photocurrent and photo responsivity of these devices.

Photocurrent in the devices, defined as the difference between the current measured with and without illumination ($I_{photocurrent}=I_{Illuminated}-I_{Dark}$), was investigated using a 532 nm laser as the illumination source. A spatially resolved photocurrent map, with the laser focused through a 100× microscope objective, is shown in FIG. 13A, where the laser power was 500 μW and the applied drain-source bias was 2 V. The region with the largest photocurrent is clearly observed between the metal contacts, coinciding with the as-grown monolayer material. As seen in FIG. 13B, the absolute photocurrent shows an increasing, but sublinear, dependence as the incident laser power increases, while the photoresponsivity (R) of the devices, defined as the ratio of the photocurrent ($I_{Ph}$) to the incident power, decreases as the incident laser power increases. This behavior has been attributed to the presence of trap states in $MoS_2$ or in the interface between the $MoS_2$ and the substrate. $MoS_2$ photodetectors are known to show a large variation in responsivity values from ~$10^3$ A/W down to values of 1.1 mA/W on monolayer material, and 100 mA/W on multilayer $MoS_2$. The highest value of responsivity previously seen, ~$10^3$ A/W, was measured under high vacuum in a phototransistor configuration with a high drain-source and gate voltages. This large value of R is comparable to another example where the gate voltage (VG) was similarly large, at −70 V, with the VDS set to 8 V. To determine the optimal biasing conditions for the devices in this Example, a series of Ids versus Vds curves were performed at varying VG with and without illumination. As shown in FIG. 13B, the CVD grown monolayer $MoS_2$ device shows responsivities up to a few A/W at a relatively low source-drain voltage of 1.5 V and zero gate voltage, and a maximum responsivity of 15 A/W obtained with VDS=4V and VG=8 V (FIG. 14). Another notable difference with the as-grown PDs is the area of material which comprises the device. The interdigitated device structures have electrode separations (channel length) of a few microns and electrode lengths (channel width) of tens to hundreds of microns, typically resulting in hundreds of square microns of 2d material. These devices therefore display considerable dark currents due to the large channel widths, limiting the low power measurements used to extract the maximum responsivity. Despite this, these as-grown and unoptimized devices show an above average responsivity compared with the total results reported to-date. Optimizations, such as more efficient device structures, top gating with high-k dielectrics like $HfO_2$, passivating the channel material with organic compounds, encapsulating the devices, and the like, would yield substantial improvements.

Figure 15:
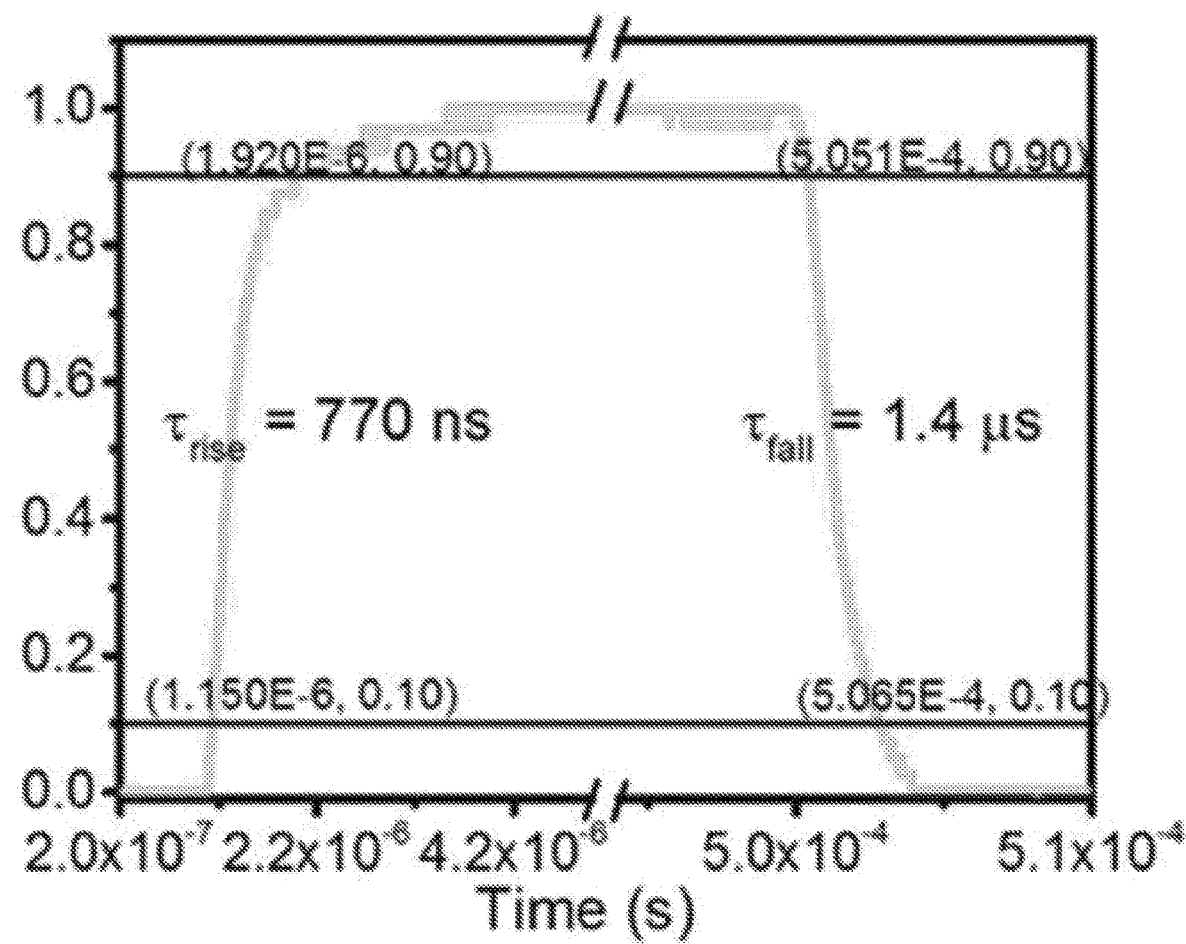
FIG. 15: Rise and fall time of laser 405 nm using Si photodiode. An electronically modulated 405 nm laser diode was used as the excitation source for the measurement of rise and fall time of these devices. Rise and Fall time is measured as time taken for the voltage amplitude to rise from 10% to 90% of its maximum value and to decay from 90% to 10% of its maximum value, respectively. The laser was sampled using a beam splitter and the picked-off beam was focused onto a Si photodiode (Thorlabs DET10A) with a rise time of 1 ns. The temporal profile of the laser indicated a rise (fall) time of ~700 ns (~1.5 µs), as shown in FIG. 15.
Figure 16A:
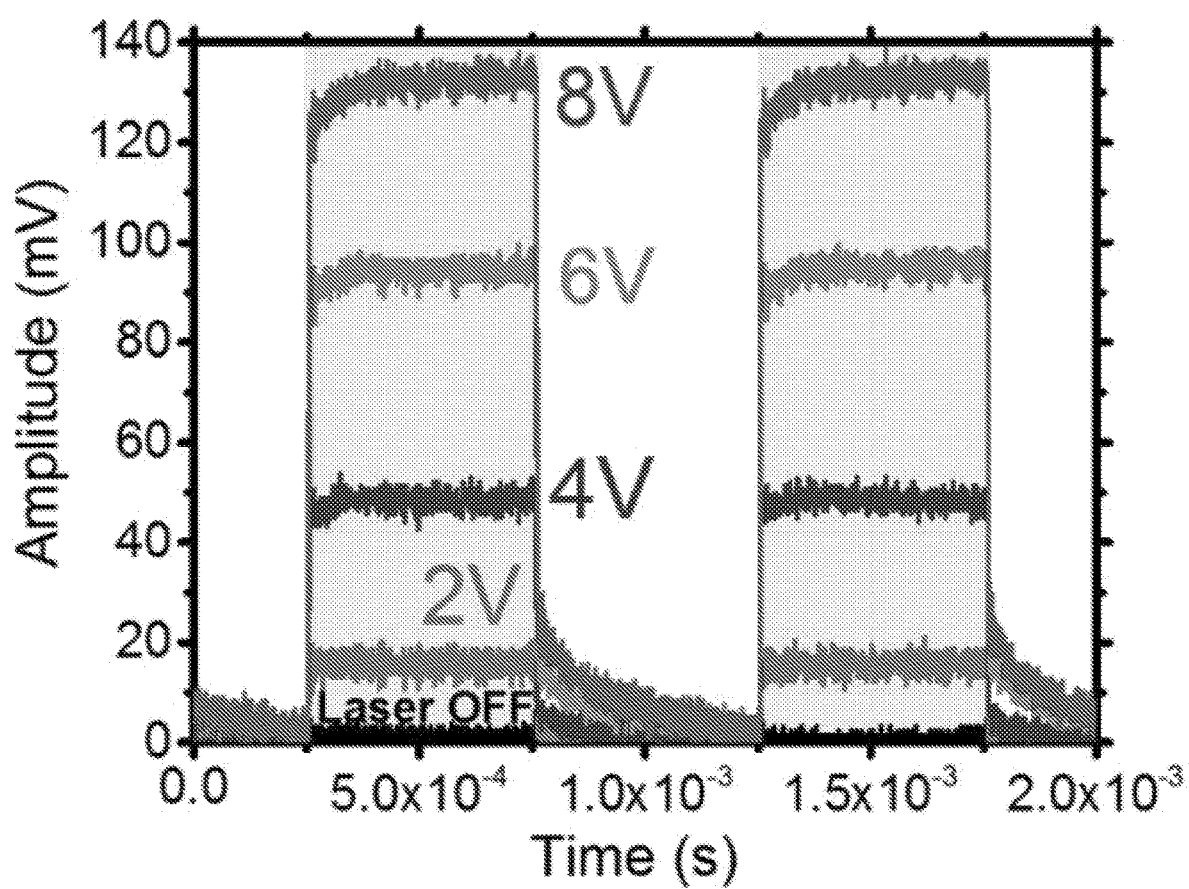
FIGS. 16A-16B: Photocurrent dynamics.
Figure 16B:
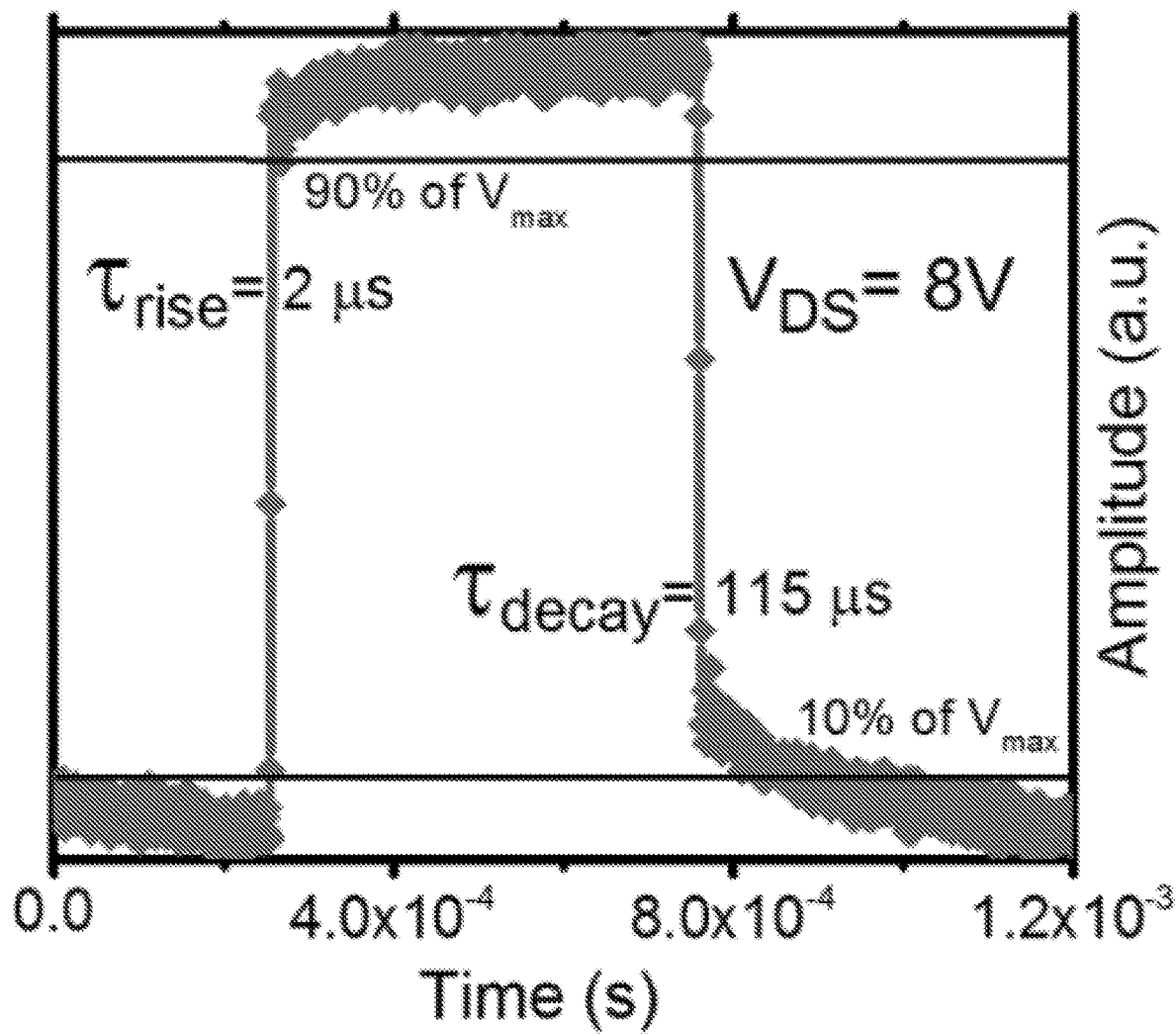

Measurements of the response time, characterized by the rise and fall time, were done by either monitoring the voltage drop across a resistor in series with the PD or using one lead of the PD as the input to a standard op-amp based inverting amplifier circuit. An electronically modulated 405 nm laser diode with rise (fall) time of 700 ns (2 μs) (FIG. 15), as measured on a fast Si photodiode (Thorlabs DET10A), was used as the excitation source. FIG. 16A shows the temporal response of a device to the laser modulated at a frequency of 1 kHz. Since the absolute current through the device increases as $V_{DS}$ is increased, the amplitude of the laser-on region is reported relative to the laser-off region, which was set to zero. The amplitude of the response shows a clear increase with increasing bias voltage, which is consistent with the observation of increasing photocurrent as bias voltage is increased. The response collected with an applied drain-source voltage of 8 V and no gate voltage is as shown in FIG. 16B, where two distinct time components are observed. In general, total response time ($\tau_{rt}$) of a photodiode is a combination of the drift time ($\tau_{drift}$) of the photo generated carriers, diffusion time ($\tau_{diffusion}$) of the carriers in the diffusion region, and the RC time constant ($\tau$RC) of the equivalent circuit where, R and C are net resistance and net capacitance. In other $MoS_2$-based devices, drift and diffusion are found to be fast processes and the limiting factor for the response time lies with the RC time constant of the device. The typical fast component of the rise time for the as-grown devices was found to be as short as 2 µs. This value, roughly an order of magnitude faster than the best reported values, is most likely limited by the relatively large overall resistance (~MΩ) and capacitance (~pF) of the device structure and amplifying circuit. The long component of the rise/fall time may be attributed to either longer-lived trap states or a photothermoelectric effect at the metal-indirect-direct semiconductor junction in these MSM PDs.

Figure 17:
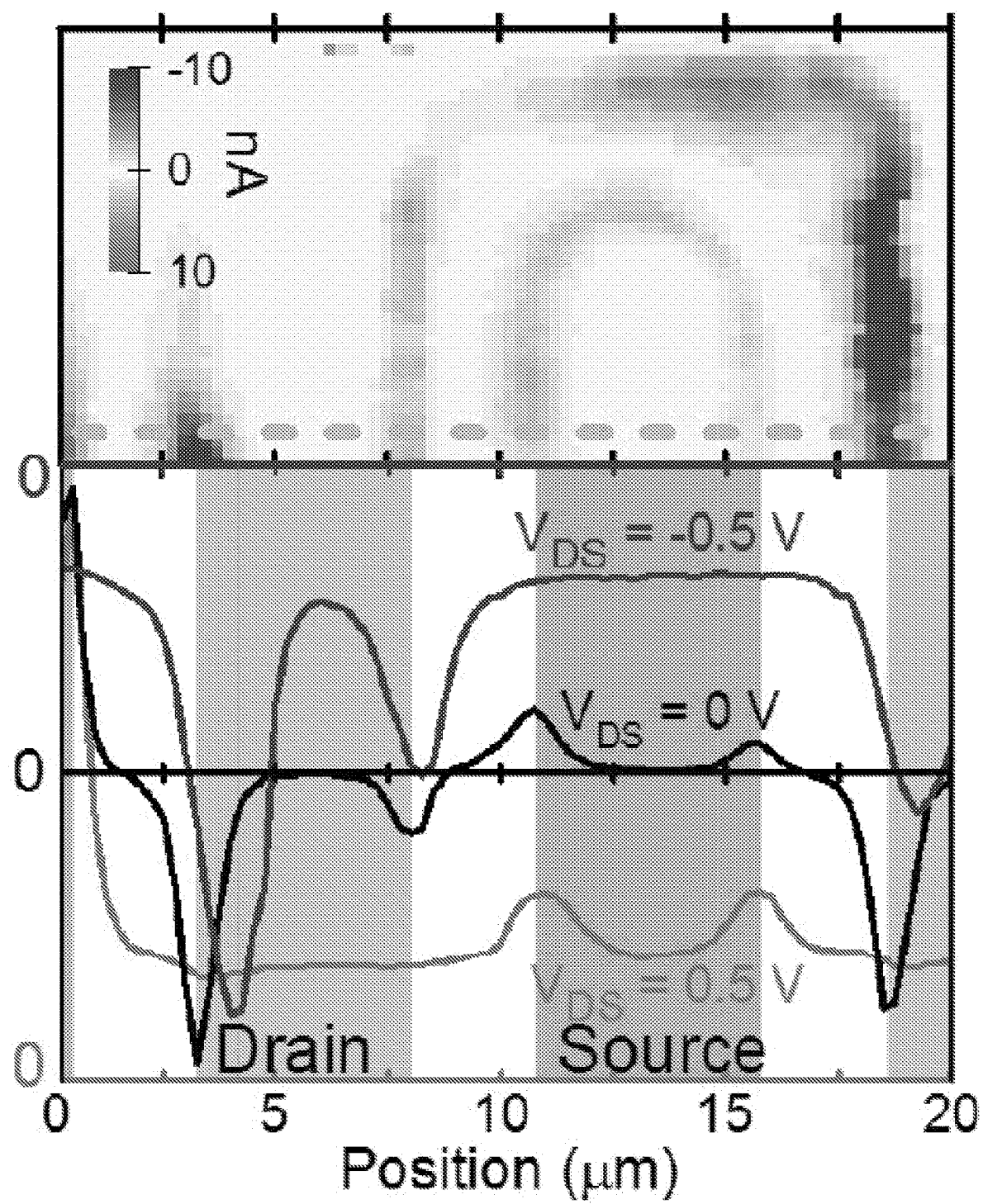
FIG. 17: Bias dependent photocurrent measurement as a function of position across the device, showing photocurrent mapping at $V_{DS}$=$V_{GS}$=0 V, with 532 nm illumination at 50 nW, and bias dependent photocurrent line profiles measured across the black line, applying $V_{DS}$=±0.5 V and 0 V.
Figure 18A:
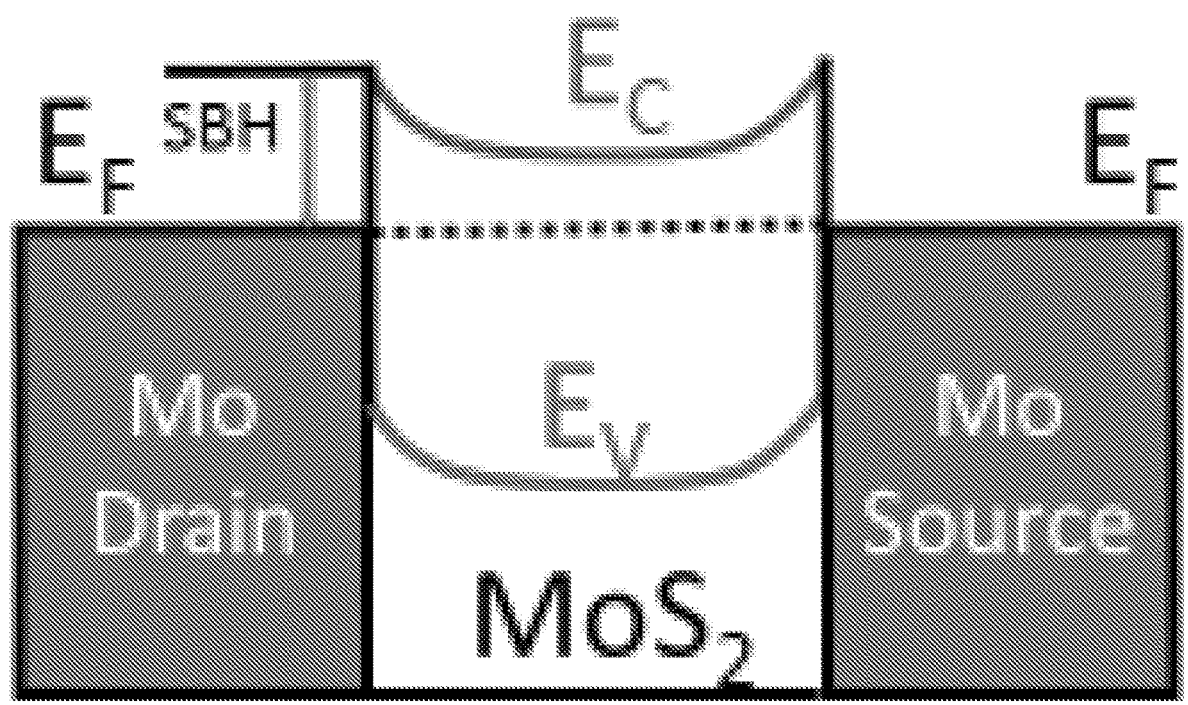
FIGS. 18A-18D: Photo current generation mechanism, showing illustrative energy diagrams of as-grown Mo—MoS$_2$—Mo photodiodes with small Schottky barrier (SB) at Mo—MoS$_2$ junction.
Figure 18B:
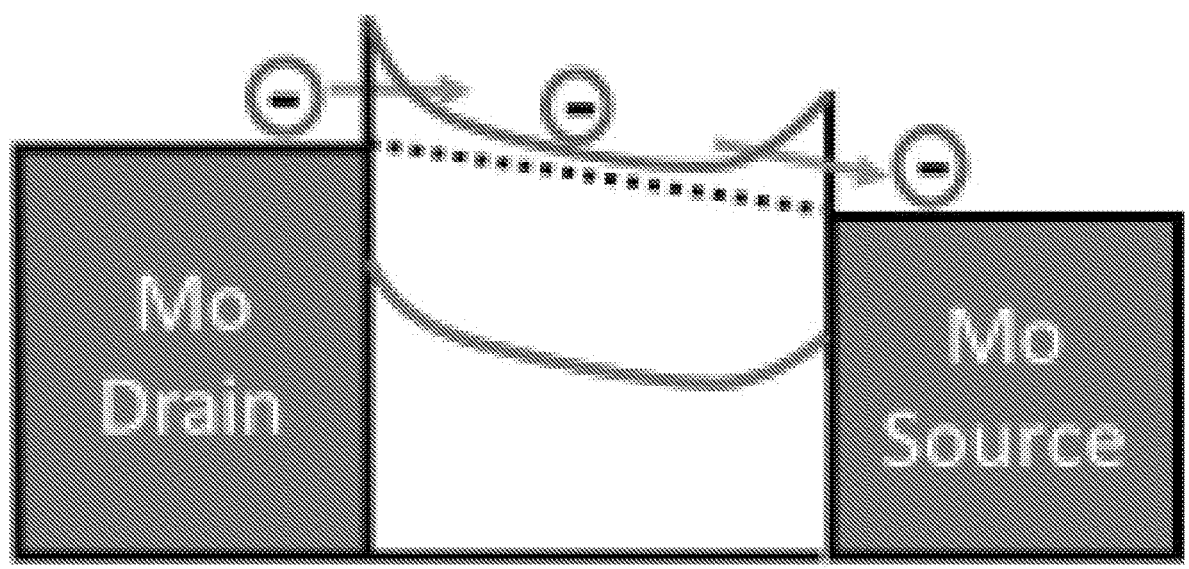
Figure 18C:
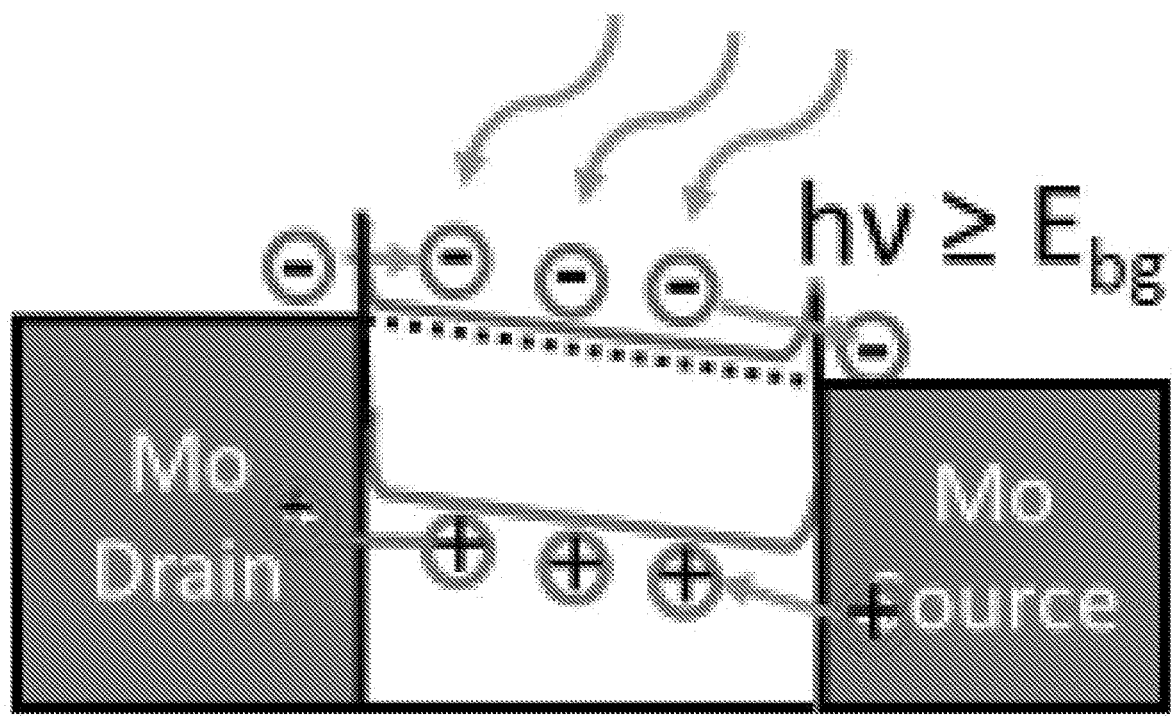
Figure 18D:
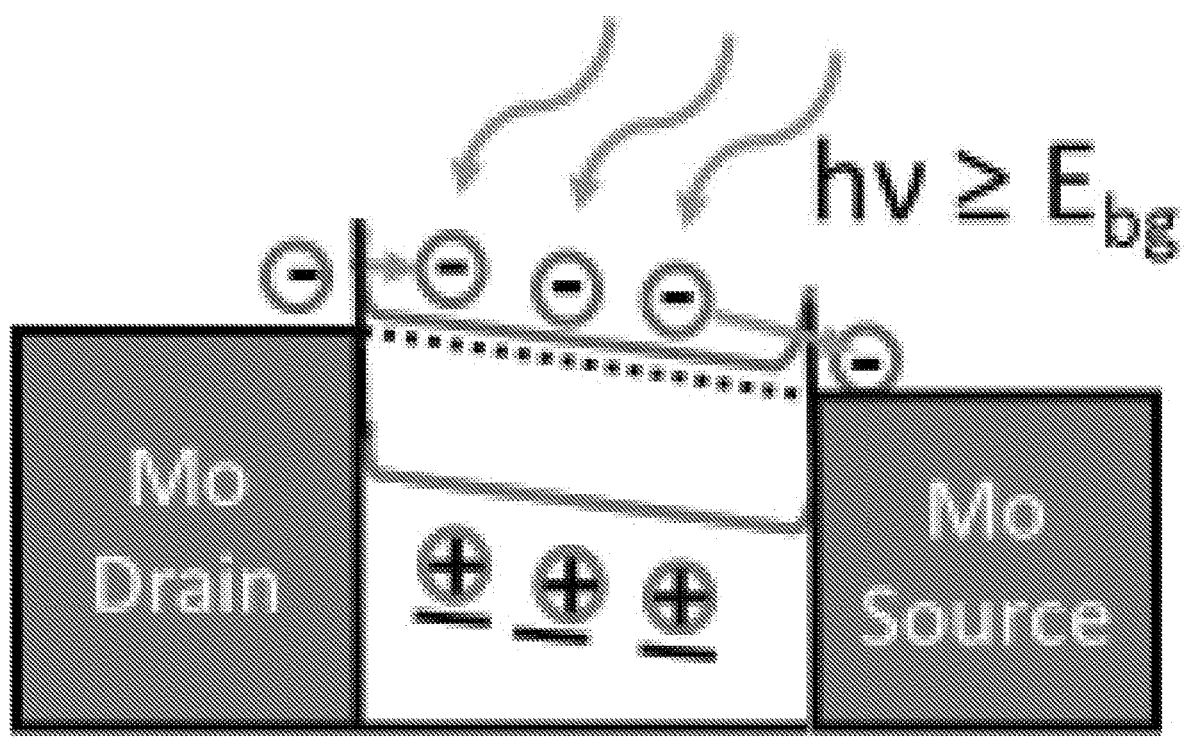

To determine the dominant mechanism(s) involved in the generation of photocurrent in the devices, the bias dependent photocurrent was studied as a function of position across the device channel on exfoliated MoS PDs. The photo response of $MoS_2$-based optoelectronic devices has been attributed to processes such as photoconductivity (PC), photogating (PG), photovoltaic (PV), photothermoelectric (PTE) effects, as well as a potential increase in thermionic emission across the metal-semiconductor barrier. The PC effect is the consequence of absorbed photons that excite electron-hole (e-h) pairs which are dissociated and accelerated in opposite directions due to the external applied field, increasing the net current through the device. In the case of PG, photoexcitation of trap centers and defects may result in an effective light-induced gating of the device under bias thereby modifying the net current. In the presence of an internal bias, for example due to a Schottky junction in the device, optically created e-h pairs may dissociate, similar to the PC effect but here without the application of an external field, leading to current at zero applied bias. Lastly, the PTE effect, a standard thermoelectric process, is created by heating of the metal and the semiconductor by the incident laser beam at the junction. The results, summarized in FIG. 17, show the generation of photocurrent to be dominated by effects, either PC or PG, resulting from the applied electric field. This is consistent with the results shown earlier in FIG. 13A where, at a positive $V_{DS}$, the photocurrent is found to be large and positive throughout the channel. A small contribution from the PV effect is found, which produces a current near the metal-semiconductor interface at zero applied bias where the relative sign of the current changes between interfaces. Though the PTE effect is inevitable given the large difference between Seebeck coefficient of the metal and semiconductor, observations like the control of photocurrent signal by the applied electric field (FIG. 17) along with the sublinear illumination power dependence of photocurrent (FIG. 13B) verify the dominant role of the applied electric field. The effects attributable to the application of an external field, namely PC and PG, are difficult to differentiate and often contribute simultaneously. In the devices, photoresponsivities of 1 A/W can be translated into a photogain of ~23 through the relation $$R = \frac{I_{Ph}}{P} = \frac{\eta Gq}{hv},$$

where, η=10% is the external quantum efficiency, q is the electron charge, h is Plank's constant, and v is frequency of the incident beam. Observation of photogain greater than 1 indicates that PG is also an effective photocurrent generation mechanism in these $MoS_2$ based PDs, and is consistent with the observation of sublinear response of the photocurrent in these devices. The mechanisms discussed above are summarized in the bandedge diagrams of the device as shown in FIGS. 18A-18D. In the absence of bias and illumination, the device is in its equilibrium state with a small Schottky Barrier Height (SBH) and hence, no net flow of current as shown in FIG. 18A. As the device is biased without illumination the current increases due to increased tunneling through the barriers as shown in FIG. 18B. When the device is illuminated under bias, as shown in FIG. 18C and FIG. 18D, the photocurrent generatio mechanism is dominated by the externally applied field which gives rise to PC and PG effect simultaneously.

Figure 19A:
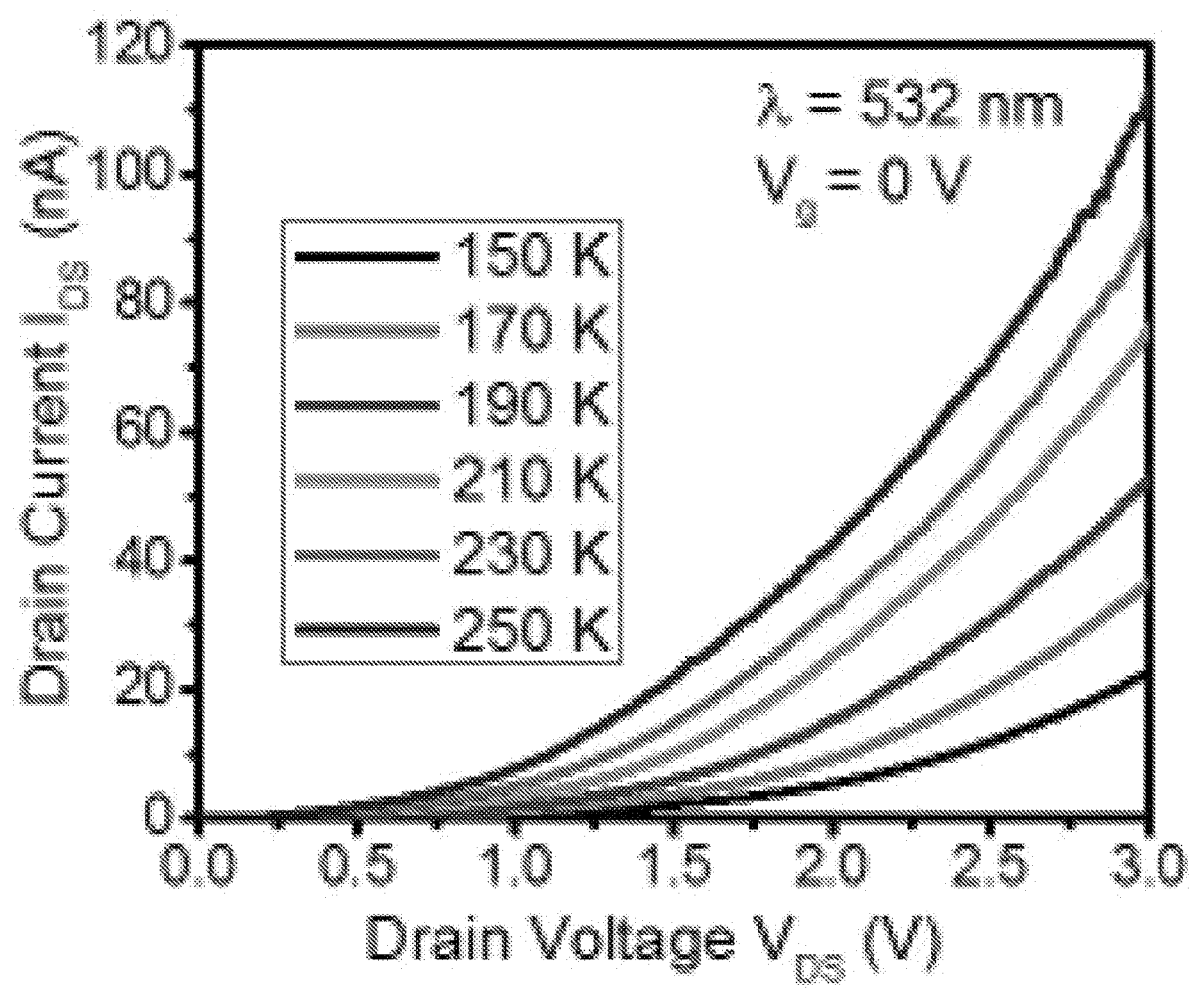
FIGS. 19A-19C: Calculation of SBH using 2D thermionic equation. The MoS$_2$ based PDs in this example were composed of predominantly monolayer material as shown in FIG. 13. Hence, these devices were characterized using a 2D thermionic emission equation with reduced power law T$^{3/2}$ for a 2D transport channel, given as $$I_{DS} = A_{2D}^\circ S T^{\frac{3}{2}} \exp\left[-\frac{q}{k_B T}\left(\phi_B - \frac{V_{DS}}{n}\right)\right],$$
Figure 19B:
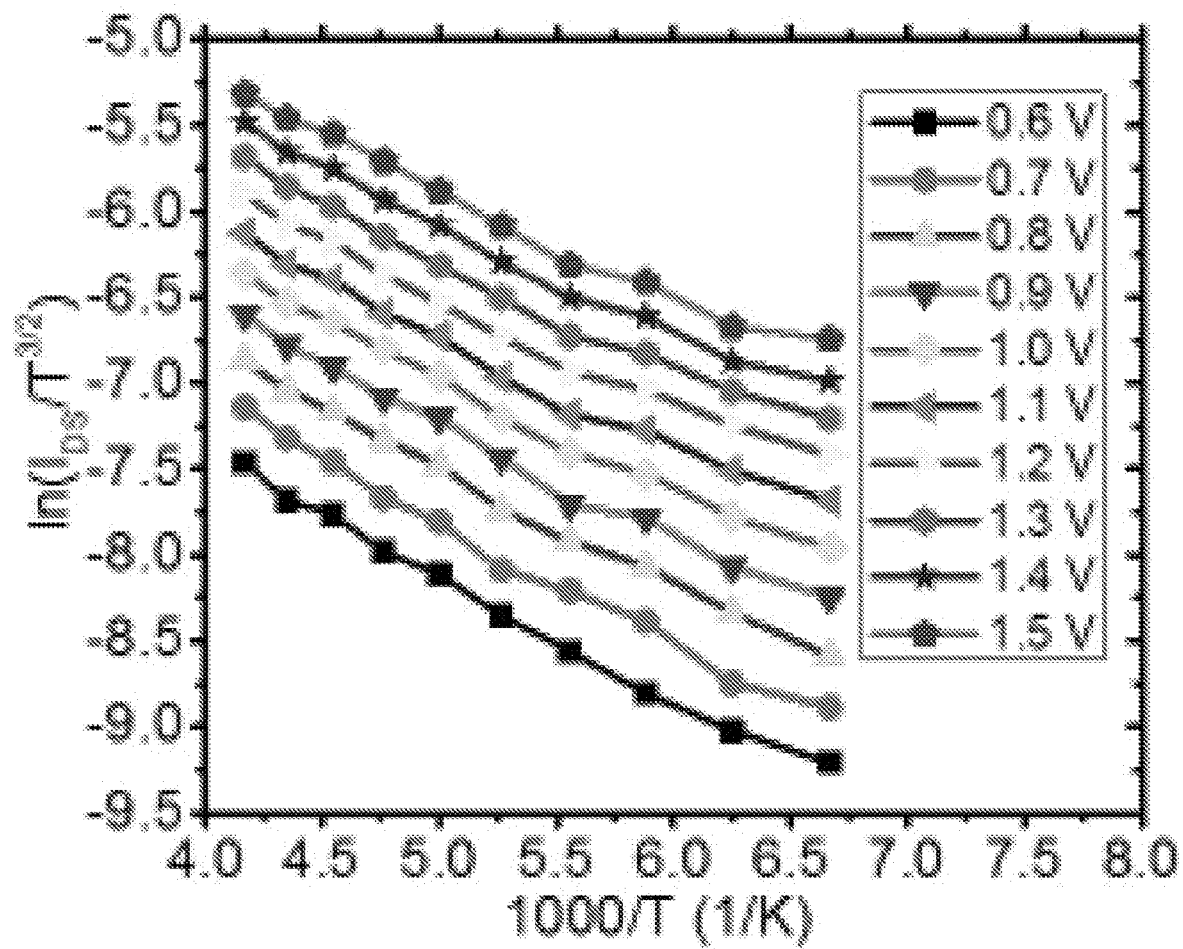
Figure 19C:
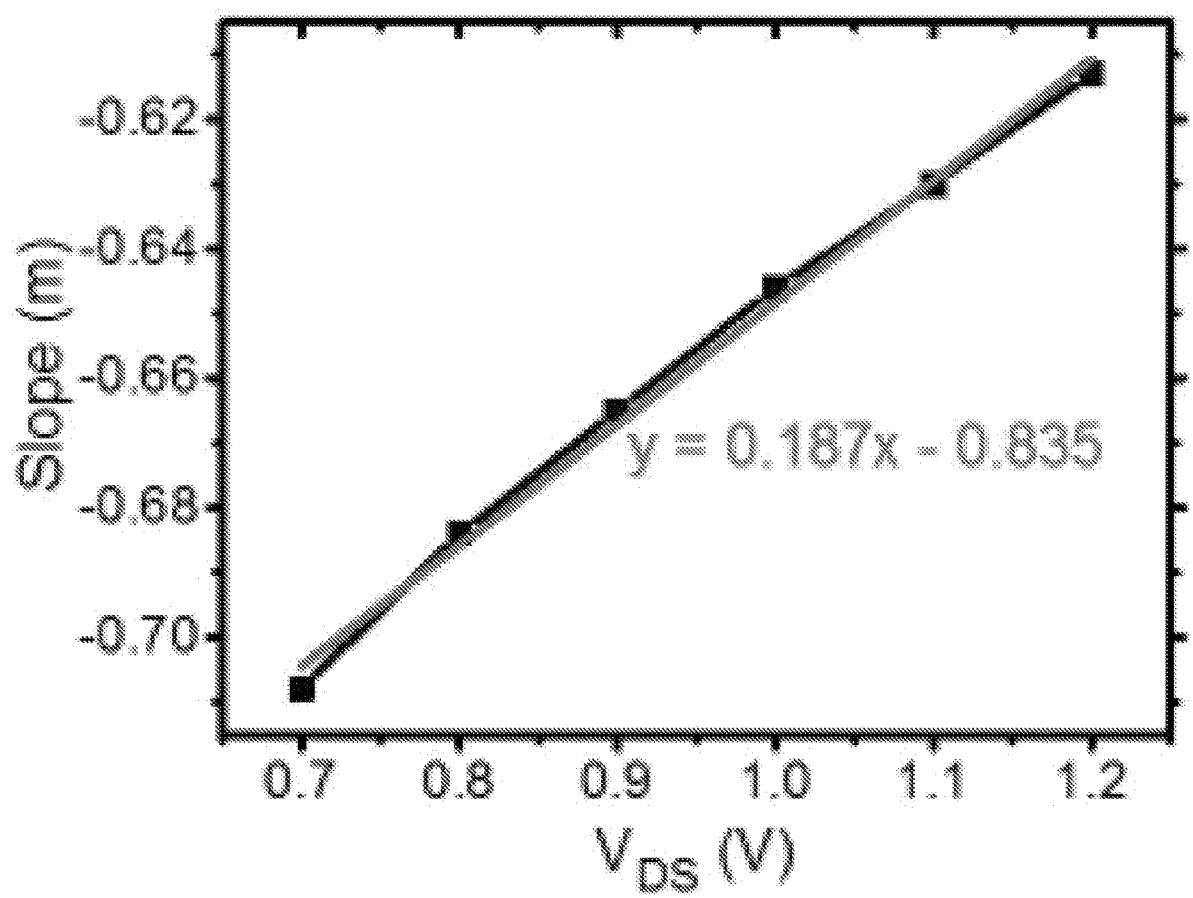

The electronic characteristics of 2d-materials based devices is typically governed by the contact properties and it has been shown that the TMD-metal contact often deviates from the Schottky-Mott rule due to a strong Fermi level pinning effect. For the devices in this Example, the excellent optical and electronic response is likely the result of the naturally grown contact between the electrode and the channel, which results in a reduced, or zero, tunnel barrier between the metal and semiconductor due to a direct bond between the contact and the 2d material as opposed to a typical Van der Waals bond in conventionally made PDs. Despite the mismatch of the work function of molybdenum and electron affinity for $MoS_2$, the SBH between Mo and $MoS_2$ has been theoretically predicted to be only 0.1 eV, lower than other typical contact metals such as Ti, In, Pd, or Au. Preliminary results on one of the devices, using 2D thermionic emission analysis of I-V curves, indicated a SBH of 0.07 eV (FIGS. 19A-19C), consistent with this theoretical prediction.

The characteristics of as-grow self-contacted $MoS_2$ based MSM photodetectors are reported in this Example. The devices show responsivities up to 15 A/W and response times as low as 2 µs. The above average responsivity and record fast response-time are attributed to the process used to produce the devices which results in contacts directly (chemically) bonded to the material, reducing or eliminating the typical tunnel barrier present when depositing metallic contacts on 2D materials. The use of molybdenum contacts also reduces any SBH between $MoS_2$ and Mo as compared to $MoS_2$ and other metals. These devices demonstrate a route for the direct incorporation of optically active 2d materials-based devices into standard silicon fabrication techniques, which may transform technologies such as integrated optical networks-on-chip. Since the contacts are produced as part of the materials growth process, this technique represents a highly scalable and deterministic method of producing high quality, as-grown two-dimensional materials-based devices with consistent and reproducible characteristic and broad applicability for basic research and industrial applications.

Example III

Devices were made as described above except using selenide in place of sulfur or using tungsten in place of molybdenum. FIGS. 20-24 show the results. FIGS. 20A-20C show a 4 μm wide channel MoSe$_2$ device. FIGS. 21A-21C show a 1 L MoSe$_2$ device with a 6 μm small channel and a 60 μm big channel. FIG. 22 shows Raman characterization of the as-grown MoSe$_2$, where a known Raman spectra MoSe$_2$ is shown in the inset. FIG. 23 shows photoluminescence characterization of the as-grown MoSe$_2$, where a known PL intensity of MoSe$_2$ is shown in the inset. FIGS. 24A-24D show characterization of the as-grown WSe$_2$. FIG. 24A shows Raman characterization of a monlayer, and FIG. 24B shows Raman characterization of a bilayer. FIG. 24C shows a known Raman spectra for WSe$_2$. FIG. 24D shows images of the as-grown WSe$_2$.

Certain embodiments of the methods and devices disclosed herein are defined in the above examples. It should be understood that these examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A method of making a semiconductor device, the method comprising:
    conducting a lift-off lithography process on the substrate to produce a substrate having metal contacts deposited thereon in lithographically defined areas; and
    thereafter, growing a transition metal dichalcogenide (TMD) material comprising formula MX$_2$, wherein M is a transition metal and X is a chalcogen, on the substrate by a deposition process to make a semiconductor device having the TMD material on the metal contacts;
    wherein the metal contacts comprise the transition metal M.

2. The method of claim 1, wherein the TMD material is predominantly constrained to the lithographically defined areas.

3. The method of claim 1, wherein the TMD material is localized to the metal contacts.

4. The method of claim 1, wherein the TMD material forms a continuous film between and on the metal contacts.

5. The method of claim 1, wherein the lift-off lithography process comprises:
    depositing photoresist on the substrate;
    covering the substrate with a photomask;
    exposing the covered substrate to ultraviolet light;
    removing the photomask;
    developing the photoresist;
    sputtering metal contacts on the substrate; and
    lifting off the photoresist to leave the metal contacts on the substrate.

6. The method of claim 1, wherein M is selected from the group consisting of Mo, W, Sc, Ti, V, Cr, Mn, Fe, Co, Ni, Cu, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, and Cn, and X is selected from the group consisting of O, S, Se, Te, and Po.

7. The method of claim 1, wherein M is selected from the group consisting of Mo and W, and X is selected from the group consisting of S, Se, and Te.

8. The method of claim 1, wherein the deposition process is conducted with reactants comprising an oxide precursor.

9. The method of claim 8, wherein the reactants further comprise a chalcogen powder.

10. The method of claim 9, wherein the deposition process is conducted with multiple temperature zones such that the substrate is at a first temperature, the oxide precursor is at a second temperature, and the chalcogen powder is at a third temperature.

11. The method of claim 8, wherein the transition metal M is a first transition metal, and the oxide precursor comprises an oxide of a second transition metal, the resulting TMD material being a hybrid material.

12. The method of claim 1, wherein the TMD material is polycrystalline with grain sizes on the order of a few microns.

13. The method of claim 1, wherein the deposition process is conducted with reactants comprising a chalcogen powder.

14. The method of claim 1, wherein the deposition process is conducted at a temperature at or above about 600° C.

15. The method of claim 1, wherein the deposition process is conducted with reactants comprising a sulfur powder and an oxide precursor powder, and at a temperature of at least about 600° C.

16. The method of claim 1, further comprising fabricating the semiconductor device into a diode, a transistor, a photodetector, or a solar cell.

17. A semiconductor device comprising:
    a substrate having metal contacts deposited thereon in lithographically defined areas; and
    a transition metal dichalcogenide (TMD) material of formula MX$_2$, where M is a transition metal and X is a chalcogenide, on the substrate;
    wherein the TMD material is a continuous, substantially uniform monolayer film between and on the metal contacts, and the metal contacts are chemically bonded to the TMD material.

18. The semiconductor device of claim 17, wherein M is selected from the group consisting of Mo, W, Sc, Ti, V, Cr, Mn, Fe, Co, Ni, Cu, Zn, Y, Zr, Nb, Tc, Ru, Rh, Pd, Ag, Cd, Hf, Ta, Re, Os, Ir, Pt, Au, Hg, Rf, Db, Sg, Bh, Hs, Mt, Ds, Rg, and Cn, and X is selected from the group consisting of O, S, Se, Te, and Po.

19. The semiconductor device of claim 17, wherein the semiconductor device comprises a metal-semiconductor-metal photodetector.

20. The semiconductor device of claim 17, wherein the semiconductor device is a diode, a transistor, a photodector, or a solar cell.

21. The semiconductor device of claim 17, wherein the metal contacts comprise the transition metal M.

* * * * *